(12) United States Patent
Bang et al.

(10) Patent No.: US 12,532,625 B2
(45) Date of Patent: Jan. 20, 2026

(54) DISPLAY DEVICE

(71) Applicant: Samsung Display Co., LTD., Yongin-si (KR)

(72) Inventors: Ki Ho Bang, Yongin-si (KR); Won Suk Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 380 days.

(21) Appl. No.: 18/192,176

(22) Filed: Mar. 29, 2023

(65) Prior Publication Data

US 2024/0057417 A1    Feb. 15, 2024

(30) Foreign Application Priority Data

Aug. 10, 2022    (KR) ........................ 10-2022-0099730

(51) Int. Cl.
*H10K 59/131*    (2023.01)
*G09G 3/32*    (2016.01)
*H10K 59/88*    (2023.01)

(52) U.S. Cl.
CPC ........... *H10K 59/1315* (2023.02); *G09G 3/32* (2013.01); *H10K 59/88* (2023.02); *G09G 2300/0819* (2013.01); *G09G 2300/0842* (2013.01)

(58) Field of Classification Search
None
See application file for complete search history.

(56) References Cited

U.S. PATENT DOCUMENTS

| 2021/0020724 A1* | 1/2021 | Cho | ........................ H10D 86/60 |
| 2022/0208088 A1* | 6/2022 | Kim | ..................... H10K 50/813 |

FOREIGN PATENT DOCUMENTS

| KR | 10-2018-0082688 | 7/2018 |
| KR | 10-2019-0130707 | 11/2019 |
| KR | 10-2021-0032615 | 3/2021 |
| KR | 10-2021-0105462 | 8/2021 |

* cited by examiner

*Primary Examiner* — Benjamin P Sandvik

(57) ABSTRACT

A display device includes a substrate, a circuit array layer including a plurality of pixel drivers and data lines, a light-emitting array layer, and a display driver circuit supplying data driving signals to the data lines. The circuit array layer includes a structure including a semiconductor layer, a first conductive layer on a first gate insulator, a second conductive layer on a second gate insulator, a third conductive layer on an interlayer dielectric layer, a fourth conductive layer on a first planarization layer, and a second planarization layer. Data supply lines are electrically connected to output terminals of the display driver circuit, and each of data supply lines is disposed in the third conductive layer or the fourth conductive layer.

34 Claims, 36 Drawing Sheets

SEL : CHDT, SDT, DDT, CH1-1, S1-1, D1-1, CH1-2, S1-2, D1-2,
CH2, S2, D2, CH3-1, S3-1, D3-1, CH3-2, S3-2, D3-2,
CH4, S4, D4, CH5, S5, D5, CH6, S6, D6
CDL1 : GWL, GIL, ECL, GCL, GDT, G1-1, G1-2, G2, G3-1, G3-2, G4, G5, G6
CDL2 : SHE, VDSBL1, VGIL, VAIL
CDL3 : VDSBL2, VGIAL, VAIAL, CE1, CE2, CE3
VDL : VDSBL1, VDSBL2

CDL4 : VDAL, VSSBL
CDL5 : DL1, VSAL

DOPL : DOPL1, DOPL2

DISPLAY DEVICE

CROSS-REFERENCE TO RELATED APPLICATION(S)

This application claims priority to and benefits of Korean Patent Application No. 10-2022-0099730 under 35 U.S.C § 119, filed on Aug. 10, 2022, in the Korean Intellectual Property Office (KIPO), the entire contents of which are incorporated herein by reference.

BACKGROUND

1. Field of the Disclosure

The disclosure relates to a display device.

2. Description of the Related Art

As the information-oriented society evolves, various demands for display devices are ever increasing. For example, display devices are being employed by a variety of electronic devices such as smart phones, digital cameras, laptop computers, navigation devices, and smart televisions.

The display device may include a display panel that emits light for displaying images, and a driver that supplies a signal or power for driving the display panel.

At least one surface of the display device may be referred to as a display surface on which images are displayed. The display surface may include a display area in which emission areas emitting lights for displaying images are arranged, and a non-display area disposed adjacent to the display area.

A display device may include data lines disposed in the display area to transmit data signals to the emission areas, and a display driver circuit for supplying the data signals to the data lines.

The signal transmission paths between data lines and a display driver circuit are made of a conductive material, and thus they have a resistance proportional to their length. Accordingly, the time taken for a data signal output from the display driver circuit to reach a data line increases in proportion to the resistance of the signal transmission path. As a result, the time during which the data signal is actually written into each pixel may be reduced, and thus there is a problem in that image quality may be deteriorated.

SUMMARY

Aspects of the disclosure provide a display device in which the time taken for a data signal output from a display driver circuit to be applied to a data line can be reduced.

According to an embodiment, a display device may include a substrate including a main area and a subsidiary area protruding from a side of the main area, the main area including a display area in which a plurality of emission areas is arranged, and a non-display area disposed adjacent to the display area, a circuit array layer disposed on the substrate and including a plurality of pixel drivers associated with the plurality of emission areas, respectively, and data lines transmitting data signals to the plurality of pixel drivers, a light-emitting array layer disposed on the circuit array layer and including a plurality of light-emitting elements associated with each of the plurality of emission areas, and a display driver circuit disposed in the subsidiary area of the substrate and supplying data driving signals to the data lines. A structure of the circuit array layer may include a semiconductor layer disposed on the substrate, a first conductive layer disposed on a first gate insulator covering the semiconductor layer, a second conductive layer disposed on a second gate insulator covering the first conductive layer, a third conductive layer disposed on an interlayer dielectric layer covering the second conductive layer, a fourth conductive layer disposed on a first planarization layer covering the third conductive layer, and a second planarization layer covering the fourth conductive layer. Data supply lines may be electrically connected to output terminals of the display driver circuit, respectively, and each of data supply lines may be disposed in the third conductive layer or the fourth conductive layer.

The data lines may be electrically connected to data output lines disposed in the non-display area, respectively. Each of the data output lines may be disposed in the first conductive layer or the second conductive layer.

Each of the first conductive layer and the second conductive layer may include a single layer including at least one of molybdenum (Mo), aluminum (Al), chromium (Cr), gold (Au), titanium (Ti), nickel (Ni), neodymium (Nd), copper (Cu), and an alloy thereof. Each of the third conductive layer and the fourth conductive layer may include a multi-layer including a main layer, and a first sub-layer and a second sub-layer disposed on each side of the main layer. The main layer may include at least one of molybdenum (Mo), aluminum (Al), chromium (Cr), gold (Au), nickel (Ni), neodymium (Nd), and copper (Cu). Each of the first sub-layer and the second sub-layer may include titanium (Ti).

The subsidiary area may include a bending area that may be bendable, a first subsidiary area disposed between the main area and a side of the bending area, and a second subsidiary area disposed on another side of the bending area. The display driver circuit and the data supply lines may be disposed in the second subsidiary area. The circuit array layer may further include a first voltage pad line and a second voltage pad line which are disposed in the second subsidiary area and transmit first and second voltages for driving the plurality of light-emitting elements, respectively.

The data output lines may extend from the first subsidiary area to the non-display area and electrically connect the data supply lines and the data lines.

The data lines may be disposed in the fourth conductive layer. The data supply lines may be disposed in the third conductive layer. The first voltage pad line and the second voltage pad line may be disposed in the fourth conductive layer.

The display area may include a middle area disposed adjacent to the subsidiary area, and a first side area disposed between the middle area and the non-display area in a first direction. The first side area may include a first display divided area disposed adjacent to the non-display area in the first direction, and a second display divided area disposed between the first display divided area and the middle area. The data lines may extend in a second direction intersecting the first direction. The data lines may include a first data line disposed in the middle area and electrically connected to a first data output line among the data output lines, a second data line disposed in the second display divided area and electrically connected to a second data output line among the data output lines, and a third data line disposed in the first display divided area. The circuit array layer may further include a first data detour line disposed in the second display divided area adjacent to the second data line, electrically connected to a third data output line among the data output lines, and extending in the second direction, and a second data detour line disposed in the first side area, extending in the first direction, and electrically connecting the first data detour line and the third data line.

The circuit array layer may further include a first voltage supply line extending from the first subsidiary area to the non-display area and electrically connected to the first voltage pad line, a second voltage supply line extending from the first subsidiary area to the non-display area and electrically connected to the second voltage pad line, and second voltage auxiliary lines disposed in the display area, extending in the second direction, and electrically connected to the second voltage supply line. One of the second voltage auxiliary lines may be disposed adjacent to the first data line in the middle area, and another one of the second voltage auxiliary lines may be disposed adjacent to the third data line in the first display divided area. The structure of the circuit array layer may further include a fifth conductive layer disposed on the second planarization layer and a third planarization layer covering the fifth conductive layer. The data lines, the second voltage auxiliary lines, and the first data detour line may be disposed in the fifth conductive layer.

The data supply lines may be disposed in the third conductive layer. Each of the first voltage pad line and the second voltage pad line may be disposed in the fourth conductive layer or the fifth conductive layer.

The first voltage pad line and the second voltage pad line may be disposed in the fifth conductive layer.

The display area may further include a second side area disposed symmetrical to the first side area with respect to the middle area in the first direction. The circuit array layer may further include first voltage auxiliary lines disposed in the display area, extending in the first direction, and electrically connected to the first voltage supply line, and a second voltage sub-line disposed in a general area of the display area other than the middle area, the first side area and the second side area, extending in the first direction, and electrically connected to the second voltage supply line. One of the first voltage auxiliary lines may be disposed adjacent to the second data detour line in the first side area, the second side area, and the middle area, and another one of the first voltage auxiliary lines may be disposed adjacent to the second voltage sub-line in the general area. The second data detour line, the first voltage auxiliary lines, and the second voltage sub-line may be disposed in the fourth conductive layer.

The circuit array layer may further include a first dummy line colinear with the first data detour line, spaced apart from the first data detour line, extending in the second direction, and disposed in the fifth conductive layer, and second dummy lines colinear with the second data detour line, spaced apart from the second data detour line, extending in the first direction, and disposed in the fourth conductive layer.

The circuit array layer may further include demux circuits disposed in a demux area disposed between the subsidiary area and the display area in the non-display area, and data input lines extending from the first subsidiary area to the non-display area and electrically connecting input terminals of the demux circuits and the data supply lines, respectively. The data output lines may electrically connect output terminals of the demux circuits and the data lines respectively. One of the demux circuits may output at least two data signals based on one data driving signal output from the display driver circuit.

The data lines may be disposed in the fourth conductive layer. The data supply lines may be disposed in the third conductive layer. The first voltage pad line and the second voltage pad line may be disposed in the fourth conductive layer.

The demux area may include a first demux area disposed adjacent to the subsidiary area, and a second demux area contacting the first demux area in a first direction. The first demux area may include a middle demux area disposed at a center of the first demux are, and a side demux area disposed between the middle demux area and the second demux area. The demux circuits may include a first demux circuit disposed in the side demux area and a second demux circuit disposed in the second demux area. The data input lines may include a first data input line and a second data input line. The first data input line may be electrically connected to an input terminal of the first demux circuit and may extend from the first subsidiary area to the side demux area. The second data input line may be electrically connected to an input terminal of the second demux circuit and may include a main input line extending from the first subsidiary area to the side demux area, a demux detour line electrically connected to the main input line and disposed in the display area, and a detour additional line disposed in the second demux area and electrically connecting the demux detour line and the input terminal of the second demux circuit.

The display area may include a demux adjacent area disposed adjacent to the demux area in a second direction intersecting the first direction, and a general area other than the demux adjacent area. The demux adjacent area may include a middle adjacent area disposed adjacent to the middle demux area, a side adjacent area disposed adjacent to the side demux area, and an edge adjacent area disposed adjacent to the second demux area. The data lines may extend in the second direction. The demux detour line may include a first demux detour line electrically connected to the main input line, disposed in the side adjacent area, and extending in the second direction, a second demux detour line electrically connected to the first demux detour line and extending in the first direction toward the edge adjacent area, and a third demux detour line disposed in the edge adjacent area, extending in the second direction, and electrically connecting the second demux detour line and the detour additional line.

The circuit array layer may further include a first voltage supply line extending from the first subsidiary area to the non-display area and electrically connected to the first voltage pad line, a second voltage supply line extending from the first subsidiary area to the non-display area and electrically connected to the second voltage pad line, and a second voltage auxiliary line disposed in the display area, extending in the second direction, and electrically connected to the second voltage supply line. The data lines may include a first data line and a second data line disposed in the side adjacent area and electrically connected to output terminals of the first demux circuit, and a third data line and a fourth data line disposed in the edge adjacent area and electrically connected to output terminals of the second demux circuit. In the side adjacent area, the first data line may be disposed adjacent to the first demux detour line, and the second data line may be disposed adjacent to the second voltage auxiliary line. In the edge adjacent area, the third data line may be disposed adjacent to the third demux detour line, and the fourth data line may be disposed adjacent to the second voltage auxiliary line.

The structure of the circuit array layer may further include a fifth conductive layer disposed on the second planarization layer, and a third planarization layer covering the fifth conductive layer. The data lines, the first demux detour line, the third demux detour line, and the second voltage auxiliary line may be disposed in the fifth conductive layer.

The data supply lines may be disposed in the third conductive layer. Each of the first voltage pad line and the second voltage pad line may be disposed in the fourth conductive layer or the fifth conductive layer.

The first voltage pad line and the second voltage pad line may be disposed in the fifth conductive layer.

The circuit array layer may further include first voltage auxiliary lines disposed in the display area, extending in the first direction, and electrically connected to the first voltage supply line, and a second voltage sub-line disposed in the general area, extending in the first direction, and electrically connected to the second voltage supply line. One of the first voltage auxiliary lines may be disposed adjacent to the second demux detour line in the demux adjacent area, and another one of the first voltage auxiliary lines may be disposed adjacent to the second voltage sub-line in the general area. The second demux detour line, the first voltage auxiliary lines, and the second voltage sub-line may be disposed in the fourth conductive layer.

The circuit array layer may further include first dummy lines in parallel with each of the first demux detour line and the third demux detour line, spaced apart from each of the first demux detour line and the third demux detour line, extending in the second direction, and disposed in the fifth conductive layer, and second dummy lines colinear with the second demux detour line, spaced apart from the second demux detour line, extending in the first direction, and disposed in the fourth conductive layer.

According to an embodiment, a display device may include a substrate including a main area and a subsidiary area protruding from a side of the main area, the main area including a display area in which a plurality of emission areas is arranged, and a non-display area disposed adjacent to the display area, a circuit array layer disposed on the substrate and including a plurality of pixel drivers associated with the plurality of emission areas, respectively, data lines transmitting data signals to the plurality of pixel drivers, and data output lines disposed in the non-display area and electrically connected to the data lines, respectively, a light-emitting array layer disposed on the circuit array layer and comprising a plurality of light-emitting elements associated with each of the plurality of emission areas, and a display driver circuit disposed in the subsidiary area of the substrate and supplying data driving signals to the data lines. A structure of the circuit array layer may include a semiconductor layer disposed on the substrate, a first conductive layer disposed on a first gate insulator covering the semiconductor layer, a second conductive layer disposed on a second gate insulator covering the first conductive layer, a third conductive layer disposed on an interlayer dielectric layer covering the second conductive layer, a fourth conductive layer disposed on a first planarization layer covering the third conductive layer, a fifth conductive layer disposed on a second planarization layer covering the fourth conductive layer, and a third planarization layer covering the fifth conductive layer. The data lines may be disposed in the fifth conductive layer. Each of the data output lines may be disposed in the first conductive layer or the second conductive layer. Data supply lines may be electrically connected to output terminals of the display driver circuit, respectively, and each of the data supply lines may be disposed in the third conductive layer or the fourth conductive layer.

Each of the first conductive layer and the second conductive layer may include a single layer including at least one of molybdenum (Mo), aluminum (Al), chromium (Cr), gold (Au), titanium (Ti), nickel (Ni), neodymium (Nd), copper (Cu), and an alloy thereof. Each of the third conductive layer and the fourth conductive layer may include a multi-layer including a main layer, and a first sub-layer and a second sub-layer disposed on each side of the main layer. The main layer may include at least one of molybdenum (Mo), aluminum (Al), chromium (Cr), gold (Au), nickel (Ni), neodymium (Nd), and copper (Cu). Each of the first sub-layer and the second sub-layer may include titanium (Ti).

The subsidiary area may include a bending area that may be bendable, a first subsidiary area disposed between the main area and a side of the bending area, and a second subsidiary area disposed on another side of the bending area. The display driver circuit and the data supply lines may be disposed in the second subsidiary area. The circuit array layer may further include a first voltage pad line and a second voltage pad line, which are disposed in the second subsidiary area and transmit first and second voltages for driving the plurality of light-emitting elements, respectively.

The first voltage pad line and the second voltage pad line may be disposed in the fifth conductive layer.

The data supply lines may be disposed in the third conductive layer. Each of the first voltage pad line and the second voltage pad line may be disposed in the fourth conductive layer or the fifth conductive layer.

The display area may include a middle area disposed adjacent to the subsidiary area, and a first side area disposed between the middle area and the non-display area in a first direction. The first side area may include a first display divided area disposed adjacent to the non-display area in the first direction, and a second display divided area disposed between the first display divided area and the middle area. The data lines may extend in a second direction intersecting the first direction. The data lines may include a first data line disposed in the middle area and electrically connected to a first data output line among the data output lines, a second data line disposed in the second display divided area and electrically connected to a second data output line among the data output lines, and a third data line disposed in the first display divided area. The circuit array layer may further include a first data detour line disposed in the second display divided area adjacent to the second data line, electrically connected to a third data output line among the data output lines, and extending in the second direction, and a second data detour line disposed in the first side area, extending in the first direction, and electrically connecting the first data detour line and the third data line.

The circuit array layer may further include a first voltage supply line extending from the first subsidiary area to the non-display area and electrically connected to the first voltage pad line, a second voltage supply line extending from the first subsidiary area to the non-display area and electrically connected to the second voltage pad line, and second voltage auxiliary lines disposed in the display area, extending in the second direction, and electrically connected to the second voltage supply line. One of the second voltage auxiliary lines may be disposed adjacent to the first data line in the middle area, and another one of the second voltage auxiliary lines may be disposed adjacent to the third data line in the first display divided area. The second voltage auxiliary lines and the first data detour line may be disposed in the fifth conductive layer.

The display area may further include a second side area disposed symmetrical to the first side area with respect to the middle area in the first direction. The circuit array layer may further include first voltage auxiliary lines disposed in the display area, extending in the first direction, and electrically connected to the first voltage supply line, and a second voltage sub-line disposed in a general area of the display area other than the middle area, the first side area, and the second side area, extending in the first direction, and electrically connected to the second voltage supply line. One of the first voltage auxiliary lines may be disposed adjacent to the second data detour line in the first side area, the second side area, and the middle area, and another one of the first voltage auxiliary lines may be disposed adjacent to the second voltage sub-line in the general area. The second data detour line, the first voltage auxiliary lines, and the second voltage sub-line may be disposed in the fourth conductive layer.

The circuit array layer may further include demux circuits disposed in a demux area disposed between the subsidiary area and the display area in the non-display area, and data input lines extending from the first subsidiary area to the non-display area and electrically connecting input terminals of the demux circuits and the data supply lines, respectively. The data output lines may electrically connect output terminals of the demux circuits and the data lines respectively. One of the demux circuits may output at least two data signals based on one data driving signal output from the display driver circuit. The demux area may include a first demux area disposed adjacent to the subsidiary area, and a second demux area contacting the first demux area in a first direction. The first demux area may include a middle demux area disposed at a center of the first demux area, and a side demux area disposed between the middle demux area and the second demux area. The demux circuits may include a first demux circuit disposed in the side demux area and a second demux circuit disposed in the second demux area. The data input lines may include a first data input line and a second data input line. The first data input line may be electrically connected to an input terminal of the first demux circuit and may extend from the first subsidiary area to the side demux area. The second data input line may be electrically connected to an input terminal of the second demux circuit and may include a main input line extending from the first subsidiary area to the side demux area, a demux detour line electrically connected to the main input line and disposed in the display area, and a detour additional line disposed in the second demux area and electrically connecting the demux detour line and the input terminal of the second demux circuit.

The display area may include a demux adjacent area disposed adjacent to the demux area in a second direction intersecting the first direction, and a general area other than the demux adjacent area. The demux adjacent area may include a middle adjacent area disposed adjacent to the middle demux area, a side adjacent area disposed adjacent to the side demux area, and an edge adjacent area disposed adjacent to the second demux area. The data lines may extend in the second direction. The demux detour line may include a first demux detour line electrically connected to the main input line, disposed in the side adjacent area, and extending in the second direction, a second demux detour line electrically connected to the first demux detour line and extending in the first direction toward the edge adjacent area, and a third demux detour line disposed in the edge adjacent area, extending in the second direction, and electrically connecting the second demux detour line and the detour additional line.

The circuit array layer may further include a first voltage supply line extending from the first subsidiary area to the non-display area and electrically connected to the first voltage pad line, a second voltage supply line extending from the first subsidiary area to the non-display area and electrically connected to the second voltage pad line, and a second voltage auxiliary line disposed in the display area, extending in the second direction, and electrically connected to the second voltage supply line. The data lines may include a first data line and a second data line disposed in the side adjacent area and electrically connected to output terminals of the first demux circuit, and a third data line and a fourth data line disposed in the edge adjacent area and electrically connected to output terminals of the second demux circuit. In the side adjacent area, the first data line may be disposed adjacent to the first demux detour line, and the second data line may be disposed adjacent to the second voltage auxiliary line. In the edge adjacent area, the third data line may be disposed adjacent to the third demux detour line, and the fourth data line may be disposed adjacent to the second voltage auxiliary line. The first demux detour line, the third demux detour line, and the second voltage auxiliary line may be disposed in the fifth conductive layer.

The circuit array layer may further include first voltage auxiliary lines disposed in the display area, extending in the first direction, and electrically connected to the first voltage supply line, and a second voltage sub-line disposed in the general area, extending in the first direction, and electrically connected to the second voltage line. One of the first voltage auxiliary lines may be disposed adjacent to the second demux detour line in the demux adjacent area, and another one of the first voltage auxiliary lines may be disposed adjacent to the second voltage sub-line in the general area. The second demux detour line, the first voltage auxiliary lines, and the second voltage sub-line may be disposed in the fourth conductive layer.

According to an embodiment of the disclosure, a display device may include a circuit array layer having a structure including a semiconductor layer, a first gate insulator, a first conductive layer, a second gate insulator, a second conductive layer, an interlayer dielectric layer, a third conductive layer, a first planarization layer, a fourth conductive layer, and a second planarization layer, and a display driving circuit for supplying data driving signals to data lines of the circuit array layer. Data supply lines electrically connected to the output terminals of the display driver circuit, respectively, may be formed of at least one of the third conductive layer and the fourth conductive layer. Data output lines electrically connected to the data lines, respectively, may be formed of the first conductive layer or the second conductive layer.

Each of the first conductive layer and the second conductive layer may be made up of a single layer including at least one of molybdenum (Mo), aluminum (Al), chromium (Cr), gold (Au), titanium (Ti), nickel (Ni), neodymium (Nd), copper (Cu), and an alloy thereof, and each of the third conductive layer and the fourth conductive layer may have a multi-layer structure including a main layer and a first sub-layer and a second sub-layer disposed on the each side of the main layer, respectively. Accordingly, each of the third conductive layer and the fourth conductive layer may have less resistance than that of the first conductive layer and the second conductive layer.

For example, the data supply lines may be not formed of the first conductive layer or the second conductive layer but may be formed of at least one of the third conductive layer and the fourth conductive layer having relatively small resistance, like the data output lines. The resistance of the signal transmission paths from the display driver circuit to the data lines may be reduced, so that the time taken for a data signal output from the display driver circuit to be applied to a data signal may be reduced.

Therefore, it is possible to prevent a shortage of time for writing a data signal into each pixel, and also to achieve a sufficient time required to compensate for a difference in threshold voltage of a driving transistor or a difference in a parasitic capacitor of a light-emitting element for preventing Mura defects. Accordingly, the image quality of the display device may be advantageously improved.

However, the effects of the disclosure are not limited to the aforementioned effects, and various other effects are included in the specification.

BRIEF DESCRIPTION OF THE DRAWINGS

The above and other aspects and features of the disclosure will become more apparent by describing in detail embodiments thereof with reference to the attached drawings.

DETAILED DESCRIPTION OF THE EMBODIMENTS

Figure 1:
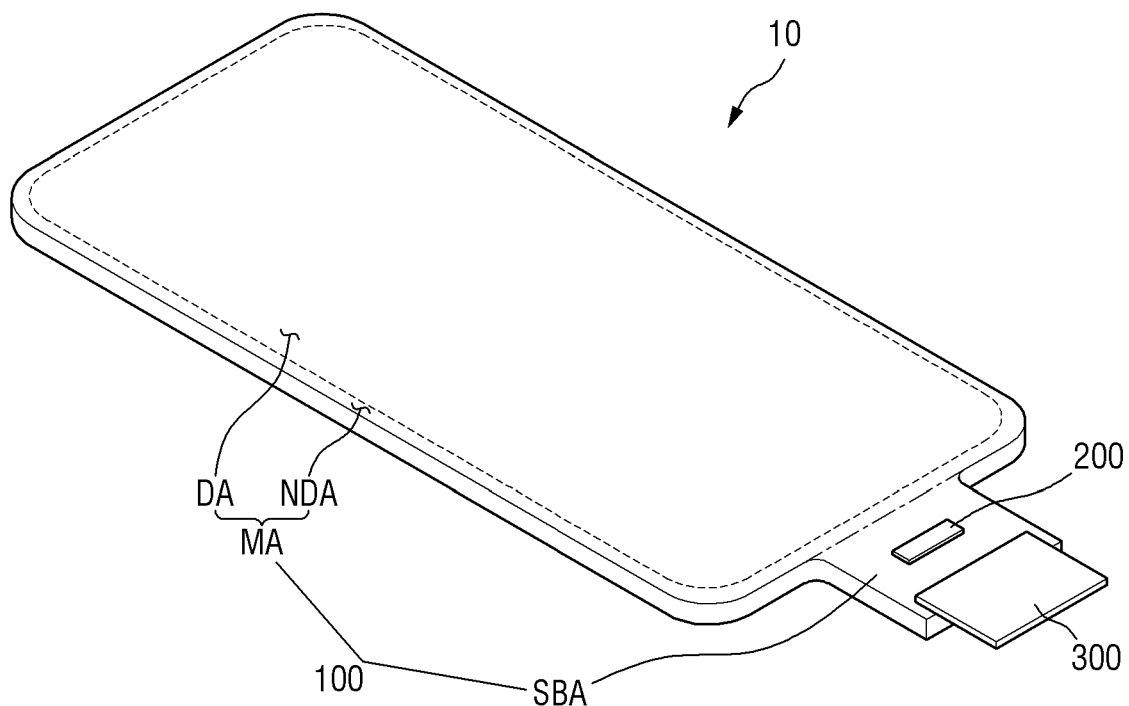
FIG. 1 is a perspective view of a display device according to an embodiment of the disclosure.
Figure 1:
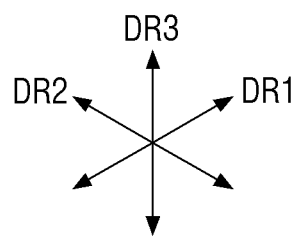

The embodiments will now be described more fully hereinafter with reference to the accompanying drawings. The embodiments may, however, be provided in different forms and should not be construed as limiting. The same reference numbers or reference characters indicate the same components throughout the disclosure. In the accompanying figures, the thickness of layers and regions may be exaggerated for clarity.

Some of the parts which are not associated with the description may not be provided in order to describe embodiments of the disclosure.

It will be understood that when a layer is referred to as being "on" another layer or substrate, it can be directly on the other layer or substrate, or intervening layers may also be present. In contrast, when an element is referred to as being "directly on" another element, there may be no intervening elements present.

Further, the phrase "in a plan view" means when an object portion is viewed from above, and the phrase "in a schematic cross-sectional view" means when a cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

The spatially relative terms "below," "beneath," "lower," "above," "upper," or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations. Further, the terms "left," "right," "upper," and "lower" respectively indicate corresponding directions on the surface of the display device. For example, the term "left" indicates a direction opposite to an X-axis direction (or first direction DR1), the term "right" indicates the X-axis direction, the term "upper" indicates a Y-axis direction (or second direction DR2), and the term "lower" indicates a direction opposite to the Y-axis direction.

When an element is referred to as being "connected" or "coupled" to another element, the element may be "directly connected" or "directly coupled" to another element, or "electrically connected" or "electrically coupled" to another element with one or more intervening elements interposed therebetween. To this end, the term "connected" may refer to physical, electrical, and/or fluid connection, with or without intervening elements. Also, when an element is referred to as being "in contact" or "contacted" or the like to another element, the element may be in "electrical contact" or in "physical contact" with another element; or in "indirect contact" or in "direct contact" with another element. It will be further understood that when the terms "comprises," "comprising," "has," "have," "having," "includes" and/or "including" are used, they may specify the presence of stated features, integers, steps, operations, elements and/or components, but do not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

The terms "about" or "approximately" as used herein is inclusive of the stated value and means within an acceptable range of deviation for the particular value as determined by one of ordinary skill in the art, considering the measurement in question and the error associated with measurement of the particular quantity (for example, the limitations of the measurement system). For example, "about" may mean within one or more standard deviations, or within ±30%, 20%, 10%, 5% of the stated value.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Hereinafter, embodiments of the disclosure will be described in detail with reference to the accompanying drawings.

Figure 2:
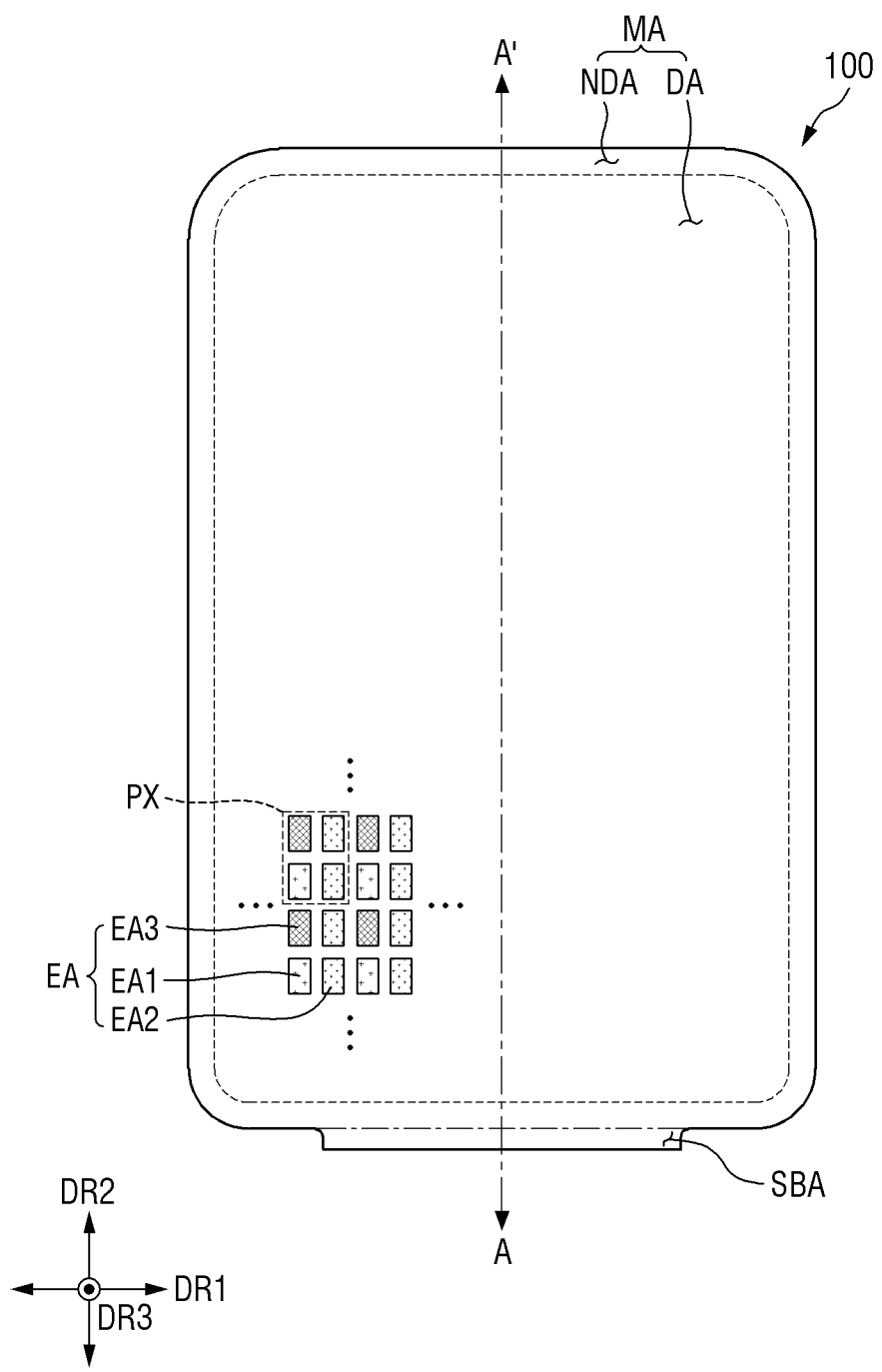
FIG. 2 is a plan view showing the display device of FIG. 1.
Figure 3:
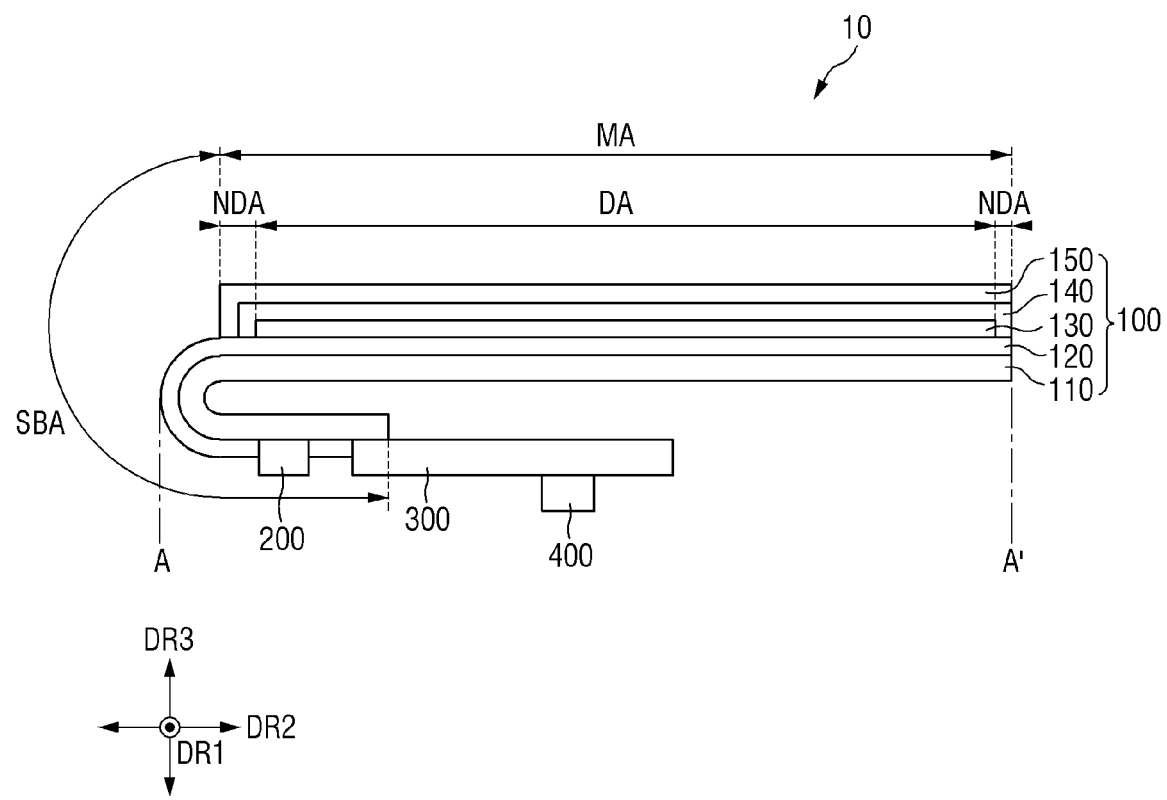
FIG. 3 is a schematic cross-sectional view taken along line A-A' of FIG. 2 according to an embodiment of the disclosure.

FIG. 1 is a perspective view of a display device according to an embodiment of the disclosure. FIG. 2 is a plan view showing the display device of FIG. 1. FIG. 3 is a schematic cross-sectional view taken along line A-A' of FIG. 2 according to an embodiment of the disclosure.

Referring to FIG. 1, a display device 10 may be for displaying moving images or still images. The display device 1 may be used as a display screen of portable electronic devices such as a mobile phone, a smart phone, a tablet PC, a smart watch, a watch phone, a mobile communications terminal, an electronic notebook, an electronic book, a portable multimedia player (PMP), a navigation device, and a ultra mobile PC (UMPC), as well as a display screen of various products such as a television, a notebook, a monitor, a billboard, and the Internet of Things.

The display device 10 may be a light-emitting display device such as an organic light-emitting display device using organic light-emitting diodes, an inorganic light-emitting display device including an inorganic semiconductor, and a micro light-emitting display device using micro or nano light-emitting diodes (micro LEDs or nano LEDs). In the following description, an organic light-emitting display device is employed as the display device 10. It should be understood, however, that the disclosure is not limited thereto. A display device including an organic insulating material, an organic light-emitting material, and a metal may be employed as the display device 10.

The display device 10 may be formed flat, but is not limited thereto. For example, the display device 10 may include curved portions that are formed at left and right ends and have a constant curvature or varying curvatures. The display device 10 may be flexible so that it can be curved, bent, folded, or rolled.

The display device 10 may include a display panel 100, a display driver circuit 200, and a circuit board 300.

Referring to FIG. 2, at least one surface of the display panel 100 may include a main area MA that includes a display area DA where lights are output to display images, and a non-display area NDA that is the peripheral area of the display area DA.

For example, the display panel 100 may include the main area MA and a subsidiary area SBA protruding from a side of the main area MA, and the main area MA may include the display area DA and the non-display area NDA. The subsidiary area SBA may be an area protruding from the non-display area NDA of the main area MA toward a side in the second direction DR2.

As a part of the subsidiary area SBA bend, another part of the subsidiary area SBA may be disposed on the rear surface of the display panel 100.

FIG. 2 shows an embodiment a part of the subsidiary area SBA is bent.

Multiple emission areas EA emitting light with respective luminance may be arranged in the display area DA.

The display area DA may be formed in a rectangular shape having shorter sides in the first direction DR1 and longer sides in the second direction DR2 intersecting the first direction DR1 in a plan view. Each of the corners where the short side meets the longer side may be rounded with a curvature or may be a right angle. The shape of the display area DA in a plan view is not limited to a quadrangular shape, but may be formed in a different polygonal shape, a circular shape, or an elliptical shape.

The display area DA may occupy most of the main area MA. The display area DA may be disposed at the center of the main area MA.

The display area DA may include multiple emission areas EA arranged in parallel with one another. The display area DA may further include a non-emission area that is a space between the emission areas EA.

The emission areas EA may be arranged parallel to one another in the first direction DR1 and the second direction DR2.

Each of the emission areas EA may have a diamond shape or a rectangular shape in a plan view. It should be understood, however, that the disclosure is not limited thereto. The shape of the emission areas EA in a plan view is not limited to that shown in FIG. 2. The emission areas EA may have other polygonal shape than a rectangular shape, such as a hexagon, a circular shape, or an elliptical shape.

The emission areas EA may include first emission areas EA1 emitting light of a first color in a wavelength band (predetermined or selectable), second emission areas EA2 emitting light of a second color in a wavelength band lower than that of the first color, and third emission areas EA3 emitting light of a third color in a wavelength band lower than that of the second color.

For example, the first color may be red with a wavelength in a range of approximately 600 nm to approximately 750 nm. The second color may be green with a wavelength in a range of approximately 480 nm to approximately 560 nm. The third color may be blue with a wavelength in a range of approximately 370 nm to approximately 460 nm.

As shown in FIG. 2, the first emission areas EA1 and the third emission areas EA3 may be arranged alternately in at least one of the first direction DR1 and the second direction DR2. The second emission areas EA2 may be arranged in at least one of the first direction DR1 and the second direction DR2.

Multiple pixels PX each emitting the respective luminance and color may be formed in the emission areas EA. Each of the pixels PX may be a basic unit for emitting various colors including white with a luminance (predetermined or selectable).

Each of the pixels PX may include at least one first emission area EA1, at least one second emission area EA2, and at least one third emission area EA3 adjacent to one another.

Each of the pixels PX may emit a color and a luminance that is generated by mixing the lights emitted from at least one first emission area EA1, at least one second emission area EA2, and at least one third emission area EA3 adjacent to one another.

Although the emission areas EA have the same area in FIG. 2, the disclosure is not limited thereto. In another embodiment, the third emission area EA3 may have the greatest area, and the second emission area EA2 may have the smallest area in a plan view.

Although the emission areas EA are arranged side by side in the first direction DR1 and the second direction DR2 in FIG. 2, the disclosure is not limited thereto. In another embodiment, the second emission areas EA2 may be disposed adjacent to the first and third emission areas EA1 and EA3 in diagonal directions crossing the first and second directions DR1 and DR2.

Referring to FIG. 3, the display panel 100 of the display device 10 may include the substrate 110 including the main area MA and the subsidiary area SBA, a circuit array layer 120 disposed on the substrate 110, and a light-emitting array layer 130 disposed on the circuit array layer 120. The circuit array layer 120 may include multiple pixel drivers PXD (PXD1 (see FIG. 5), PXD2 (see FIGS. 13 and 30), and PXD3 (see FIG. 24)) associated with multiple emission areas EA, and data lines DL (see FIGS. 5, 13, 24 and 30) for transmitting data signals to the pixel drivers PXD1, PXD2, and PXD3.

The display device 10 may further include a display driver circuit 200 disposed in the subsidiary area SBA of the substrate 110 and supplying data driving signals to the data lines DL.

The light-emitting array layer 130 may include multiple light-emitting elements LEL (see FIGS. 6, 7, and 14) associated with the emission areas EA, respectively.

The display panel 100 of the display device 10 may further include an encapsulation structure layer 140 covering the light-emitting array layer 130, and a sensor electrode layer 150 disposed on the encapsulation structure layer 140.

The substrate 110 may be made of an insulating material such as a polymer resin. For example, the substrate 110 may be made of polyimide. The substrate 110 may be a flexible substrate that can be bent, folded, or rolled.

In another embodiment, the substrate 110 may be made of an insulating material such as glass.

As will be described with reference to FIGS. 7 and 17, the circuit array layer 120 may include a semiconductor layer SEL on the substrate 110, a first conductive layer CDL1 on the first gate insulator 122 that covers the semiconductor layer SEL, a second conductive layer CDL2 on the second gate insulator 123 that covers the first conductive layer CDL1, a third conductive layer CDL3 on the interlayer dielectric layer 124 that covers the second conductive layer CDL2, a fourth conductive layer CDL4 on the first planarization layer 125 that covers the third conductive layer CDL3, and the second planarization layer 126 covering the fourth conductive layer CDL4.

As will be described with reference to FIGS. 11, 21, 22, 28, 35 and 36, the data supply lines may be electrically connected to the output terminals of the display driver circuit 200, respectively. Each of the data supply lines may be disposed in the third conductive layer CDL3 or the fourth conductive layer CDL4. As a result, the resistance of the signal transmission paths between the display driver circuit 200 and the data lines DL may be relatively low.

The encapsulation structure layer 140 may be disposed on the circuit array layer 120 in the main area MA, and may cover the light-emitting array layer 130. The encapsulation structure layer 140 may include a structure in which at least one inorganic film and at least one organic film are alternately stacked each other on the light-emitting array layer 130.

The sensor electrode layer 150 may be disposed on the encapsulation structure layer 140 in the main area MA. The sensor electrode layer 150 may include touch electrodes for sensing a touch of a person or an object.

The display driver circuit 200 may be implemented as an integrated circuit (IC) and may be mounted on the subsidiary area SBA of the substrate 110 by a chip on glass (COG) technique, a chip on plastic (COP) technique, or an ultrasonic bonding. It should be understood, however, that the disclosure is not limited thereto. The arrangement of the display driver circuit 200 is not limited to that shown in FIG. 3.

For example, the display driver circuit 200 may be attached on the circuit board 300 by chip-on-film (COF) technique.

The circuit board 300 may be attached on the signal pads SPD of the second subsidiary area SB2 using a low-resistance, high-reliability material such as an anisotropic conductive film and SAP, and may be electrically connected to the signal pads SPD.

The pixel drivers PXD in the display area DA and the display driver circuit 200 may receive digital video data, timing signals, and driving voltages through the circuit board 300.

The circuit board 300 may be a flexible printed circuit board, a printed circuit board, or a flexible film such as a chip on film.

The circuit board 300 may be bonded to signal pads SPD (see FIG. 4) disposed in the subsidiary area SBA of the substrate 110.

The display device 10 may further include a cover window (not shown) disposed on the sensor electrode layer 150. The cover window may be attached on the sensor electrode layer 150 by a transparent adhesive member such as an optically clear adhesive (OCA) film and an optically clear resin (OCR). The cover window may include an inorganic material such as glass, or an organic material such as plastic and polymer. The cover window may protect the sensor electrode layer 150, the encapsulation structure layer 140, the light-emitting array layer 130, and the circuit array layer 120 from electrical and physical impact on the display surface.

The display device 10 may further include an anti-reflection member (not shown) disposed between the sensor electrode layer 150 and the cover window. The anti-reflection member may be a polarizing film or a color filter. The anti-reflection member may block the external light reflected by the sensor electrode layer 150, the encapsulation structure layer 140, the light-emitting array layer 130, and the circuit array layer 120 and the interfaces thereof, so that it is possible to prevent the visibility of the images on the display device 10 from being deteriorated.

The display device 10 may further include a touch driver circuit 400 for driving the sensor electrode layer 150.

The touch driver circuit 400 may be implemented as an integrated circuit (IC). The touch driver circuit 400 may be mounted on the circuit board 300 and electrically connected to the sensor electrode layer 150.

In another embodiment, like the display driver circuit 200, the touch driver circuit 400 may be mounted in a second subsidiary area SB2 of the substrate 110.

The touch driver circuit 400 may apply a touch driving signal to multiple driving electrodes disposed in the sensor electrode layer 150, may receive a touch sensing signal of each of multiple touch nodes through multiple sensing electrodes, and may sense a change in the mutual capacitance based on the touch sensing signal.

For example, the touch driver circuit 400 may determine whether there is a user's touch or near proximity, based on the touch sensing signal of each of the touch nodes. A user's touch may refer to that an object such as the user's finger or a pen is brought into contact with the front surface of the display device 10. A user's near proximity may refer to that an object such as the user's finger and a pen is hovering over the front of the display device 10.

Figure 4:
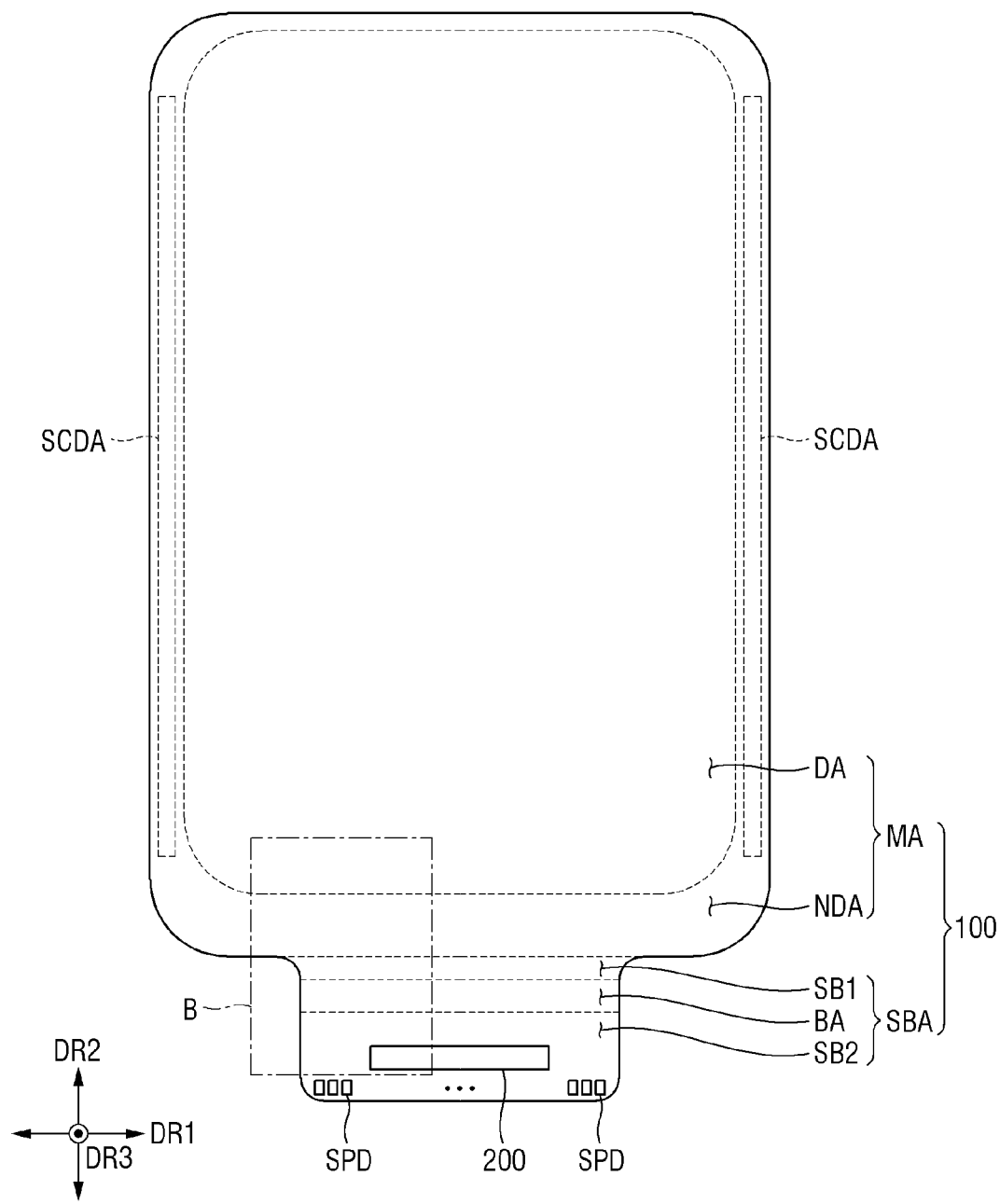
FIG. 4 is a plan view showing a display device according to a first embodiment.
Figure 5:
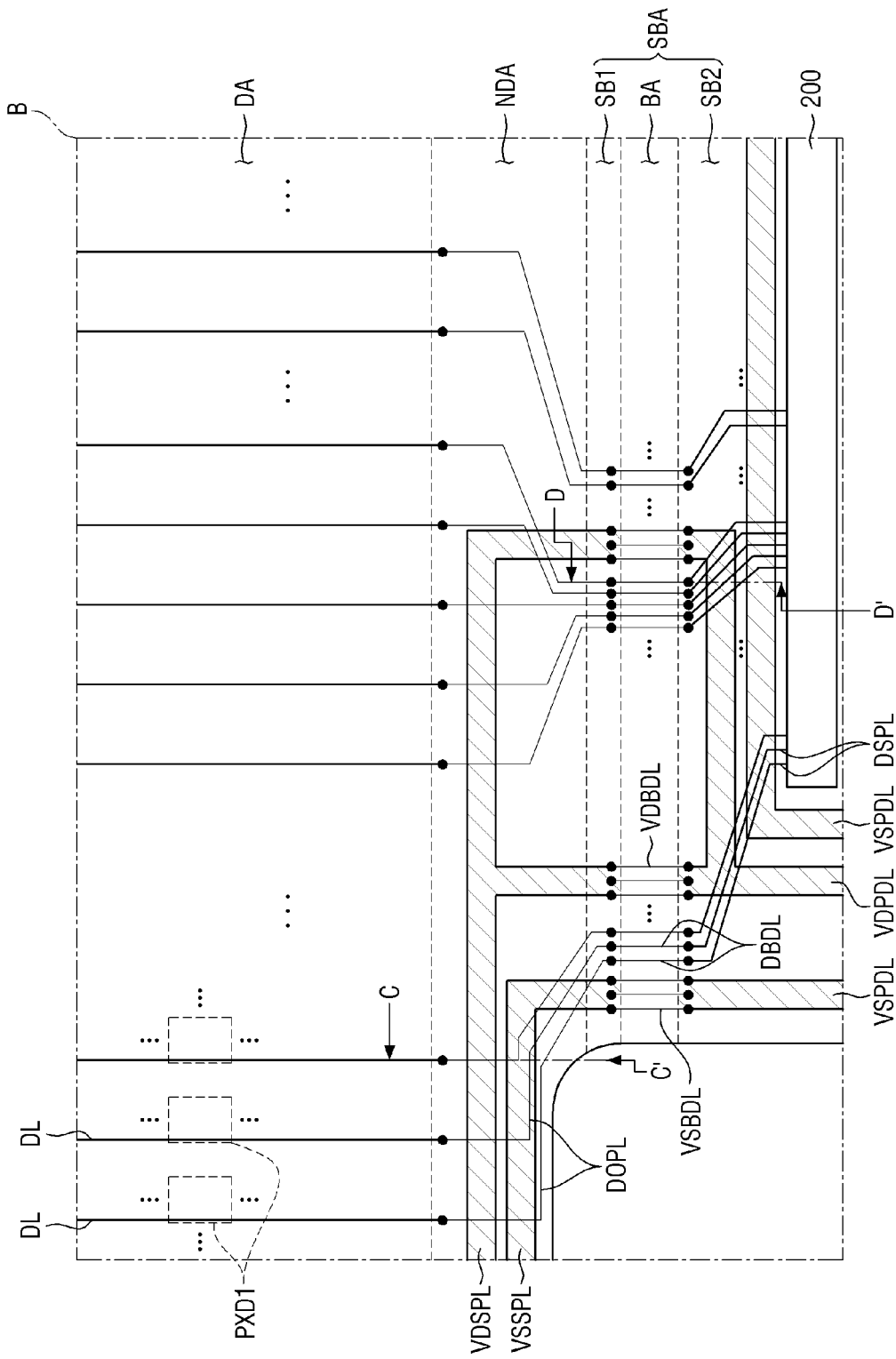
FIG. 5 is a layout view showing portion B of FIG. 4.

FIG. 4 is a plan view showing a display device according to a first embodiment. FIG. 5 is a layout view showing portion B of FIG. 4.

Referring to FIG. 4, the display panel 100 of the display device 10 according to the first embodiment may include a main area MA including a display area DA and a non-display area NDA, and a subsidiary area SBA protruding from a side of the main area MA.

The display area DA may include multiple emission areas EA arranged in the first direction DR1 and the second direction DR2.

The non-display area NDA may include a scan driver circuit area SCDA disposed adjacent to at least one side of the display area DA in the first direction DR1.

The circuit array layer 120 may further include a scan driver circuit (not shown) disposed in the scan driver circuit area SCDA. The scan driver circuit may supply scan signals to scan lines disposed in the display area DA and extended in the first direction DR1.

For example, the display driver circuit 200 or the circuit board 300 may supply a scan control signal to the scan driver circuit based on digital video data and timing signals.

The subsidiary area SBA may include a bending area BA that is bendable, and a first subsidiary area SB1 and a second subsidiary area SB2 that are in contact with each side of the bending area BA.

The first subsidiary area SB1 may be disposed between the main area MA and the bending area BA. A side of the first subsidiary area SB1 may be in contact with the non-display area NDA of the main area MA, and an opposite side of the first subsidiary area SB1 may be in contact with the bending area BA.

The second subsidiary area SB2 may be spaced apart from the main area MA with the bending area BA therebetween and may face the lower surface of the substrate 110 in case that the bending area BA is bent. For example, the second subsidiary area SB2 may overlap the main area MA in the third direction DR3 (or the thickness direction of the substrate 110) after the bending area BA is bent.

A side of the second subsidiary area SB2 may be in contact with the bending area BA. An opposite side of the second subsidiary area SB2 may be in contact with a circuit board 300.

The display driver circuit 200 and data supply lines connected to the output terminals of the display driver circuit 200 may be disposed in the second subsidiary area SB2.

The signal pads SPD bonded to the circuit board 300 may also be disposed in the second subsidiary area SB2.

Although the scan driver circuit areas SCDA are disposed in the non-display area NDA adjacent to both sides of the display area DA in the first direction DR1 in FIG. 4, the disclosure is not limited thereto. Although not shown in the drawings, the scan driver circuit area SCDA may be disposed in the non-display area NDA adjacent to a side of the display area DA in the first direction DR1, and may be divided into areas overlapping parts of the display area DA.

Referring to FIG. 5, the display device 10 according to the first embodiment may include a circuit array layer 120 and a display driver circuit 200. The circuit array layer 120 may include multiple pixel drivers PXD1 associated with the emission areas EA, respectively, and data lines DL that transmit data signals to the pixel drivers PXD1. The display driver circuit 200 may be disposed in the subsidiary area SBA and may supply data driving signals to the data lines DL.

The data lines DL may extend in the second direction DR2.

The output terminals of the display driver circuit 200 may be electrically connected to the data supply lines DSPL, respectively. The display driver circuit 200 and the data supply lines DSPL may be disposed in the second subsidiary area SB2.

The data supply lines DSPL may be electrically connected to the data bending lines DBDL disposed in the bending area BA, respectively.

The data lines DL may be electrically connected to the data output lines DOPL disposed in the non-display area NDA, respectively.

According to the first embodiment, the data output lines DOPL may extend from the first subsidiary area SB1 to the non-display area NDA, and may be electrically connect the data supply lines DSPL and the data lines DL, respectively.

For example, a data driving signal from an output terminal of the display driver circuit 200 may be transmitted to a data line DL as a data signal through a data supply line DSPL and a data output line DOPL.

The data supply lines DSPL may be electrically connected to the data output lines DOPL through the data bending lines DBDL of the bending area BA, respectively.

The circuit array layer 120 may further include a first voltage pad line VDPDL and a second voltage pad line VSPDL which are disposed in the second subsidiary area SB2 and transmit a first voltage and a second voltage, respectively, for driving the light-emitting elements in the light-emitting array layer 130.

The circuit array layer 120 may further include a first voltage supply line VDSPL extended from the first subsidiary area SB1 to the non-display area NDA and electrically connected to the first voltage pad line VDPDL, and a second voltage supply line VSSPL extended from the first subsidiary area SB1 to the non-display area NDA and electrically connected to the second voltage pad line VSPDL.

The circuit array layer 120 may further include a first voltage bending line VDBDL disposed in the bending area BA and electrically connecting between the first voltage pad line VDPDL and the first voltage supply line VDSPL, and a second voltage bending line VSBDL disposed in the bending area BA and electrically connecting between the second voltage pad line VSPDL and the second voltage supply line VSSPL.

The first voltage pad line VDPDL may be connected to at least one signal pad (not shown in FIG. 5) and may receive a first voltage transmitted from the circuit board 300.

The second voltage pad line VSPDL may be connected to at least another signal pad (not shown in FIG. 5) and may receive a second voltage transmitted from the circuit board 300.

In another embodiment, although not shown in the drawings, the first voltage pad line VDPDL and the second voltage pad line VSPDL may be connected to the display driver circuit 200.

Figure 6:
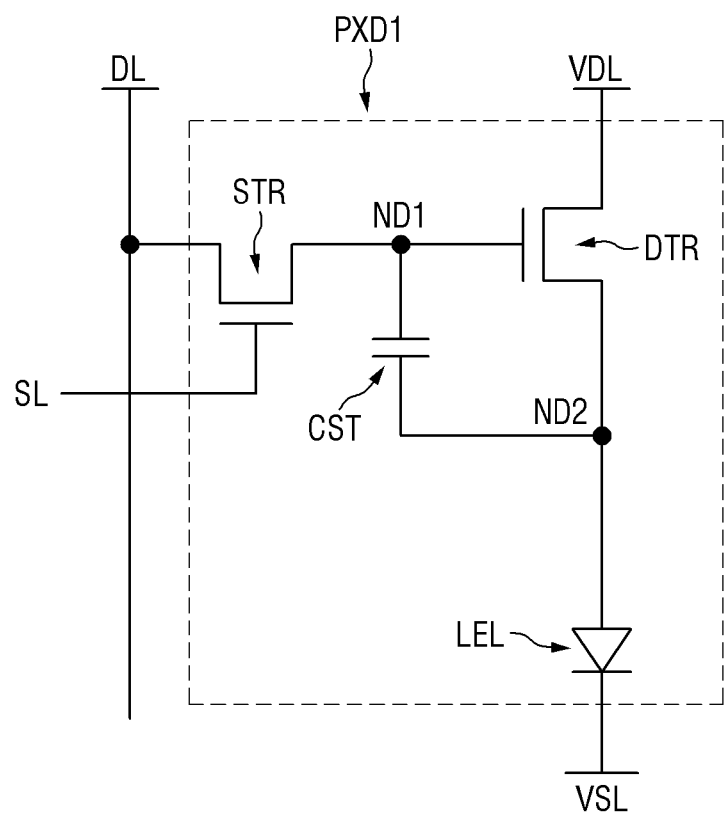
FIG. 6 is a schematic diagram of an equivalent circuit of the pixel driver of FIG. 5 according to an embodiment of the disclosure.

FIG. 6 is a schematic diagram of an equivalent circuit of the pixel driver of FIG. 5 according to an embodiment of the disclosure.

The pixel driver PXD1 may supply a driving current having a magnitude corresponding to the data signal transmitted through the data line DL to the light-emitting element LEL.

Referring to FIG. 6, the pixel driver PXD1 according to the first embodiment may include a driving transistor DTR, a switching transistor STR, and a storage capacitor CST.

The light-emitting element LEL may be a light-emitting diode including an anode electrode and a cathode electrode facing each other, and an emissive layer disposed between the anode electrode and the cathode electrode. For example, the light-emitting element LEL may be an organic light-emitting diode in which the emissive layer is made of an organic light-emitting material. In another example, the emissive layer of the light-emitting element LEL may be made of an inorganic photoelectric conversion material instead of an organic light-emitting material.

The driving transistor DTR may be connected in series with the light-emitting element LEL between a first voltage line VDL and a second voltage line VSL.

For example, a first electrode (e.g., a source electrode) of the driving transistor DTR may be connected to the first voltage line VDL, and a second electrode (e.g., a drain electrode) of the driving transistor DTR may be connected to the anode electrode of the light-emitting element LEL.

The cathode electrode of the light-emitting element LEL may be connected to the second voltage line VSL.

The first voltage line VDL may be electrically connected to the first voltage supply line VDSPL.

The second voltage line VSL may be a second voltage supply line VSSPL.

The switching transistor STR may be connected between the data line DL and the gate electrode of the driving transistor DTR. A gate electrode of the switching transistor STR may be connected to the scan line SL. For example, a first electrode (e.g., a source electrode) of the switching transistor STR may be connected to the data line DL, and a second electrode (e.g., a drain electrode) of the switching transistor STR may be connected to the gate electrode of the driving transistor DTR.

The storage capacitor CST may be connected between a first node ND1 and a second node ND2. The first node ND1 may be a contact point between the second electrode of the switching transistor STR and the gate electrode of the driving transistor DTR. The second node ND2 may be a contact point between the second electrode of the driving transistor DTR and the anode electrode of the light-emitting element LEL. For example, the storage capacitor CST may be connected between the gate electrode of the driving transistor DTR and the second electrode of the driving transistor DTR.

In such a pixel driver PXD1, in case that the switching transistor STR is turned on based on the scan signal transmitted through the scan line SL, the data signal of the data line DL may be transmitted to the gate electrode of the driving transistor DTR and the storage capacitor CST, and the driving transistor DTR may be turned on.

The turned-on driving transistor DTR may generate a source-drain current with a magnitude corresponding to a potential difference between the gate electrode and the first electrode, i.e., a voltage difference between the data signal and the first voltage line VDL. The source-drain current of the driving transistor DTR may be supplied as a driving current of the light-emitting element LEL.

Figure 7:
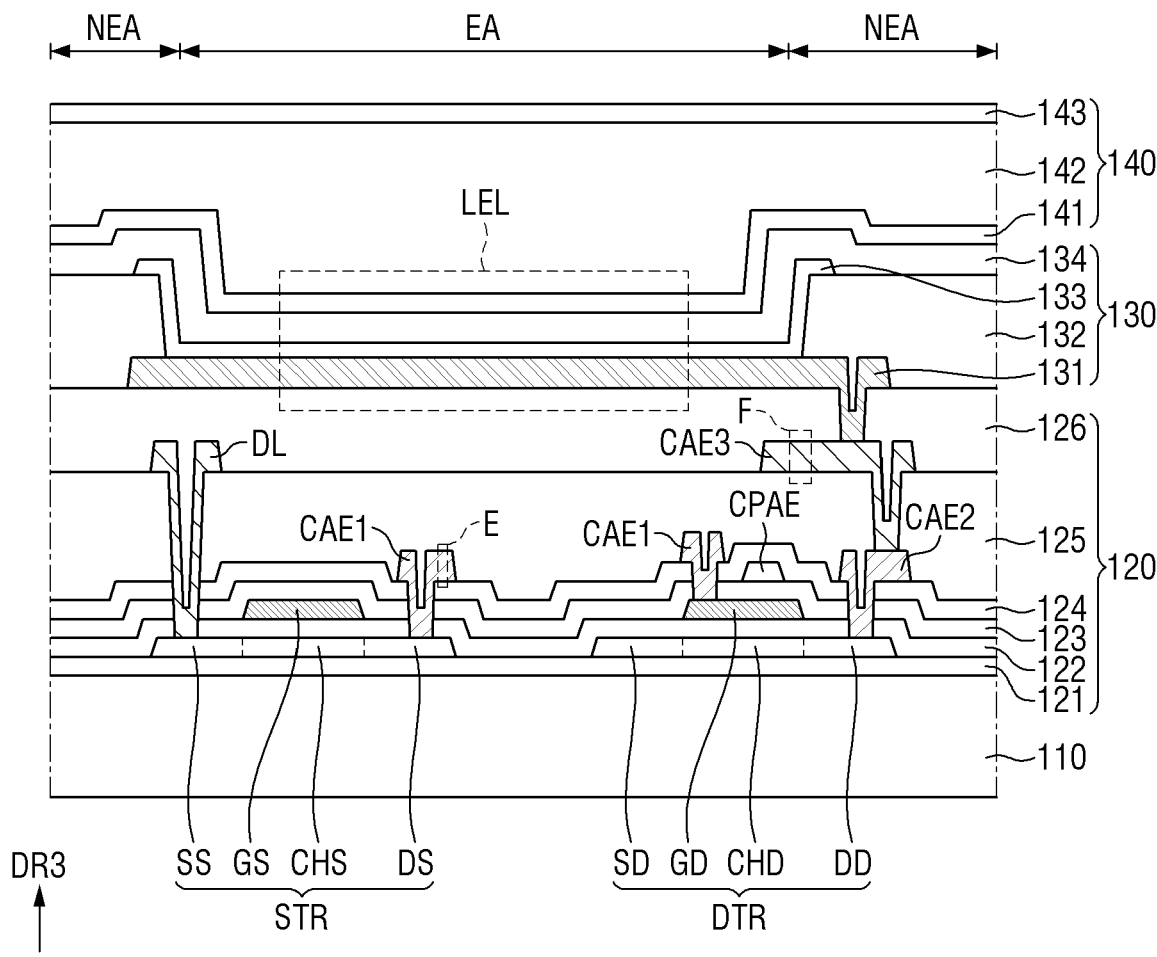
FIG. 7 is a schematic cross-sectional view of the driving transistor, the switching transistor and the light-emitting element of FIG. 6 according to an embodiment of the disclosure.
Figure 8:
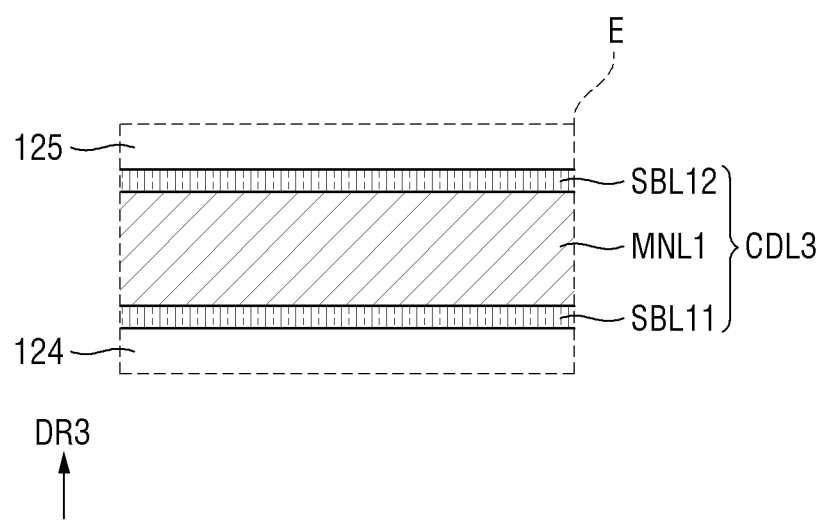
FIG. 8 is an enlarged schematic cross-sectional view showing portion E of FIG. 7.
Figure 9:
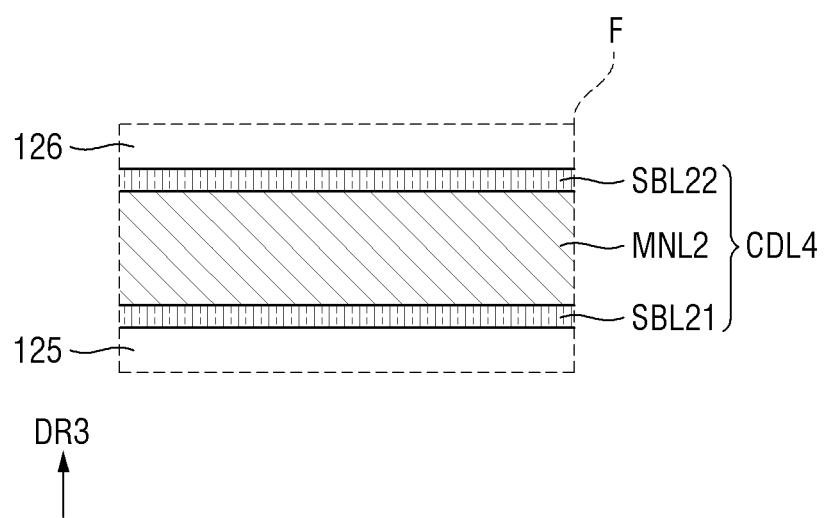
FIG. 9 is an enlarged schematic cross-sectional view showing portion F of FIG. 7.

FIG. 7 is a schematic cross-sectional view of the driving transistor, the switching transistor, and the light-emitting element of FIG. 6 according to an embodiment of the disclosure. FIG. 8 is an enlarged schematic cross-sectional view showing portion E of FIG. 7. FIG. 9 is an enlarged schematic cross-sectional view showing portion F of FIG. 7.

Referring to FIG. 7, the circuit array layer 120 according to the first embodiment may have a structure including the semiconductor layer SEL on the substrate 110, the first conductive layer CDL1 on the first gate insulator 122 that covers the semiconductor layer SEL, the second conductive layer CDL2 on the second gate insulator 123 that covers the first conductive layer CDL1, the third conductive layer CDL3 on the interlayer dielectric layer 124 that covers the second conductive layer CDL2, the fourth conductive layer CDL4 on the first planarization layer 125 that covers the third conductive layer CDL3, and the second planarization layer 126 covering the fourth conductive layer CDL4.

The circuit array layer 120 may further include a buffer layer 121 covering the substrate 110. The buffer layer 121 may be for preventing permeation of oxygen or moisture through the substrate 110. The buffer layer 121 may protect the semiconductor layer SEL of the circuit array layer 120 and the emissive layer 133 of the light-emitting array layer 130 from oxygen or moisture passing through the substrate 110.

The buffer layer 121 may be formed of at least one inorganic film. For example, the buffer layer 121 may be made up of multiple films in which one or more inorganic films such as silicon nitride, silicon oxynitride, silicon oxide, titanium oxide, and aluminum oxide are alternately stacked each other.

The semiconductor layer SEL may be disposed on the buffer layer 121 and may be made of silicon semiconductor such as polycrystalline silicon, monocrystalline silicon, low-temperature polycrystalline silicon, and amorphous silicon.

The semiconductor layer SEL may include a channel region CHD, a first electrode SD and a second electrode DD of the driving transistor DTR, and a channel region CHS, a first electrode SS and a second electrode DS of the switching transistor STR. For example, the semiconductor layer SEL, except for the channel regions CHD and CHS, may be doped with ions or impurities to have conductivity.

The first gate insulator 122 may be disposed on the buffer layer 121, may be made up of an inorganic film, and may cover the semiconductor layer SEL.

For example, the first gate insulator 122 may be made up of an inorganic film such as a silicon nitride layer, a silicon oxynitride layer, a silicon oxide layer, a titanium oxide layer, or an aluminum oxide layer.

The first conductive layer CDL1 may be disposed on the first gate insulator 122.

The first conductive layer CDL1 may include a gate electrode GD of the driving transistor DTR overlapping the channel region CHD of the driving transistor DTR, and a gate electrode GS of the switching transistor STR overlapping the channel region CHS of the switching transistor STR. Although not shown in the drawings, the first conductive layer CDL1 may further include a scan line SL connected to the gate electrode GS of the switching transistor STR.

The first conductive layer CDL1 may be made up of a single layer including at least one of molybdenum (Mo), aluminum (Al), chromium (Cr), gold (Au), titanium (Ti), nickel (Ni), neodymium (Nd), copper (Cu), and an alloy thereof.

The second gate insulator 123 may be disposed on the first gate insulator 122, may be made of an inorganic film, and may cover the first conductive layer CDL1.

For example, the second gate insulator 123 may be made up of an inorganic film such as a silicon nitride layer, a silicon oxynitride layer, a silicon oxide layer, a titanium oxide layer, or an aluminum oxide layer.

The second conductive layer CDL2 may be disposed on the second gate insulator 123.

The second conductive layer CDL2 may include a capacitor auxiliary electrode CPAE overlapping at least a part of the gate electrode GD of the driving transistor DTR.

The second conductive layer CDL2 may be made up of a single layer including at least one of molybdenum (Mo), aluminum (Al), chromium (Cr), gold (Au), titanium (Ti), nickel (Ni), neodymium (Nd), copper (Cu), and an alloy thereof.

The interlayer dielectric layer 124 may be disposed on the second gate insulator 123, may be made of an inorganic film, and may cover the second conductive layer CDL2.

For example, the interlayer dielectric layer 124 may be made of an inorganic film such as a silicon nitride layer, a silicon oxynitride layer, a silicon oxide layer, a titanium oxide layer, or an aluminum oxide layer.

The third conductive layer CDL3 may be disposed on the interlayer dielectric layer 124.

The third conductive layer CDL3 may include a first connection auxiliary electrode CAE1 for connecting the gate electrode GD of the driving transistor DTR and the second electrode DS of the switching transistor STR, and a second connection auxiliary electrode CAE2 connected to the second electrode DD of the driving transistor DTR.

Referring to FIG. 8, the third conductive layer CDL3 may have a multi-layer structure having low resistance characteristics including a first main layer MNL1, and a first sub-layer SBL11 and a second sub-layer SBL12 disposed on each surface of the first main layer MNL1, respectively.

The first main layer MNL1 may be made of a low resistance metal including at least one of aluminum (Al), chromium (Cr), gold (Au), nickel (Ni), neodymium (Nd), and copper (Cu).

The first sub-layer SBL11 and the second sub-layer SBL12 may block diffusion of the metal of the first main layer MNL1 in the form of ions. Each of the first sub-layer SBL11 and the second sub-layer SBL12 may be made of titanium (Ti).

For example, the third conductive layer CDL3 may have a stack structure (Ti/Al/Ti) of titanium (Ti)/aluminum (Al)/titanium (Ti). Due to the stack structure, the third conductive layer CDL3 may have a relatively low resistance compared to the resistance of the first conductive layer CDL1 and the second conductive layer CDL2.

As shown in FIG. 7, the first planarization layer 125 may be disposed on the interlayer dielectric layer 124, may cover the third conductive layer CDL3, and may have a flat upper surface.

For example, the first planarization layer 125 may be formed of an organic film including a material such as an acryl resin, an epoxy resin, a phenolic resin, a polyamide resin, and a polyimide resin.

The fourth conductive layer CDL4 may be disposed on the first planarization layer 125.

The fourth conductive layer CDL4 may include a data line DL and a third connection auxiliary electrode CAE3 connected to the second connection auxiliary electrode CAE2.

Referring to FIG. 9, the fourth conductive layer CDL4 may have a multi-layer structure having low resistance characteristics including a second main layer MNL2, and a third sub-layer SBL21 and a fourth sub-layer SBL22 disposed on each surface of the second main layer MNL2, respectively.

The second main layer MNL2 may be made of a low resistance metal including at least one of aluminum (Al), chromium (Cr), gold (Au), nickel (Ni), neodymium (Nd), and copper (Cu).

The third sub-layer SBL21 and the fourth sub-layer SBL22 may block diffusion of the metal of the second main layer MNL2 in the form of ions. Each of the third sub-layer SBL21 and the fourth sub-layer SBL22 may be made of titanium (Ti).

For example, the fourth conductive layer CDL4 may have a stack structure (Ti/Al/Ti) of titanium (Ti)/aluminum (Al)/titanium (Ti). Due to the stack structure, the fourth conductive layer CDL4 may have a relatively low resistance compared to the resistance of the first conductive layer CDL1 and the second conductive layer CDL2.

As shown in FIG. 7, the second planarization layer 126 may be disposed on the first planarization layer 125, may cover the fourth conductive layer CDL4, and may have a flat upper surface.

For example, the second planarization layer 126 may be formed of an organic film including a material such as an acryl resin, an epoxy resin, a phenolic resin, a polyamide resin, and a polyimide resin.

The driving transistor DTR may include a channel region CHD, a first electrode SD and a second electrode DD in contact with each end of the channel region CHD, and a gate electrode GD overlapping the channel region CHD in a plan view. The channel region CHD, the first electrode SD, and the second electrode DD of the driving transistor DTR may be formed of the semiconductor layer SEL, and the gate electrode GD of the driving transistor DTR may be formed of the first conductive layer CDL1.

Likewise, the switching transistor STR may include a channel region CHS, a first electrode SS and a second electrode DS in contact with each end of the channel region CHS, and the gate electrode GS overlapping the channel region CHS in a plan view. The channel region CHS, the first electrode SS, and the second electrode DS of the switching transistor STR may be formed of the semiconductor layer SEL, and the gate electrode GS of the switching transistor STR may be formed of the first conductive layer CDL1.

The storage capacitor CST may include the capacitor auxiliary electrode CPAE formed of the second conductive layer CDL2, and the gate electrode GD of the driving transistor DTR overlapping the capacitor auxiliary electrode CPAE in a plan view.

The gate electrode GD of the driving transistor DTR may be electrically connected to the second electrode DS of the switching transistor STR through the first connection auxiliary electrode CAE1 formed of the third conductive layer CDL3.

The first connection auxiliary electrode CAE1 may be in contact with the gate electrode GD of the driving transistor DTR through a contact hole penetrating the interlayer dielectric layer 124 and the second gate insulator 123, and may be in contact with the second electrode DS of the switching transistor STR through a contact hole penetrating the interlayer dielectric layer 124, the second gate insulator 123, and the first gate insulator 122.

The second connection auxiliary electrode CAE2 may be in contact with the second electrode DD of the driving transistor DTR through a contact hole penetrating the interlayer dielectric layer 124, the second gate insulator 123, and the first gate insulator 122.

The third connection auxiliary electrode CAE3 may be in contact with the second connection auxiliary electrode CAE2 through a contact hole penetrating the first planarization layer 125.

The data line DL may be in contact with the first electrode SS of the switching transistor STR through a contact hole penetrating the first planarization layer 125, the interlayer dielectric layer 124, the second gate insulator 123, and the first gate insulator 122.

The light-emitting array layer 130 may be disposed on the second planarization layer 126 of the circuit array layer 120.

The light-emitting array layer 130 may include an anode electrode 131 disposed on the second planarization layer 126 in the emission areas EA, a pixel-defining layer 132 disposed on the second planarization layer 126 in a non-emission area NEA, which is the space between the emission areas EA, an emissive layer 133 disposed on the anode electrode 131 in the emission areas EA, and a cathode electrode 134 disposed on the pixel-defining layer 132 and the emissive layer 133 in the emission areas EA.

Accordingly, each of the light-emitting elements LEL associated with the emission areas EA may have a structure in which the emissive layer 133 is interposed between the anode electrode 131 and the cathode electrode 134 facing each other.

The encapsulation structure layer 140 may cover the light-emitting array layer 130 and may have a structure in which at least one inorganic film and at least one organic film are alternately stacked each other.

For example, the encapsulation structure layer 140 may include a first encapsulation layer 141 covering the cathode electrode 134, in contact with the interlayer dielectric layer 124 in the non-display area NDA, and made of an inorganic insulating material, a second encapsulation layer 142 disposed on the first encapsulation layer 141 in the display area DA and made of an organic insulating material, and a third encapsulation layer 143 covering the second encapsulation layer 142, in contact with the first encapsulation layer 141 in the non-display area NDA, and made of an inorganic insulating material.

Figure 10:
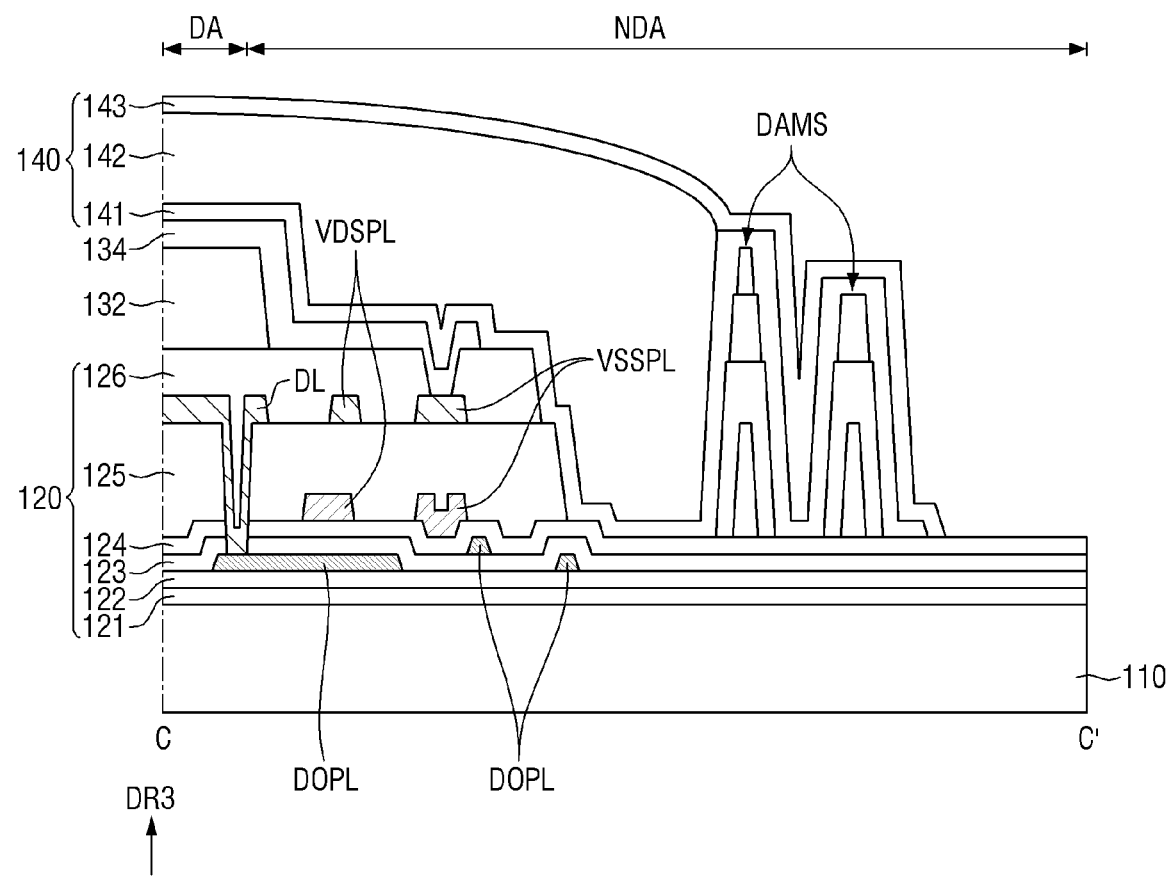
FIG. 10 is a schematic cross-sectional view taken along line C-C' of FIG. 5 according to an embodiment of the disclosure.

FIG. 10 is a schematic cross-sectional view taken along line C-C' of FIG. 5 according to an embodiment of the disclosure.

Referring to FIG. 10, the data output lines DOPL may be disposed in the non-display area NDA and electrically connected to the data lines DL, respectively. The data output lines DOPL may be included in the first conductive layer CDL1 or the second conductive layer CDL2.

One of the data lines DL may be in contact with the data output line DOPL formed of the first conductive layer CDL1 through a contact hole penetrating the first planarization layer 125, the interlayer dielectric layer 124, and the second gate insulator 123.

In another embodiment, although not shown in the drawings, another one of the data lines DL may be in contact with the data output line DOPL formed of the second conductive layer CDL2 through a contact hole penetrating the first planarization layer 125 and the interlayer dielectric layer 124.

Each of the first voltage supply line VDSPL and the second voltage supply line VSSPL disposed in the non-display area NDA may be formed of the third conductive layer CDL3 or the fourth conductive layer CDL4.

The cathode electrode 134 of the light-emitting array layer 130 may extend to the non-display area NDA and may be electrically connected to the second voltage supply line VSSPL through a contact hole penetrating at least the second planarization layer 126.

The display device 10 may further include a dam structure DAMS disposed in the non-display area NDA surrounding the display area DA.

The dam structure DAMS may have a stacked structure of organic layers, which are the same layers as two or more of the first planarization layer 125, the second planarization layer 126, and the pixel-defining layer 132, respectively.

Although not shown in the drawings, the display device 10 may further include a spacer (not shown) disposed on a part of the pixel-defining layer 132 and made of an organic film. At least one dam structure DAMS may include an organic layer that is the same layer as the spacer. The spacer may separate a fine metal mask for disposing the emissive layer 133 from the anode electrode 131 and the pixel-defining layer 132.

The first encapsulation layer 141 of the encapsulation structure layer 140 may extend to the non-display area NDA and cover the dam structure DAMS. The first encapsulation layer 141 may be in contact with the interlayer dielectric layer 124 adjacent to the dam structure DAMS.

The second encapsulation layer 142 of the encapsulation structure layer 140 may be surrounded by the dam structure DAMS.

The third encapsulation layer 143 may cover the second encapsulation layer 142 and may be in contact with the first encapsulation layer 141. The encapsulation structure may be formed by bonding inorganic materials.

Figure 11:
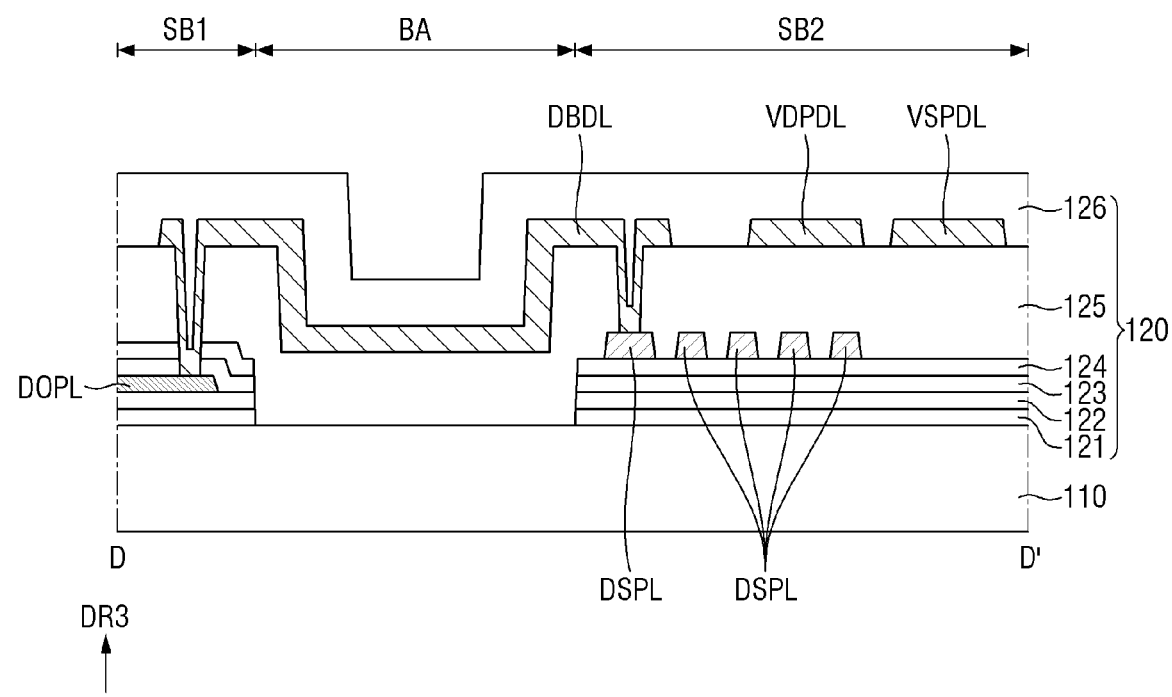
FIG. 11 is a schematic cross-sectional view taken along line D-D' of FIG. 5 according to an embodiment of the disclosure.

FIG. 11 is a schematic cross-sectional view taken along line D-D' of FIG. 5 according to an embodiment of the disclosure.

As shown in FIG. 11, according to the first embodiment, the data supply lines DSPL may be disposed in the second subsidiary area SB2 and electrically connected to the output terminals of the display driver circuit 200, respectively. The data supply lines DSPL may be formed of the third conductive layer CDL3 on the interlayer dielectric layer 124.

The data output line DOPL disposed in the non-display area NDA, connected to the data line DL, and extended to the first subsidiary area SB1 may be formed of the first conductive layer CDL1 on the first gate insulator 122 or the second conductive layer CDL2 on the second gate insulator 123.

Since the bending area BA is bendable, the inorganic films that receive a relatively large bending stress, i.e., the buffer layer 121, the first gate insulator 122, the second gate insulator 123, and the interlayer dielectric layer 124 may be removed from the bending area BA.

The data bending line DBDL disposed in the bending area BA and connecting the data supply line DSPL and the data output line DOPL may be formed of the fourth conductive layer CDL4 on the first planarization layer 125. It should be understood, however, that the disclosure is not limited thereto. The data bending line DBDL may be formed of another conductive layer (not shown) disposed on the first planarization layer 125.

The first voltage pad line VDPDL and the second voltage pad line VSPDL disposed in the second subsidiary area SB2 may intersect the data output lines DOPL.

Accordingly, in order to prevent a short-circuit that may occur between the first and second voltage pad lines VDPDL and VSPDL and the data output lines DOPL, the first voltage pad line VDPDL and the second voltage pad line VSPDL may be formed of the fourth conductive layer CDL4 on the first planarization layer 125.

As described above, according to the first embodiment, the data supply lines DSPL in the second subsidiary area SB2 may be electrically connected to the output terminals of the display driver circuit 200, respectively. The data supply lines DSPL may be formed of the third conductive layer CDL3 on the interlayer dielectric layer 124, unlike the data output lines DOPL in the non-display area NDA, which are connected to the data lines DL and formed of the first conductive layer CDL1 or the second conductive layer CDL2.

The first conductive layer CDL1 and the second conductive layer CDL2 may be made up of a single layer including at least one of molybdenum (Mo), aluminum (Al), chromium (Cr), gold (Au), titanium (Ti), nickel (Ni), neodymium (Nd), copper (Cu), and an alloy thereof. On the other hand, the third conductive layer CDL3 may be made up of multiple layers including the first main layer MNL1 made of a low-resistance metal including at least one of aluminum (Al), chromium (Cr), gold (Au), nickel (Ni), neodymium (Nd), and copper (Cu), and the first sub-layer SBL11 and the second sub-layer SBL12 on each side thereof. Therefore, the third conductive layer CDL3 may have a lower resistance than the first conductive layer CDL1 and the second conductive layer CDL2.

The data output lines DOPL may be disposed in the non-display area NDA together with the lines for transmitting voltage or signal connected to the lines in the display area DA and the lines for transmitting voltage or signal extended to the scan driver circuit area SCDA. Accordingly, the data output lines DOPL may be formed of the first conductive layer CDL1 or the second conductive layer CDL2.

In the second subsidiary area SB2, only the lines connected to the signal pads SPD and the display driver circuit 200 for transmitting voltage or signal may be disposed. Therefore, even though the data supply lines DSPL in the second subsidiary area SB2 are formed of the third conductive layer CDL3 having a relatively low resistance, rather than the first conductive layer CDL1 or the second conductive layer CDL2, defects such as short circuits may be not likely to occur.

As a result, the resistance of the signal transmission paths between the display driver circuit 200 and the data lines DL may be lowered without increasing the possibility of defects such as short-circuit. Accordingly, the time taken for a data signal output from the display driver circuit to be applied to a data line may be reduced.

As a result, it is possible to prevent a shortage of time for writing the data signal into each pixel, and it is possible to ensure a sufficient time required for compensating for the difference between the pixels. Therefore, it may be advantageous to improve the image quality of the display device 10.

Figure 12:
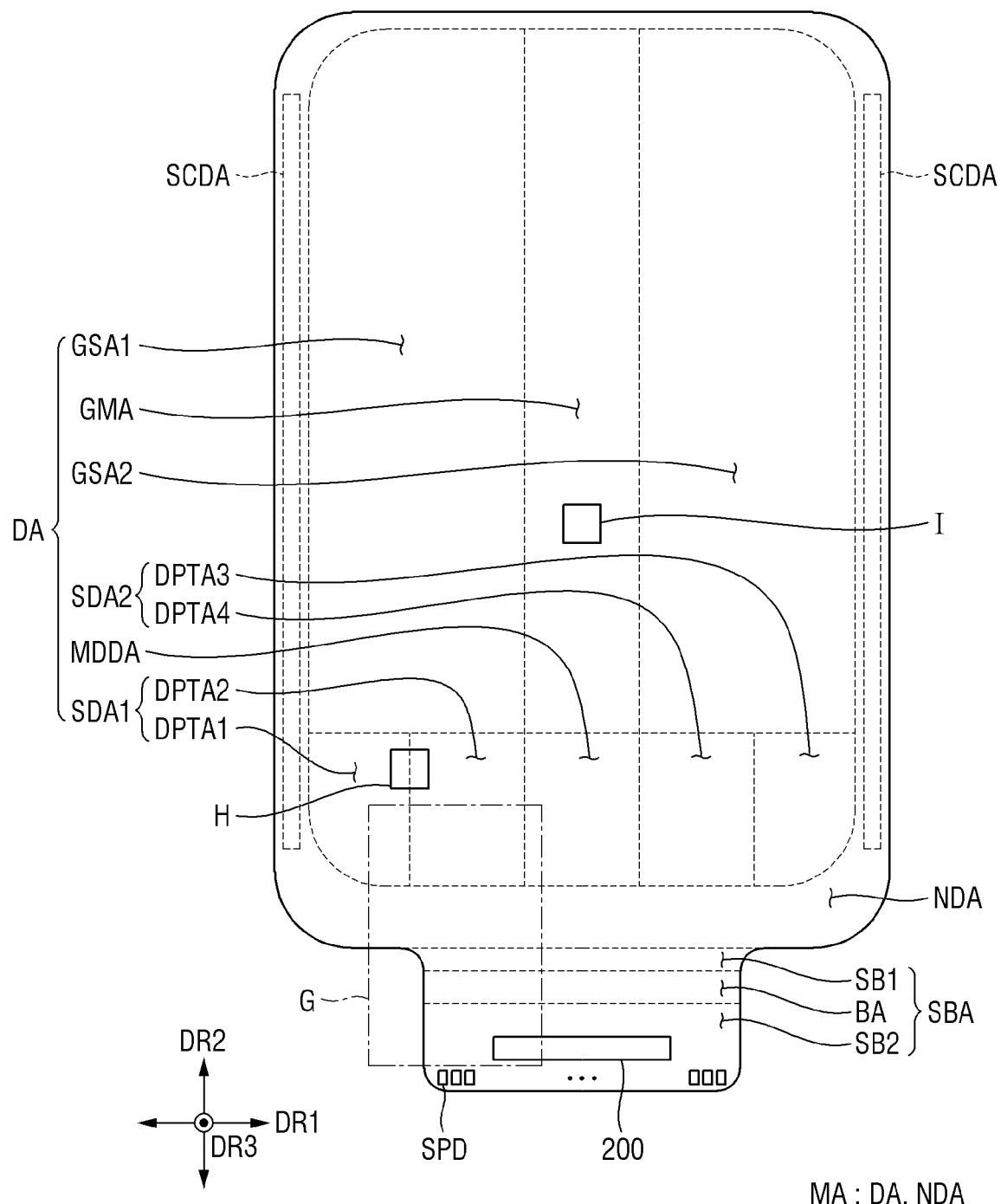
FIG. 12 is a plan view showing a display device according to a second embodiment.
Figure 13:
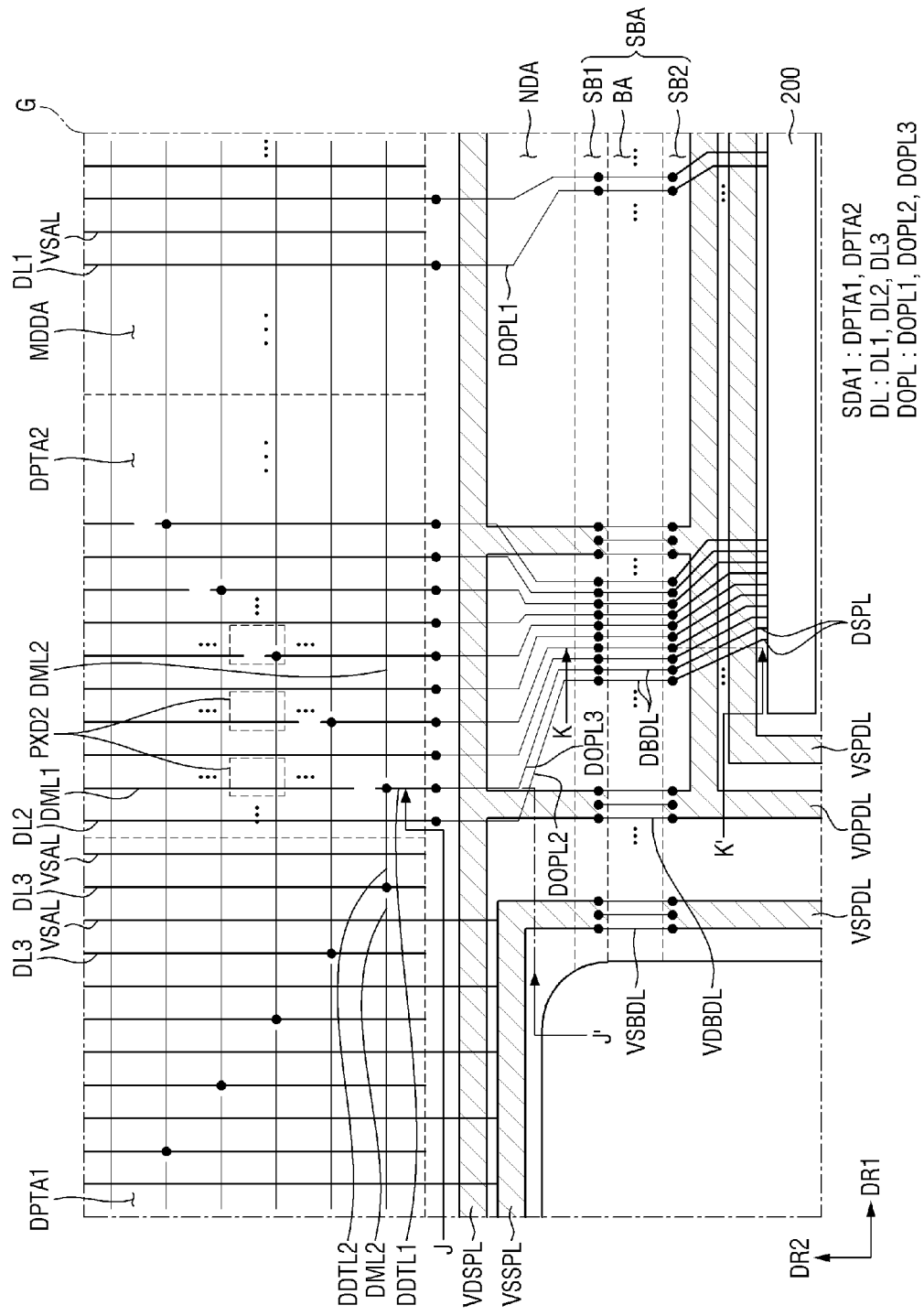
FIG. 13 is a layout view showing portion G of FIG. 12.

FIG. 12 is a plan view showing a display device according to a second embodiment. FIG. 13 is a layout view showing portion G of FIG. 12.

Referring to FIG. 12, the display area DA according to the second embodiment may include a middle area MDDA adjacent to the subsidiary area SBA, and a first side area SDA1 disposed between the middle area MDDA and the non-display area NDA in the first direction DR1.

The display area DA may further include a second side area SDA2 disposed symmetrical to the first side area SDA1 with respect to the middle area MDDA. For example, the first side area SDA1 and the second side area SDA2 may be disposed each side of the middle area MDDA in the first direction in the non-display area NDA.

The middle area MDDA may be disposed adjacent to the center of the subsidiary area SBA in the second direction DR2.

The first side area SDA1 may include a first display divided area DPTA1 disposed adjacent to the non-display area NDA on a side in the first direction DR1, and a second display divided area DPTA2 disposed between the first display divided area DPTA1 and the middle area MDDA.

The second side area SDA2 may include a third display divided area DPTA3 disposed adjacent to the non-display area NDA on an opposite side in the first direction DR1, and a fourth display divided area DPTA4 disposed between the third display divided area DPTA3 and the middle area MDDA.

The display area DA may further include a general middle area GMA disposed adjacent to the middle area MDDA in the second direction DR2, a first general side area GSA1 disposed adjacent to the first side area SDA1 in the second direction DR2, and a second general side area GSA2 disposed adjacent to the second side area SDA2 in the second direction DR2.

The non-display area NDA and the subsidiary area SBA according to the second embodiment may be substantially identical to those of the first embodiment shown in FIG. 4, and, therefore, the redundant descriptions will be omitted.

FIG. 13 shows the first side area SDA1 and the middle area MDDA and does not show the second side area SDA2. The second side area SDA2 may be symmetrical to the first side area SDA1 with respect to the middle area MDDA; and, therefore, the redundant descriptions will be omitted.

The first voltage supply line VDSPL, the second voltage supply line VSSPL, and the data output lines DOPL disposed in the non-display area NDA and the first subsidiary area SB1, the first voltage bending line VDBDL, the second voltage bending line VSBDL, and the data bending lines DBDL disposed in the bending area BA, and the first voltage pad line VDPDL and the second voltage pad line VDPDL, the display driver circuit 200, and the data supply lines DSPL disposed in the second subsidiary area SB2 according to the second embodiment are substantially identical to those of the first embodiment of FIG. 5; and, therefore, the redundant descriptions will be omitted.

Referring to FIG. 13, the data lines DL of the circuit array layer 120 according to the second embodiment may extend in the second direction DR2.

According to the second embodiment, the data lines DL may include a first data line DL1 disposed in the middle area MDDA and electrically connected to a first data output line DOPL1 among the data output lines DOPL, a second data line DL2 disposed in the second display divided area DPTA2 of the first side area SDA1 and electrically connected to a second data output line DOPL2 among the data output lines DOPL, and a third data line DL3 disposed in the first display divided area DPTA1 of the first side area SDA1.

According to the second embodiment, the circuit array layer 120 may include a first data detour line DDTL1 disposed in the second display divided area DPTA2 of the first side area SDA1 adjacent to the second data line DL2, electrically connected to the third data output line DOPL3, and extending in the second direction DR2, and a second data detour line DDTL2 disposed in the first side area SDA1, electrically connecting the first data detour line DDTL1 and the third data line DL3, and extending in the first direction DR1.

For example, according to the second embodiment, the third data line DL3 disposed in the first display divided area DPTA1 of the first side area SDA1 adjacent to the non-display area NDA may be connected to the third data output line DOPL3 through the first data detour line DDTL1 and the second data detour line DDTL2 disposed in the display area DA, rather than being directly connected to the third data output line DOPL3.

As the first data detour line DDTL1 is disposed in the second display divided area DPTA2 and is adjacent to the second data line DL2, the third data output line DOPL3 connected to the first data detour line DDTL1 may be disposed adjacent to the second data output line DOPL2 connected to the second data line DL2.

In other words, a part of the non-display area NDA adjacent to the first display divided area DPTA1 may include a part that is bent along the corner of the substrate 110. The third data output line DOPL3 may not be disposed in a part of the non-display area NDA that is adjacent to the first display divided area DPTA1 and may be disposed adjacent to the second data output line DOPL2.

Accordingly, the width of the bent part of the non-display area NDA may be reduced without reducing the number of data lines DL. In other words, the width of the non-display area NDA may be reduced without affecting the resolution.

According to the second embodiment, the circuit array layer 120 may further include a second voltage auxiliary line VSAL disposed in the display area DA, electrically connected to the second voltage supply line VSSPL, and extended in the second direction DR2, and a first dummy line DML1 spaced apart from and colinear with the first data detour line DDTL1 and extended in the second direction DR2.

The second voltage auxiliary line VSAL may be disposed in the middle area MDDA and the first display divided area DPTA1 of the first side area SDA1.

The second voltage auxiliary line VSAL may be disposed adjacent to the first data line DL1 in the middle area MDDA and may be disposed adjacent to the third data line DL3 in the first display divided area DPTA1.

The first dummy line DML1 may be disposed in the second display divided area DPTA2 together with the first data detour line DDTL1 and may be disposed adjacent to the second data line DL2.

The circuit array layer 120 according to the second embodiment may further include second dummy lines DML2 spaced apart from and colinear with the second data detour line DDTL2 and extended in the first direction DR1.

The second dummy lines DML2 may be disposed in the first side area SDA1 and the second side area SDA2 together with the second data detour line DDTL2.

Figure 14:
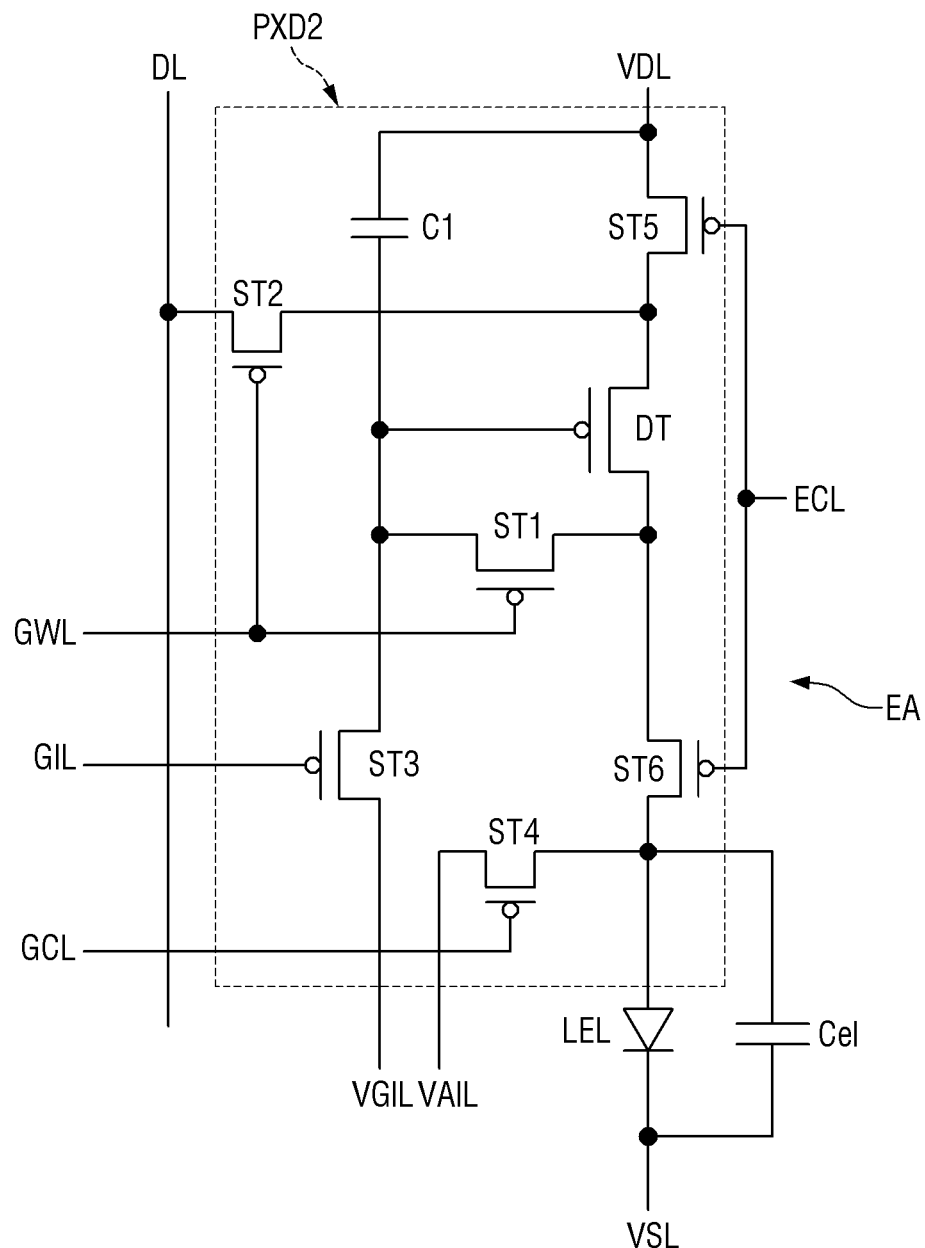
FIG. 14 is a schematic diagram of an equivalent circuit of the pixel driver of FIG. 13 according to an embodiment of the disclosure.

FIG. 14 is a schematic diagram of an equivalent circuit of the pixel driver of FIG. 13 according to an embodiment of the disclosure.

The circuit array layer 120 may include multiple pixel drivers PXD2 associated with multiple emission areas EA, respectively. The pixel drivers PXD2 may respectively supply driving currents to multiple light-emitting elements LEL disposed in the light-emitting array layer 130. Each of the pixel drivers PXD2 may include a driving transistor DT, at least one switch element, and at least one capacitor.

Referring to FIG. 14, the pixel driver PXD2 according to the second embodiment may include a driving transistor DT, switch elements including a first transistor ST1 (switch transistor), a second transistor ST2, a third transistor ST3, a fourth transistor ST4, a fifth transistor ST5, and a sixth transistor ST6, and a capacitor C1.

The scan lines of the circuit array layer 120 connected to the scan driver circuit of the scan driver circuit area SCDA may include a write scan line GWL connected to a gate electrode of each of the first transistor ST1 and the second transistor ST2, an initialization scan line GIL connected to a gate electrode of the third transistor ST3, a control scan line GCL connected to a gate electrode of the fourth transistor ST4, and an emission control line ECL connected to a gate electrode of each of the fifth transistor ST5 and the sixth transistor ST6.

The driving transistor DT may be connected in series with the light-emitting element LEL between a first voltage line VDL and a second voltage line VSL.

A first electrode of the driving transistor DT may be connected to the first voltage line VDL through the fifth transistor ST5.

The first electrode of the driving transistor DT may be connected to the data line DL through the second transistor ST2.

The second electrode of the driving transistor DT may be connected to the light-emitting element LEL through the sixth transistor ST6.

The capacitor C1 may be connected between the first voltage line VDL and the gate electrode of the driving transistor DT.

Accordingly, in case that the data signal of the data line DL is applied to the first electrode of the driving transistor DT, the driving transistor DT may generate a drain-source current corresponding to the data signal, and the drain-source current of the driving transistor DT may be supplied as a driving current of the light-emitting element LEL.

The light-emitting element LEL may emit light having a luminance corresponding to the driving current of the driving transistor DT.

The light-emitting element LEL may include an anode electrode 131 (see FIG. 17) and a cathode electrode 134 (see FIG. 17) facing each other, and an emissive layer 133 (see FIG. 17) between the anode electrode 131 and the cathode electrode 134.

For example, the light-emitting element LEL may be an organic light-emitting diode having an emissive layer made of an organic light emitting material. For example, the light-emitting element LEL may be an inorganic light-emitting element including an emissive layer made of an inorganic semiconductor. For example, the light-emitting element LEL may be a quantum-dot light-emitting element having a quantum-dot emissive layer. For example, the light-emitting element LEL may be a micro light-emitting diode.

A capacitor Cel connected in parallel with the light-emitting element LEL may be a parasitic capacitance between the anode electrode and the cathode electrode.

The first transistor ST1 may be connected between the gate electrode of the driving transistor DT and the second electrode of the driving transistor DT.

The second transistor ST2 may be connected between the first electrode of the driving transistor DT and the data line DL.

The gate electrode of each of the first transistor ST1 and the second transistor ST2 may be connected to the write scan line GWL.

In case that a write scan signal is supplied through the write scan line GWL, the first transistor ST1 and the second transistor ST2 may be turned on, and the gate electrode and the second electrode of the driving transistor DT may be at the same potential through the turned-on first transistor ST1. The data signal of the data line DL may be supplied to the first electrode of the driving transistor DT through the turned-on second transistor ST2.

A drain-source current may be generated between the first electrode and the second electrode of the driving transistor DT.

The third transistor ST3 may be connected between the gate electrode of the driving transistor DT and a gate initialization voltage line VGIL. The gate electrode of the third transistor ST3 may be connected to the initialization scan line GIL.

In case that the initialization scan signal is supplied through the initialization scan line GIL, the third transistor ST3 may be turned on. The gate electrode of the driving transistor DT may be connected to the gate initialization voltage line VGIL through the turned-on third transistor ST3, so that the potential of the gate electrode of the driving transistor DT may be initialized to a first initialization voltage of the gate initialization voltage line VGIL.

The fourth transistor ST4 may be connected between the anode electrode of the light-emitting element LEL and an anode initialization voltage line VAIL. The gate electrode of the fourth transistor ST4 may be connected to the control scan line GCL.

In case that a control scan signal is supplied through the control scan line GCL, the fourth transistor ST4 may be turned on. The anode electrode of the light-emitting element LEL may be connected to the anode initialization voltage line VAIL through the turned-on fourth transistor ST4, so that the potential of the anode electrode of the light-emitting element LEL is initialized to a second initialization voltage of the anode initialization voltage line VAIL.

The fifth transistor ST5 may be connected between the first electrode of the driving transistor DT and the first voltage line VDL.

The sixth transistor ST6 may be connected between the second electrode of the driving transistor DT and the anode electrode of the light-emitting element LEL.

The gate electrode of each of the fifth transistor ST5 and the sixth transistor ST6 may be connected to the emission control line ECL.

In case that an emission control signal is supplied through the emission control line ECL, the driving transistor DT and the light-emitting element LEL may be connected in series between the first voltage line VDL and the second voltage line VSL, so that the light-emitting element LEL may emit light based on a driving current by the driving transistor DT.

As shown in FIG. 14, the driving transistor DT and the one or more switch elements ST1 to ST6 included in the pixel driver PXD2 may all be implemented as p-type MOSFETs.

All of the scan lines GWL, GIL, GCL and ECL connected to the gate electrodes of the switch elements ST1 to ST6 may supply low-level turn-on signals.

In another embodiment, unlike that shown in FIG. 14, some of the driving transistor DT and the switch elements ST1 to ST6 included in the pixel driver PXD2 may be implemented as p-type MOSFETs, and others may be implemented as n-type MOSFETs. The switching elements implemented as the p-type MOSFETs and the switching elements implemented as the n-type MOSFETs may include active layers of different semiconductor materials. Therefore, the width of the pixel driver PXD2 may be reduced by virtue of the stacked structure, thereby advantageously improving the resolution.

For example, although not shown in the drawings, each of the driving transistor DT, the second transistor ST2, the fourth transistor ST4, the fifth transistor ST5, and the sixth transistor ST6 of the pixel driver PXD2 may be implemented as a p-type MOSFET including an active layer of a polysilicon semiconductor material, and the first transistor ST1 and the third transistor ST3 may be implemented as an n-type MOSFET including an active layer of an oxide semiconductor material. The gate electrode of the first transistor ST1 may be connected to a separate scan line (not shown) instead of the write scan line GWL.

Figure 15:
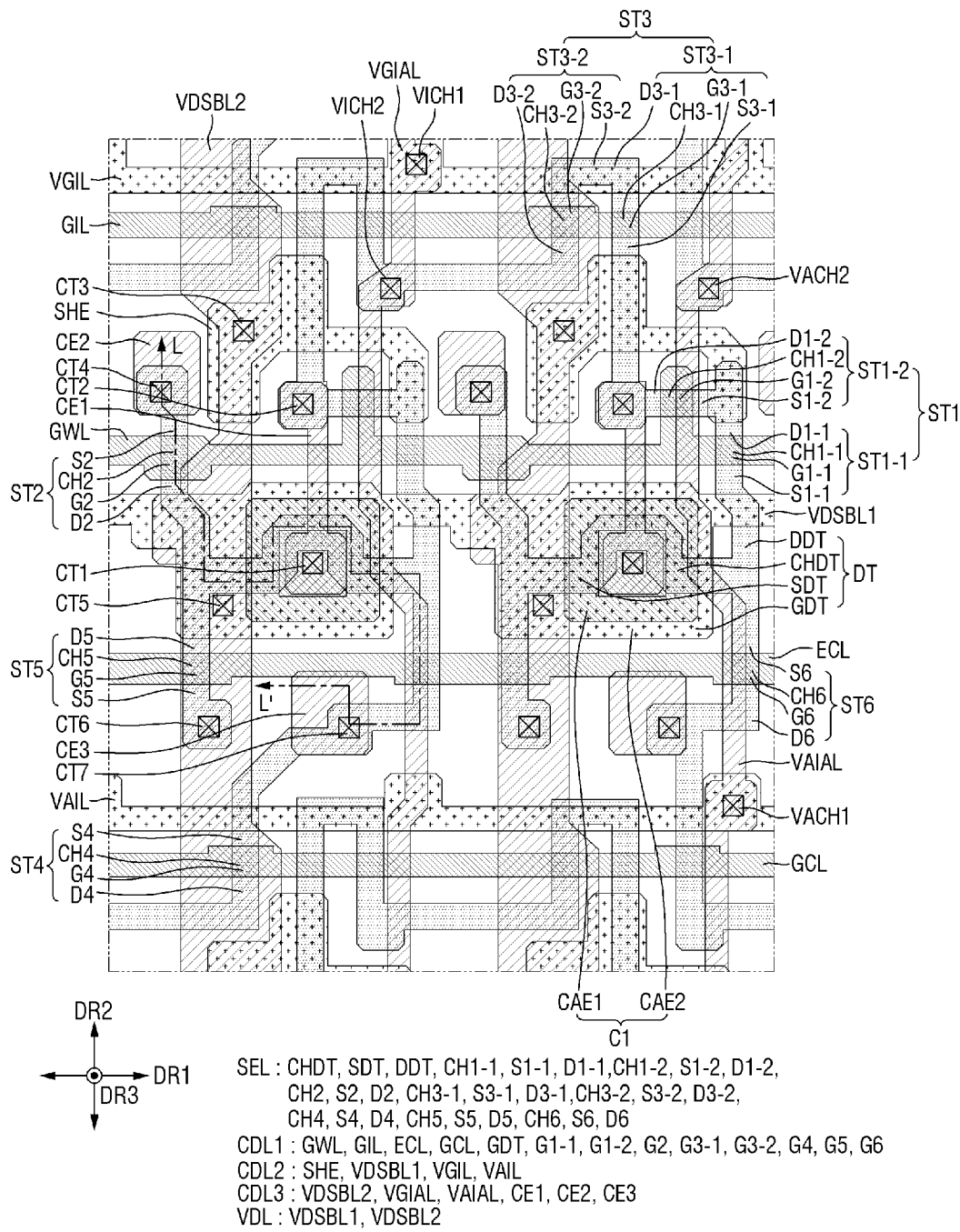
FIG. 15 is a plan view showing a semiconductor layer, a first conductive layer, a second conductive layer, and a third conductive layer of two adjacent pixel drivers of FIG. 14 according to an embodiment of the disclosure.
Figure 16:
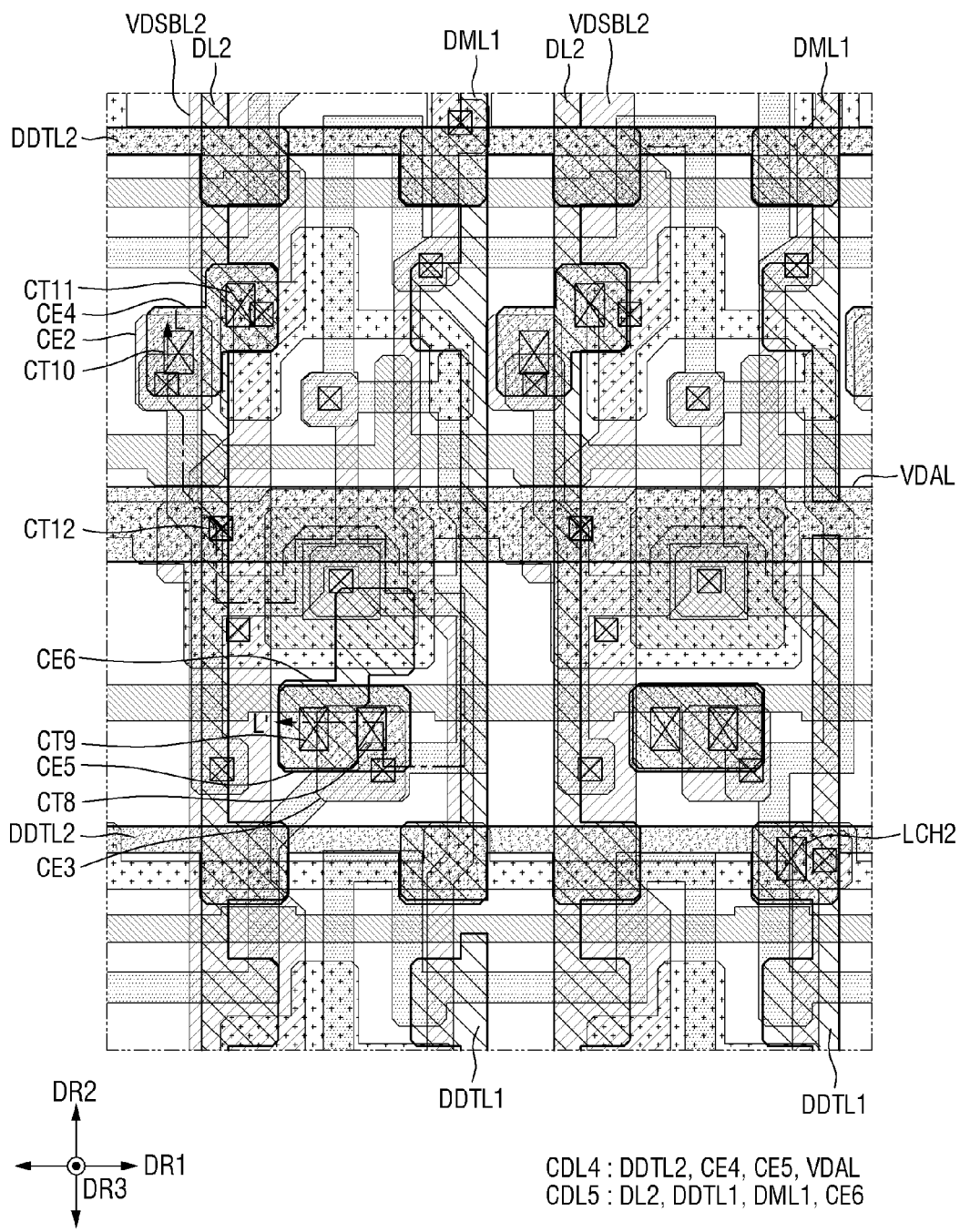
FIG. 16 is a plan view showing two adjacent pixel drivers of FIG. 14 according to an embodiment of the disclosure.

FIG. 15 is a plan view showing a semiconductor layer, a first conductive layer, a second conductive layer, and a third conductive layer of two adjacent pixel drivers of FIG. 14 according to an embodiment of the disclosure. FIG. 16 is a plan view showing two adjacent pixel drivers of FIG. 14 according to an embodiment of the disclosure. FIG. 17 is a schematic cross-sectional view taken along line L-L' of FIGS. 15 and 16 according to an embodiment of the disclosure.

FIGS. 15 and 16 show two pixel drivers PXD2 disposed in the second display divided area DPTA2 or the fourth display divided area DPTA4 and associated with two adjacent emission areas in the first direction DR1.

Figure 17:
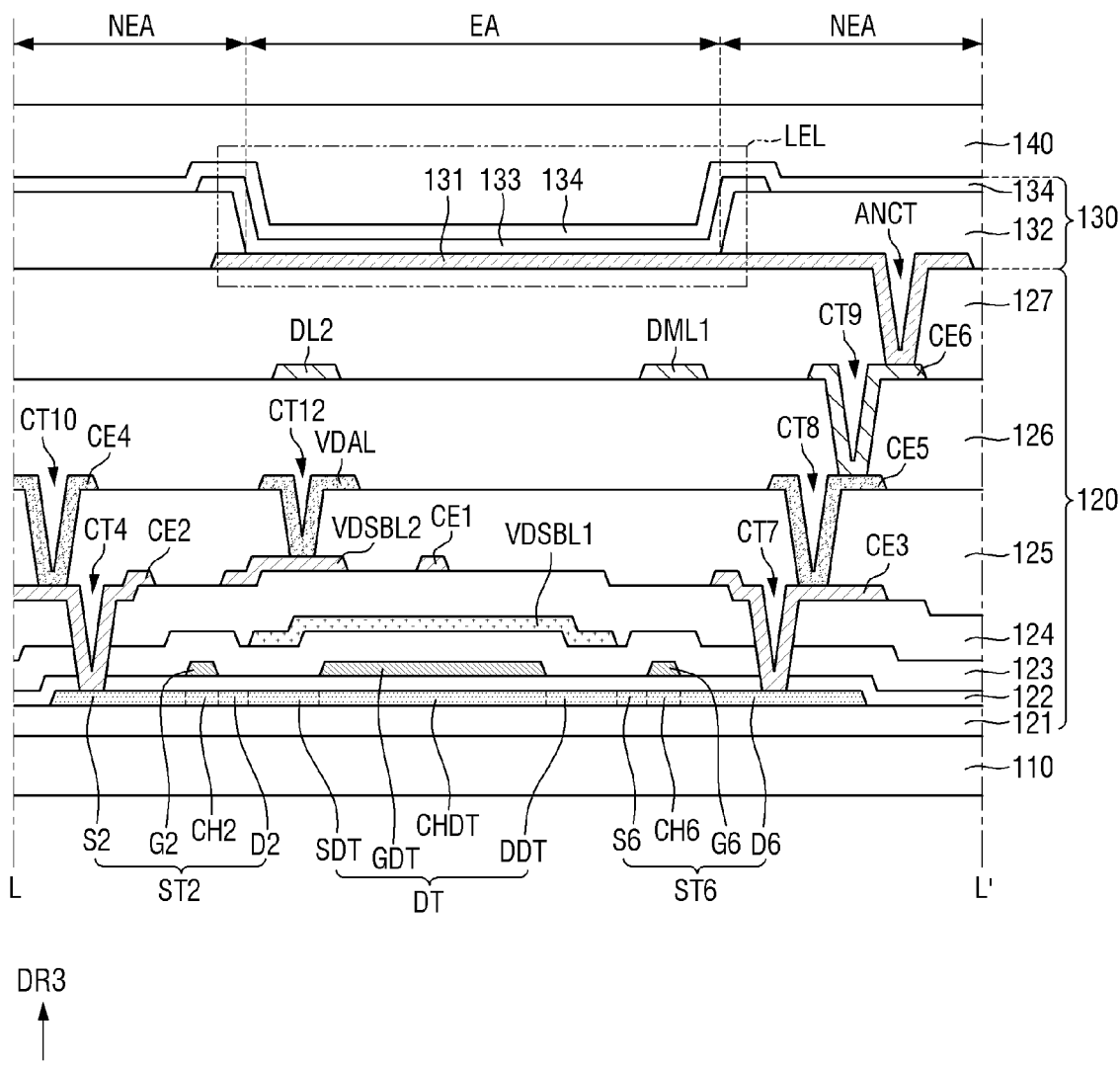
FIG. 17 is a schematic cross-sectional view taken along line L-L' of FIGS. 15 and 16 according to an embodiment of the disclosure.

Referring to FIG. 17, the circuit array layer 120 of the display device 10 may have a structure that includes the semiconductor layer SEL on the substrate 110, the first conductive layer CDL1 on the first gate insulator 122 that covers the semiconductor layer SEL, the second conductive layer CDL2 on the second gate insulator 123 that covers the first conductive layer CDL1, the third conductive layer CDL3 on the interlayer dielectric layer 124 that covers the second conductive layer CDL2, the fourth conductive layer CDL4 on the first planarization layer 125 that covers the third conductive layer CDL3, the fifth conductive layer CDL5 on the second planarization layer 126 that covers the fourth conductive layer CDL4, and the third planarization layer 127 covering the fifth conductive layer CDL5. For example, the circuit array layer 120 according to the second embodiment may have a structure that further includes the fifth conductive layer CDL5 and the third planarization layer 127 compared to the circuit array layer 120 of the first embodiment shown in FIG. 7.

The light-emitting array layer 130 may be disposed on the third planarization layer 127 covering the fifth conductive layer CDL5.

Referring to FIG. 15, channel regions CHDT, CH1-1, CH1-2, CH2, CH3-1, CH3-2, CH4, CH5, and CH6, source electrodes SDT, S1-1, S1-2, S2, S3-1, S3-2, S4, S5, and S6, and drain electrode DDT, D1-1, D1-2, D2, D3-1, D3-2, D4, D5, and D6 of the driving transistor DT and the first to sixth transistors ST1 to ST6 may be formed of the semiconductor layer SEL.

The channel regions CHDT, CH1-1, CH1-2, CH2, CH3-1, CH3-2, CH4, CH5, and CH6 of the driving transistor DT and the first to sixth transistors ST1 to ST6 of the semiconductor layer SEL may maintain semiconductor characteristics of the semiconductor material, and the source electrodes SDT, S1-1, S1-2, S2, S3-1, S3-2, S4, S5, and S6, and the drain electrode DDT, D1-1, D1-2, D2, D3-1, D3-2, D4, D5, and D6 of the driving transistor DT and the first to sixth transistors ST1 to ST6 may become conductive by doping them with ions or the impurities.

The gate electrodes GDT, G1-1, G1-2, G2, G3-1, G3-2, G4, G5, and G6 of the driving transistor DT and the first to sixth transistors ST1 to ST6 may be formed of the first conductive layer CDL1.

Each of the scan lines connected to the gate electrodes GDT, G1-1, G1-2, G2, G3-1, G3-2, G4, G5, and G6 of the first to sixth transistors ST1 to ST6, i.e., a write scan line GWL, an initialization scan line GIL, an emission control line ECL, and a control scan line GCL may be formed of the first conductive layer CDL1. The write scan line GWL, the initialization scan line GIL, the emission control line ECL, and the control scan line GCL may extend in the first direction DR1.

Each of the gate initialization voltage line VGIL connected to the drain electrode D3-2 of the third transistor ST3 to transfer the first initialization voltage, and the anode initialization voltage line VAIL connected to the drain electrode D4 of the fourth transistor ST4 to transfer the second initialization voltage may extend in the first direction DR1 and may be formed of the second conductive layer CDL2.

The circuit array layer 120 may include a first voltage line VDL disposed in the display area DA, electrically connected to the first voltage supply line VDSPL, and transmitting the first voltage to the pixel drivers PXD2.

The first voltage line VDL may include a first voltage horizontal line VDSBL1 extended in the first direction DR1, and a first voltage vertical line VDSBL2 electrically connected to the first voltage horizontal line VDSBL1 and extended in the second direction DR2.

The first voltage horizontal line VDSBL1 may be formed of the second conductive layer CDL2.

The first voltage vertical line VDSBL2 may be formed of the third conductive layer CDL3. The first voltage vertical line VDSBL2 may be electrically connected to the first voltage horizontal line VDSBL1 through a fifth contact hole CT5.

Each of a gate initialization voltage auxiliary line VGIAL connected to the gate initialization voltage line VGIL and extended in the second direction DR2, and an anode initialization voltage auxiliary line VAIAL connected to the anode initialization voltage line VAIL through a third initialization contact hole VACH1 and extended in the second direction DR2 may be formed of the third conductive layer CDL3.

For example, the driving transistor DT may include a channel region CHDT, a source electrode SDT and a drain electrode DDT connected to each side of the channel region CHDT, and a gate electrode GDT overlapping the channel region CHDT in a plan view.

The source electrode SDT of the driving transistor DT may be connected to the drain electrode D2 of the second transistor ST2 and the drain electrode D5 of the fifth transistor ST5.

The drain electrode DDT of the driving transistor DT may be connected to the source electrode S1-1 of the (1-1) transistor ST1-1 and the source electrode S6 of the sixth transistor ST6.

The first transistor ST1 may include a (1-1) transistor ST1-1 and a (1-2) transistor ST1-2 connected in series with each other.

The (1-1) transistor ST1-1 may include a channel region CH1-1, a source electrode S1-1 and a drain electrode D1-1 connected to each side of the channel region CH1-1, and a gate electrode G1-1 overlapping the channel region CH1-1 in a plan view and formed of a part of the write scan line GWL.

The source electrode S1-1 of the (1-1) transistor ST1-1 may be connected to the drain electrode DDT of the driving transistor DT.

The drain electrode D1-1 of the (1-1) transistor ST1-1 may be connected to the source electrode S1-2 of the (1-2) transistor ST1-2.

The (1-2) transistor ST1-2 may include a channel region CH1-2, a source electrode S1-2 and a drain electrode D1-2 connected to each side of the channel region CH1-2, and a gate electrode G1-2 overlapping the channel region CH1-2 in a plan view and formed of a protrusion of the write scan line GWL.

The source electrode S1-2 of the (1-2) transistor ST1-2 may be connected to the drain electrode D1-1 of the (1-1) transistor ST1-1.

The drain electrode D1-2 of the (1-2) transistor ST1-2 may be connected to the source electrode S3-1 of the (3-1) transistor ST3-1.

The gate electrodes G1-1 and G1-2 of the (1-1) transistor ST1-1 and the (1-2) transistor ST1-2 may be formed of different parts of the write scan line GWL.

The gate electrode GDT of the driving transistor DT may be electrically connected to the drain electrode D1-2 of the (1-2) transistor ST1-2 through a first connection electrode CE1.

The first connection electrode CE1 may be formed of the third conductive layer CDL3.

The first connection electrode CE1 may be connected to the gate electrode GDT of the driving transistor DT through a first contact hole CT1, and the first connection electrode CE1 may be connected to the drain electrode D1-2 of the (1-2) transistor ST1-2 through a second contact hole CT2.

The second transistor ST2 may include a channel region CH2, a source electrode S2 and a drain electrode D2 connected to each side of the channel region CH2, and a gate electrode G2 overlapping the channel region CH2 in a plan view and formed of another part of the write scan line GWL.

The drain electrode D2 of the second transistor ST2 may be connected to the source electrode SDT of the driving transistor DT and the drain electrode D5 of the fifth transistor ST5.

The gate electrode G2 of the second transistor ST2 may be formed of a part of the write scan line GWL.

The source electrode S2 of the second transistor ST2 may be connected to a second data line DL2 through a second connection electrode CE2 and a fourth connection electrode CE4 (see FIG. 16).

The second connection electrode CE2 may be formed of the third conductive layer CDL3.

The second connection electrode CE2 may be connected to the source electrode S2 of the second transistor ST2 through the fourth contact hole CT4.

The third transistor ST3 may include a (3-1) transistor ST3-1 and a (3-2) transistor ST3-2 connected in series.

The (3-1) transistor ST2 may include a channel region CH3-1, a source electrode S3-1 and a drain electrode D3-1 connected to each side of the channel region CH3-1, and a gate electrode G3-1 overlapping the channel region CH3-1 in a plan view.

The source electrode S3-1 of the (3-1) transistor ST3-1 may be connected to the drain electrode D1-2 of the (1-2) transistor ST1-2.

The drain electrode D3-1 of the (3-1) transistor ST3-1 may be connected to the source electrode S3-2 of the (3-2) transistor ST3-2.

The (3-2) transistor ST3-2 may include a channel region CH3-2, a source electrode S3-2 and a drain electrode D3-2 connected to each side of the channel region CH3-2, and a gate electrode G3-2 overlapping the channel region CH3-2 in a plan view.

The drain electrode D3-2 of the (3-2) transistor ST3-2 may be connected to the gate initialization auxiliary line VGIAL through the second initialization contact hole VICH2.

The gate electrodes G3-1 and G3-2 of the (3-1) transistor ST3-1 and the (3-2) transistor ST3-2 may be formed of different parts of the initialization scan line GIL.

The circuit array layer 120 may further include a shielding electrode SHE overlapping at least a part of the source electrode S3-1 of the (3-2) transistor ST3-2.

The shielding electrode SHE may be formed of the second conductive layer CDL2.

The shielding electrode SHE may be connected to the first voltage vertical line VDSBL2 through a third contact hole CT3.

The shielding electrode SHE may also overlap a part of the drain electrode D1-1 of the (1-1) transistor ST1-1 in a plan view.

The fourth transistor ST4 may include a channel region CH4, a source electrode S4 and a drain electrode D4 connected to each side of the channel region CH4, and a gate electrode G4 overlapping the channel region CH4 in a plan view and formed of a part of the control scan line GCL.

The source electrode S4 of the fourth transistor ST4 may be connected to the drain electrode D6 of the sixth transistor ST6.

The drain electrode D4 of the fourth transistor ST4 may be connected to an anode initialization auxiliary line VAIAL through a fourth initialization contact hole VACH2.

The gate electrode G4 of the fourth transistor ST4 may be formed of a part of the control scan line GCL.

The fifth transistor ST5 may include a channel region CH5, a source electrode S5 and a drain electrode D5 connected to each side of the channel region CH5, and a gate electrode G5 overlapping the channel region CH5 in a plan view and formed of a part of the emission control line ECL.

The source electrode S5 of the fifth transistor ST5 may be connected to a first voltage vertical line VDSBL2 through a sixth contact hole CT6.

The drain electrode D5 of the fifth transistor ST5 may be connected to the source electrode SDT of the driving transistor DT.

The sixth transistor ST6 may include a channel region CH6, a source electrode S6 and a drain electrode D6 connected to each side of the channel region CH6, and a gate electrode G6 overlapping the channel region CH5 in a plan view and formed of another part of the emission control line ECL.

The source electrode S6 of the sixth transistor ST6 may be connected to the drain electrode DDT of the driving transistor DT.

The drain electrode D6 of the sixth transistor ST6 may be connected to the source electrode S4 of the fourth transistor ST4, and may be connected to a third connection electrode CE3 through a seventh contact hole CT7.

The third connection electrode CE3 may be formed of the third conductive layer CDL3.

The capacitor C1 may include the first capacitor electrode CAE1 and the second capacitor electrode CAE2 overlap each other in a plan view.

The first capacitor electrode CAE1 may be formed of a part of the gate electrode GDT of the driving transistor DT.

The second capacitor electrode CAE2 may be made of a part of the first voltage horizontal line VDSBL1 formed of the second conductive layer CDL2.

As shown in FIG. 16, the fourth conductive layer CDL4 may include a first voltage auxiliary line VDAL, a second data detour line DDTL2, a fourth connection electrode CE4, and a fifth connection electrode CE5.

The fifth conductive layer CDL5 may include a second data line DL2, a first data detour line DDTL1, a first dummy line DML1, and a sixth connection electrode CE6.

The first voltage auxiliary line VDAL and the second data detour line DDTL2 may extend in the first direction DR1. In the second display divided area DPTA2 and the fourth display divided area DPTA4, the first voltage auxiliary line VDAL and the second data detour line DDTL2 may be arranged alternately in the second direction DR2.

The second data line DL2, the first data detour line DDTL1, and the first dummy line DML1 may extend in the second direction DR2.

In the second display divided area DPTA2 and the fourth display divided area DPTA4, the second data line DL2 may be disposed adjacent to the first data detour line DDTL1 and the first dummy line DML1.

The fourth connection electrode CE4 may be connected to the second connection electrode CE2 through a tenth contact hole CT10.

The second data line DL2 may be connected to the fourth connection electrode CE4 through an eleventh contact hole CT11.

Accordingly, the source electrode S2 of the second transistor ST2 may be connected to the data line DL through the second connection electrode CE2 and the fourth connection electrode CE4.

The fifth connection electrode CE5 may be connected to the third connection electrode CE3 through an eighth contact hole CT8.

The sixth connection electrode CE6 may be connected to the fifth connection electrode CE5 through a ninth contact hole CT9.

As shown in FIG. 17, the anode electrode 131 on the third planarization layer 127 may be connected to the sixth connection electrode CE6 through an anode contact hole ANCT penetrating the third planarization layer 127.

Accordingly, the anode electrode 131 may be electrically connected to the source electrode S4 of the fourth transistor ST4 and the drain electrode D6 of the sixth transistor ST6 through the sixth connection electrode CE6, the fifth connection electrode CE5, and the third connection electrode CE3.

As shown in FIG. 16, the first data detour line DDTL1 may be connected to the second data detour line DDTL2 through a first line contact hole LCH1.

As shown in FIG. 17, the circuit array layer 120 may have a structure that includes the semiconductor layer SEL on the substrate 110, the first conductive layer CDL1 on the first gate insulator 122 that covers the semiconductor layer SEL, the second conductive layer CDL2 on the second gate insulator 123 that covers the first conductive layer CDL1, the third conductive layer CDL3 on the interlayer dielectric layer 124 that covers the second conductive layer CDL2, the fourth conductive layer CDL4 on the first planarization layer 125 that covers the third conductive layer CDL3, the fifth conductive layer CDL5 on the second planarization layer 126 that covers the fourth conductive layer CDL4, and the third planarization layer 127 covering the fifth conductive layer CDL5.

The circuit array layer 120 may further include a buffer layer 121 disposed between the substrate 110 and the semiconductor layer SEL.

The buffer layer 121, the first gate insulator 122, the second gate insulator 123, the interlayer dielectric layer 124, the first planarization layer 125, and the second planarization layer 126 according to the second embodiment are substantially identical to those of the first embodiment shown in FIG. 7, and, therefore, the redundant descriptions will be omitted.

As shown in FIGS. 15 and 17, the semiconductor layer SEL may include silicon semiconductor such as polycrystalline silicon, monocrystalline silicon, low-temperature polycrystalline silicon, and amorphous silicon.

According to the second embodiment, the semiconductor layer SEL may include channel regions CHDT, CH1-1, CH1-2, CH2, CH3-1, CH3-2, CH4, CH5 and CH6 (see FIG. 15), source electrodes SDT, S1-1, S1-2, S2, S3-1, S3-2, S4, S5 and S6 (see FIG. 15), and drain electrode DDT, D1-1, D1-2, D2, D3-1, D3-2, D4, D5 and D6 (see FIG. 15) of each of the driving transistor DT and the switch elements ST1 to ST6.

The first conductive layer CDL1 may be disposed on the first gate insulator 122, and may be made up of a single layer including at least one of molybdenum (Mo), aluminum (Al), chromium (Cr), gold (Au), titanium (Ti), nickel (Ni), neodymium (Nd), copper (Cu), and an alloy thereof.

According to the second embodiment, the first conductive layer CDL1 may include gate electrodes GDT, G1-1, G1-2, G2, G3-1, G3-2, G4, G5, and G6 of the driving transistor DT and the first to sixth transistors ST1 to ST6; and the write scan line GWL, the initialization scan line GIL, the control scan line GCL, and the emission control line ECL connected to the gate electrodes G1-1, G1-2, G2, G3-1, G3-2, G4, G5, and G6 of the first to sixth transistors ST1 to ST6 and extended in the first direction DR1.

The second conductive layer CDL2 may be disposed on the second gate insulator 123, and may be made up of a single layer including at least one of molybdenum (Mo), aluminum (Al), chromium (Cr), gold (Au), titanium (Ti), nickel (Ni), neodymium (Nd), copper (Cu), and an alloy thereof.

According to the second embodiment, the second conductive layer CDL2 may include the shielding electrode SHE, the first voltage horizontal line VDSBL1, the gate initialization voltage line VGIL, and the anode initialization voltage line VAIL.

The third conductive layer CDL3 may be disposed on the interlayer dielectric layer 124, and may have a multi-layer structure having low resistance characteristics including a first main layer MNL1, a first sub-layer SBL11 and a second sub-layer SBL12 disposed on each surface of the first main layer MNL1, respectively.

The first main layer MNL1 may be made of a low resistance metal including at least one of aluminum (Al), chromium (Cr), gold (Au), nickel (Ni), neodymium (Nd), and copper (Cu).

The first sub-layer SBL11 and the second sub-layer SBL12 may block diffusion of the metal of the first main layer MNL1 in the form of ions. Each of the first sub-layer SBL11 and the second sub-layer SBL12 may be made of titanium (Ti).

According to the second embodiment, the third conductive layer CDL3 may include the first connection electrode CE1, the second connection electrode CE2, the third connection electrode CE3, the first voltage vertical auxiliary line VDSBL2, the gate initialization voltage auxiliary line VGIAL, and the anode initialization voltage auxiliary line VAIAL.

The fourth conductive layer CDL4 may be disposed on the first planarization layer 125 and may have a multi-layer structure having low resistance characteristics including a second main layer MNL2, a third sub-layer SBL21 and a fourth sub-layer SBL22 disposed on each surface of the second main layer MNL2, respectively.

The second main layer MNL2 may be made of a low resistance metal including at least one of aluminum (Al), chromium (Cr), gold (Au), nickel (Ni), neodymium (Nd), and copper (Cu).

The third sub-layer SBL21 and the fourth sub-layer SBL22 may block diffusion of the metal of the second main layer MNL2 in the form of ions. Each of the third sub-layer SBL21 and the fourth sub-layer SBL22 may be made of titanium (Ti).

As shown in FIGS. 16 and 17, according to the second embodiment, the fourth conductive layer CDL4 may include the second data detour line DDTL2, the first voltage auxiliary line VDAL, the second dummy line DML2, the fourth connection electrode CE4, and the fifth connection electrode CE5.

The fourth conductive layer CDL4 may further include a second voltage sub-line VSSBL (see FIG. 19) that is disposed in general areas GMA, GSA1 and GSA2 of the display area DA other than the middle area MDDA, the first side area SDA1, and the second side area SDA2, extended in the first direction DR1, and electrically connected to the second voltage supply line VSSPL.

The fifth conductive layer CDL5 may be disposed on the second planarization layer 126.

Although not shown in the drawings, the fifth conductive layer CDL5 may have the same multi-layer structure as the third conductive layer CDL3 and the fourth conductive layer CDL4.

The fifth conductive layer CDL5 may include a data line DL, a first data detour line DDTL1, a first dummy line DML1, a second voltage auxiliary line VSAL, and a sixth connection electrode CE6.

The third planarization layer 127 may be disposed on the second planarization layer 126, cover the fifth conductive layer CDL5, and have a flat upper surface.

The third planarization layer 127 may be formed of an organic layer including a material such as an acryl resin, an epoxy resin, a phenolic resin, a polyamide resin, and a polyimide resin.

As shown in FIGS. 15, 16, and 17, the pixel driver PXD2 of the second embodiment may include a first contact hole CT1, a second contact hole CT2, a third contact hole CT3, a fourth contact hole CT4, a fifth contact hole CT5, a sixth contact hole CT6, a seventh contact hole CT7, an eighth contact hole CT8, a ninth contact hole CT9, a tenth contact hole CT10, an eleventh contact hole CT11, and a twelfth contact hole CT12.

The first contact hole CT1 may connect the first connection electrode CE1 and the gate electrode GDT of the driving transistor DT. The first contact hole CT1 may overlap a part of the gate electrode GDT of the driving transistor DT in a plan view and may penetrate the second gate insulator 123 and the interlayer dielectric layer 124.

The second contact hole CT2 may connect one of the drain electrode D1-2 of the (1-2) transistor ST1-2 and the source electrode S3-1 of the (3-1) transistor ST3-1 and the first connection electrodes CE1. The drain electrode D1-2 of the (1-2) transistor ST1-2 and the source electrode S3-1 of the (3-1) transistor ST3-1 may be connected with each other. The second contact hole CT2 may overlap one of the drain electrode D1-2 of the (1-2) transistor ST1-2 and the source electrode S3-1 of the (3-1) transistor ST3-1 in a plan view and may penetrate the first gate insulator 122, the second gate insulator 123, and the interlayer dielectric layer 124.

Accordingly, the gate electrode GDT of the driving transistor DT may be electrically connected to the drain electrode D1-2 of the (1-2) transistor ST1-2 and the source electrode S3-1 of the (3-1) transistor ST3-1 through the first contact hole CT1, the second contact hole CT2 and the first connection electrode CE1.

The third contact hole CT3 may connect the shielding electrode SHE and the first voltage vertical line VDSBL2. The third contact hole CT3 may overlap a part of the first voltage vertical line VDSBL2 in a plan view and may penetrate the interlayer dielectric layer 124.

The fourth contact hole CT4 may connect the second connection electrode CE2 and the source electrode S2 of the second transistor ST2. The fourth contact hole CT4 may overlap a part of the source electrode S2 of the second transistor ST2 in a plan view, and may penetrate the first gate insulator 122, the second gate insulator 123, and the interlayer dielectric layer 124.

The fifth contact hole CT5 may connect the first voltage horizontal line VDSBL1 and the first voltage vertical line VDSBL2. The fifth contact hole CT5 may overlap a part of the first voltage horizontal line VDSBL1 in a plan view and may penetrate the interlayer dielectric layer 124.

The sixth contact hole CT6 may connect the first voltage vertical line VDSBL2 and the source electrode S5 of the fifth transistor ST5. The sixth contact hole CT6 may overlap a part of the source electrode S5 of the fifth transistor ST5 in a plan view, and may penetrate the first gate insulator 122, the second gate insulator 123, and the interlayer dielectric layer 124.

The seventh contact hole CT7 may connect the third connection electrode CE3 and the drain electrode D6 of the sixth transistor ST6. The seventh contact hole CT7 may overlap a part of the drain electrode D6 of the sixth transistor ST6 in a plan view, and may penetrate the first gate insulator 122, the second gate insulator 123, and the interlayer dielectric layer 124.

The eighth contact hole CT8 may connect the fifth connection electrode CE5 and the third connection electrode CE3. The eighth contact hole CT8 may overlap a part of the third connection electrode CE3 in a plan view and may penetrate the first planarization layer 125.

The ninth contact hole CT9 may connect the fifth connection electrode CE5 and the sixth connection electrode CE6. The ninth contact hole CT9 may overlap another part of the fifth connection electrode CE5 in a plan view and may penetrate the second planarization layer 126.

The tenth contact hole CT10 may connect the fourth connection electrode CE4 and the second connection electrode CE2. The tenth contact hole CT10 may overlap a part of the second connection electrode CE2 in a plan view and may penetrate the first planarization layer 125.

The eleventh contact hole CT11 may connect the fourth connection electrode CE4 and the data line DL2. The eleventh contact hole CT11 may overlap another part of the fourth connection electrode CE4 in a plan view and may penetrate the second planarization layer 126.

Accordingly, the source electrode S2 of the second transistor ST2 may be electrically connected to the data line DL2 through the fourth contact hole CT4, the second connection electrode CE2, the eleventh contact hole CT11, and the fourth connection electrode CE4.

The twelfth contact hole CT12 may electrically connect the first voltage vertical line VDSBL2 and the first voltage auxiliary line VDAL. The twelfth contact hole CT12 may overlap the first voltage vertical line VDSBL2 in a plan view and may penetrate the first planarization layer 125.

The light-emitting array layer 130 may be disposed on the third planarization layer 127 of the circuit array layer 120.

The light-emitting array layer 130 may include an anode electrode 131 disposed on the third planarization layer 127 in each of the emission areas EA, and electrically connected to each of the pixel drivers PXD2, a pixel-defining layer 132 disposed on the third planarization layer 127 and in a non-emission area NEA, which is a space between the emission areas EA, and covering the edge of the anode electrode 131, an emissive layer 133 disposed on the anode electrode 131 in each of the emission areas EA, and a cathode electrode 134 disposed on the pixel-defining layer 132 and the emissive layer 133 in the emission areas EA. The cathode electrode 134 may extend to the non-display area NDA and may be electrically connected to the second voltage supply line VSSPL.

The anode electrode 131 may be connected to the sixth connection electrode CE6 through the anode contact hole ANCT penetrating the third planarization layer 127.

Accordingly, the anode electrode 131 may be electrically connected to the drain electrode DDT of the driving transistor DT through the seventh contact hole CT7, the third connection electrode CE3, the eighth contact hole CT8, the fifth connection electrode CE5, the ninth contact hole CT9, the sixth connection electrode CE6, and the anode contact hole ANCT.

The pixel-defining layer 132 may be formed of an organic film.

The emissive layer 133 may include an organic light-emitting material.

Although not shown in the drawings, a first common layer (not shown) including at least a hole transport material may be disposed between the anode electrode 131 and the emissive layer 133.

A second common layer (not shown) including at least an electron transport material may be disposed between the emissive layer 133 and the cathode electrode 134.

The cathode electrode 134 may be disposed throughout the display area DA.

Although not shown in the drawings, the cathode electrode 134 may be connected to the second voltage supply line VSSPL in the non-display area NDA.

Accordingly, the light-emitting array layer 130 may include multiple light-emitting elements LEL disposed in each of the emission areas EA, each having a structure including an anode electrode 131 and a cathode electrode 134 facing each other, and an emissive layer 133 interposed therebetween.

The light-emitting array layer 130 may be covered by the encapsulation structure layer 140 for blocking the permeation of oxygen or moisture.

The encapsulation structure layer 140 may cover the light-emitting array layer 130 and may have a structure in which at least one inorganic film and at least one organic film are alternately stacked each other.

Figure 18:
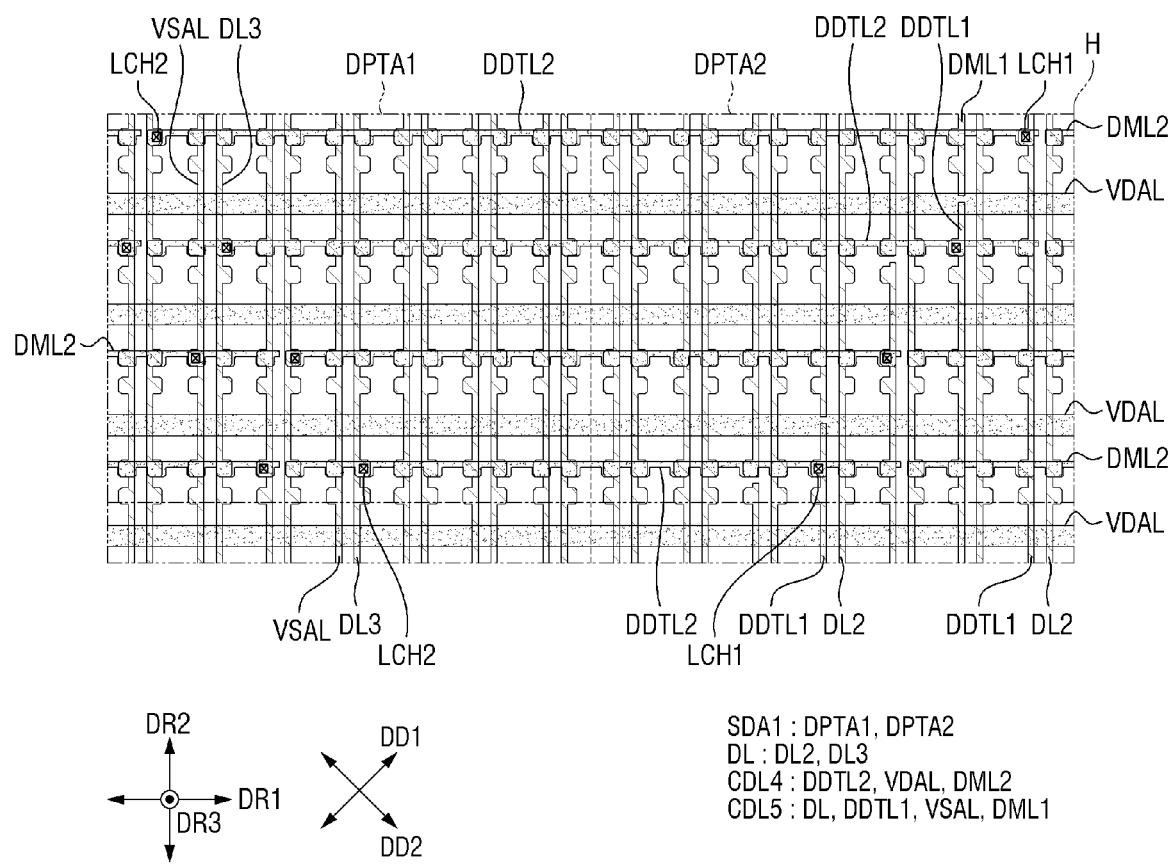
FIG. 18 is a plan view showing the fourth conductive layer and the fifth conductive layer in portion H of FIG. 12.

FIG. 18 is a plan view showing the fourth conductive layer and the fifth conductive layer in portion H of FIG. 12.

As shown in FIG. 12, the display area DA may include the middle area MDDA disposed adjacent to the subsidiary area SBA, and the first side area SDA1 and the second side area SDA2 disposed on each side of the middle area MDDA in the first direction DR1.

The first side area SDA1 may include the first display divided area DPTA1 disposed adjacent to the non-display area NDA in the first direction DR1, and the second display divided area DPTA2 disposed between the first display divided area DPTA1 and the middle area MDDA.

As shown in FIG. 13, the data lines DL of the circuit array layer 120 according to the second embodiment may include a second data line DL2 disposed in the second display divided area DPTA2 and electrically connected to the second data output line DOPL2 in the non-display area NDA, and a third data line DL3 disposed in the first display divided area DPTA1.

Referring to FIG. 18, the circuit array layer 120 according to the second embodiment may include the first data detour line DDTL1 disposed in the second display divided area DPTA2 and connected to the third data output line DOPL3 in the non-display area NDA, and the second data detour line DDTL2 connecting the first data detour line DDTL1 and the third data line DL3 and extended in the first direction DR1.

For example, the third data line DL3 disposed in the first display divided area DPTA1 may be connected to the third data output line DOPL3 through the first data detour line DDTL1 and the second data detour line DDTL2 disposed in the display area DA, rather than being directly connected to the third data output line DOPL3 in the non-display area NDA.

The first data detour line DDTL1 may be disposed adjacent to the second data line DL2.

The circuit array layer 120 may further include a first dummy line DML1 spaced apart from and colinear with the first data detour line DDTL1 and extended in the second direction DR2.

The second data line DL2 in the second display divided area DPTA2 may be disposed adjacent to the first data detour line DDTL1 and the first dummy line DML1. For example, a part of the second data line DL2 may be disposed adjacent to the first data detour line DDTL1, and another part of the second data line DL2 may be disposed adjacent to the first dummy line DML1.

The circuit array layer 120 may further include a second voltage auxiliary line VSAL disposed in the display area DA and extended in the second direction DR2. The second voltage auxiliary line VSAL may be electrically connected to the second voltage supply line VSSPL in the non-display area NDA. The RC delay depending on the distance from the subsidiary area SBA may be reduced in case that the second voltage is supplied by virtue of the second voltage auxiliary line VSAL.

The third data line DL3 of the first display divided area DPTA1 may be disposed adjacent to the second voltage auxiliary line VSAL.

The data lines DL, the first data detour line DDTL1, the second voltage auxiliary line VSAL, and the first dummy line DML1 may extend in the second direction DR2, may be spaced apart from one another, and may be formed of the fifth conductive layer CDL5.

The circuit array layer 120 may further include a first voltage auxiliary line VDAL disposed in the display area DA and extended in the first direction DR1, and second dummy lines DML2 disposed on each side of the second data detour line DDTL2 in the first direction DR1 and extended in the first direction DR1.

The first voltage auxiliary line VDAL may be electrically connected to the first voltage vertical line VDSBL2 in the display area DA or the first voltage supply line VDSPL in the non-display area NDA.

In the first side area SDA1, the first voltage auxiliary line VDAL may be disposed adjacent to the second data detour line DDTL2 and the second dummy line DML2. For example, a part of the first voltage auxiliary line VDAL disposed in the first side area SDA1 may be disposed adjacent to the second data detour line DDTL2. Another part of the first voltage auxiliary line VDAL disposed in the first side area SDA1 may be disposed adjacent to the second dummy line DML2.

The second data detour line DDTL2, the first voltage auxiliary line VDAL, and the second dummy line DML2 may extend in the first direction DR1, may be spaced apart from one another, and may be formed of the fourth conductive layer CDL4.

In the second display divided area DPTA2, a side of the second data detour line DDTL2 may be electrically connected to the first data detour line DDTL1 through a first line contact hole LCH1.

In the first display divided area DPTA1, another side of the second data detour line DDTL2 may be electrically connected to the third data line DL3 through a second line contact hole LCH2.

Each of the first line contact hole LCH1 and the second line contact hole LCH2 may penetrate the second planarization layer 126.

In the second display divided area DPTA2, multiple first line contact holes LCH1 respectively associated with multiple second data detour lines DDTL2 may be arranged in a first diagonal direction DD1.

In the first display divided area DPTA1, multiple second line contact holes LCH2 respectively associated with multiple second data detour lines DDTL2 may be arranged in a second diagonal direction DD2.

It is possible to readily determine whether the first line contact holes LCH1 and the second line contact holes LCH2 are normally arranged based on the arrangement shape of the first line contact holes LCH1 and the arrangement shape of the second line contact holes LCH2.

The second side area SDA2 may have a similar structure to the structure of the first side area SDA1 that is inverted with respect to the middle area MDDA, and, therefore, the redundant descriptions will be omitted.

Figure 19:
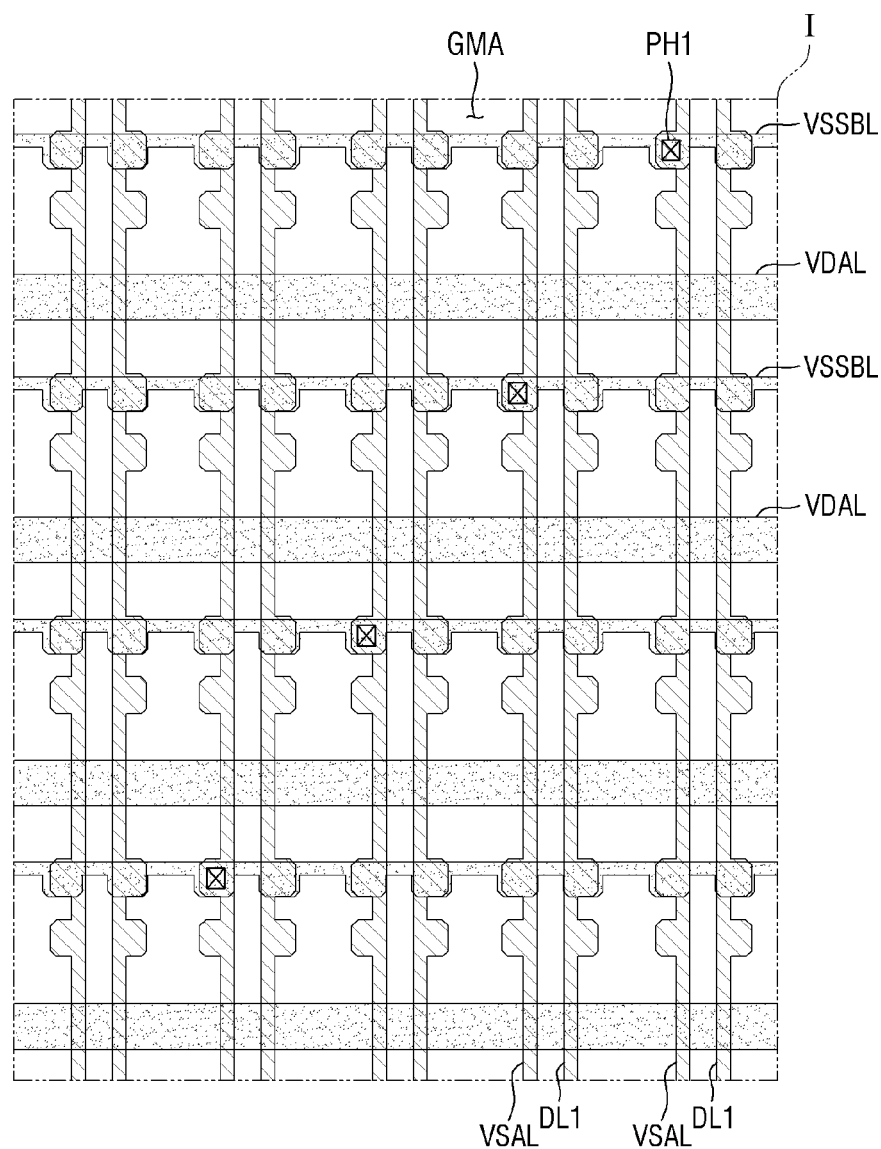
FIG. 19 is a plan view showing the fourth conductive layer and the fifth conductive layer in portion I of FIG. 12.

FIG. 19 is a plan view showing the fourth conductive layer and the fifth conductive layer in portion I of FIG. 12.

As shown in FIG. 12, the display area DA may include a general middle area GMA disposed adjacent to the middle area MDDA in the second direction DR2, a first general side area GSA1 disposed adjacent to the first side area SDA1 in the second direction DR2, and a second general side area GSA2 disposed adjacent to the second side area SDA2 in the second direction DR2.

As shown in FIG. 13, the data lines DL of the circuit array layer 120 according to the second embodiment may include a first data line DL1 disposed in the middle area MDDA and connected to the first data output line DOPL1 in the non-display area NDA.

The second voltage auxiliary line VSAL may extend to the middle area MDDA in the second direction DR2 and may be disposed adjacent to the first data line DL1.

The general middle area GMA may be disposed adjacent to the middle area MDDA in the second direction DR2.

Therefore, as shown in FIG. 19, as in the middle area MDDA, the first data line DL1 and the second voltage auxiliary line VSAL disposed adjacent to each other may be also disposed in the general middle area GMA.

The circuit array layer 120 according to the second embodiment may further include a second voltage sub-line VSSBL that is disposed in the areas of the display area DA other than the middle area MDDA, the first side area SDA1, and the second side area SDA2 (i.e., the general middle area GMA, the first general side area GSA1, and the second general side area GSA2), electrically connected to the second voltage supply line VSAL, and extended in the first direction DR1.

The second voltage sub-line VSSBL may be spaced apart from the first voltage auxiliary line VDAL, extended in the first direction DR1, and formed of the fourth conductive layer CDL4.

The second voltage sub-line VSSBL may be connected to the second voltage auxiliary line VSAL through a first power contact hole PH1. The first power contact hole PH1 may penetrate the second planarization layer 126.

Multiple first power contact holes PH1 respectively associated with multiple second voltage sub-lines VSSBL may be arranged in the first diagonal direction DD1.

It is possible to readily determine whether the first power contact holes PH1 are normally arranged based on the arrangement shape of the first power contact holes PH1.

The lines in the first direction DR1 arranged in the first general side area GSA1 and the second general side area GSA2 may be identical to those in the general middle area GMA, and the lines in the second direction DR2 arranged in the first general side area GSA1 and the second general side area GSA2 may be identical to the first side area SDA1 and the second side area SDA2, and, therefore, the redundant descriptions will be omitted.

Figure 20:
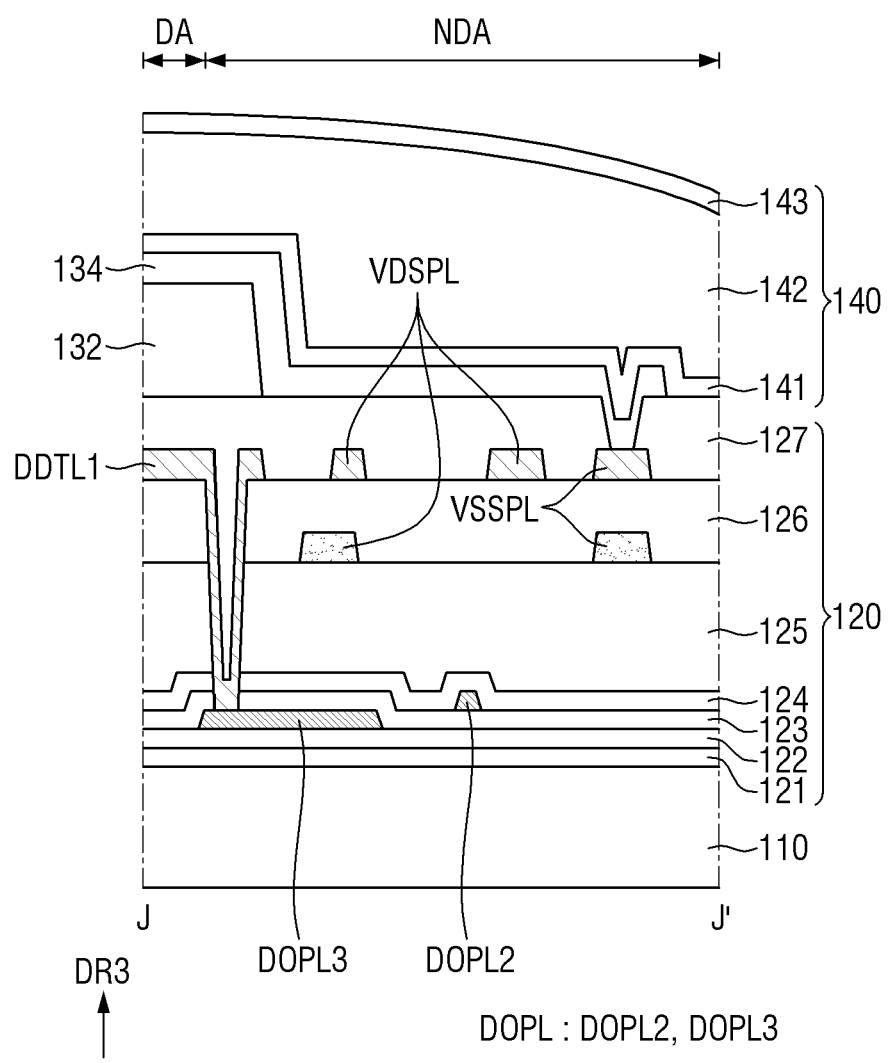
FIG. 20 is a schematic cross-sectional view taken along line J-J' of FIG. 13 according to an embodiment of the disclosure.

FIG. 20 is a schematic cross-sectional view taken along line J-J' of FIG. 13 according to an embodiment of the disclosure.

Referring to FIG. 20, the data output lines DOPL in the non-display area NDA according to the second embodiment may be formed of the first conductive layer CDL1 or the second conductive layer CDL2.

Like the data lines DL, the first data detour line DDTL1 may be formed of the fifth conductive layer CDL5 on the second planarization layer 126.

The third data output line DOPL3 among the data output lines DOPL may be formed of the first conductive layer CDL1 on the first gate insulator 122, and may be electrically connected to the first data detour line DDTL1 through a contact hole penetrating the second planarization layer 126, the first planarization layer 125, the interlayer dielectric layer 124, and the second gate insulator 123.

In another embodiment, although not shown in the drawings, the third data output line DOPL3 among the data output lines DOPL may be formed of the second conductive layer CDL2 on the second gate insulator 123, and may be electrically connected to the first data detour line DDTL1 through a contact hole penetrating the second planarization layer 126, the first planarization layer 125, and the interlayer dielectric layer 124.

Each of the first voltage supply line VDSPL and the second voltage supply line VSSPL disposed in the non-display area NDA may be formed of the fourth conductive layer CDL4 on the first planarization layer 125 or the fifth conductive layer CDL5 on the second planarization layer 126.

The cathode electrode 134 of the light-emitting array layer 130 may extend to the non-display area NDA and may be electrically connected to the second voltage supply line VSSPL through a contact hole penetrating at least the third planarization layer 127.

The encapsulation structure layer 140 according to the second embodiment may be identical to that of the first embodiment shown in FIG. 10; and, therefore, the redundant descriptions will be omitted.

Figure 21:
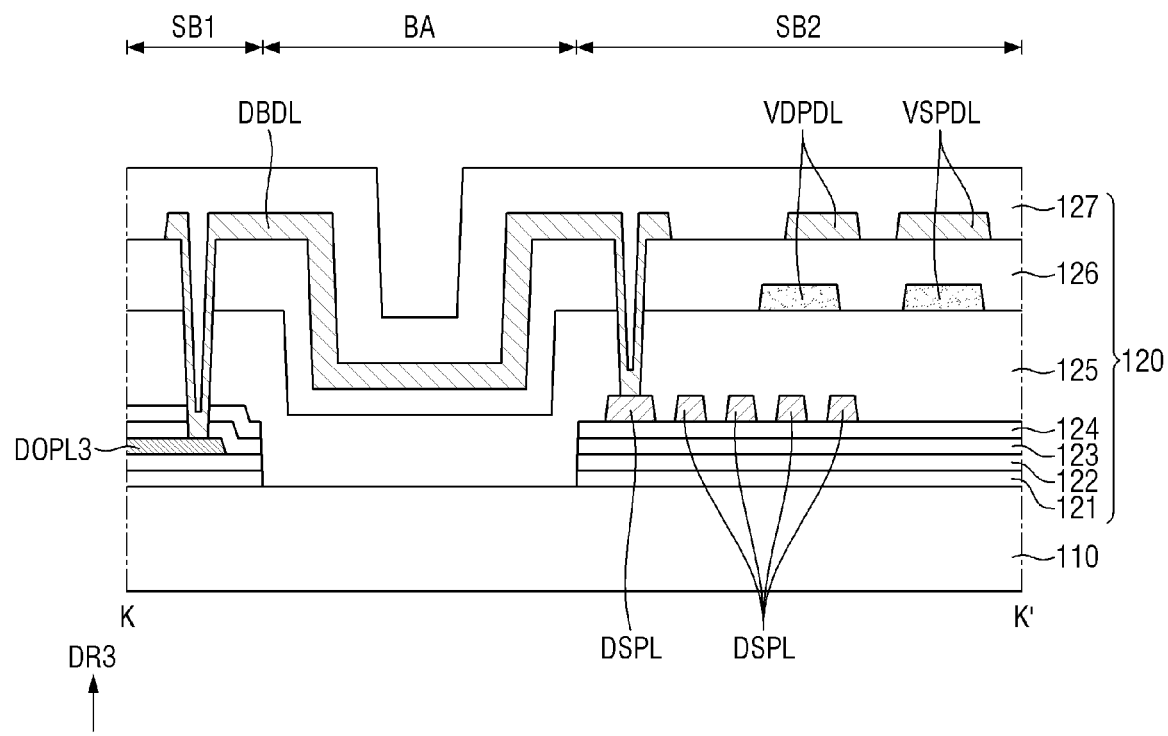
FIG. 21 is a schematic cross-sectional view taken along line K-K' of FIG. 13 according to an embodiment of the disclosure.
Figure 22:
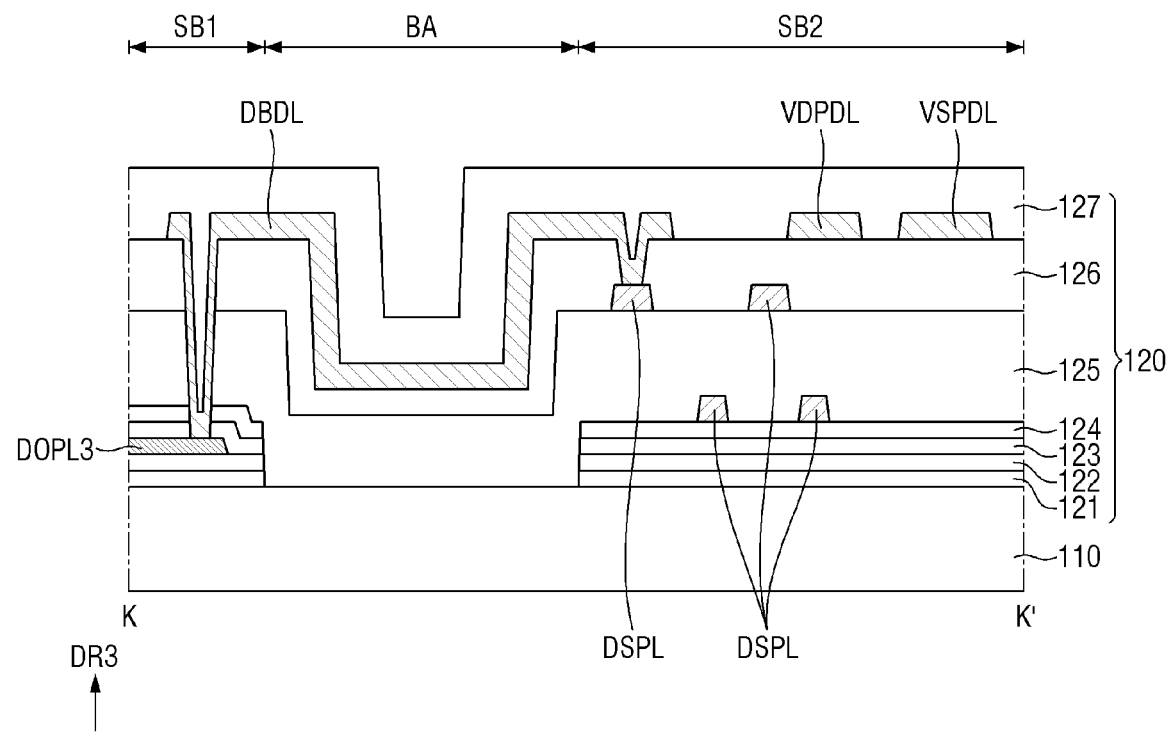
FIG. 22 is a schematic cross-sectional view taken along line K-K' of FIG. 13 according to an embodiment of the disclosure.

FIG. 21 is a schematic cross-sectional view taken along line K-K' of FIG. 13 according to an embodiment of the disclosure. FIG. 22 is a schematic cross-sectional view taken along line K-K' of FIG. 13 according to an embodiment of the disclosure.

As shown in FIG. 21, according to the second embodiment, the data supply lines DSPL may be disposed in the second subsidiary area SB2 and electrically connected to the output terminals of the display driver circuit 200, respectively. The data supply lines DSPL may be formed of the third conductive layer CDL3 on the interlayer dielectric layer 124.

The first voltage pad line VDPDL and the second voltage pad line VSPDL disposed in the second subsidiary area SB2 may be formed of the fourth conductive layer CDL4 on the first planarization layer 125 or the fifth conductive layer CDL5 on the second planarization layer 126.

The data bending line DBDL disposed in the bending area BA may be formed of the fourth conductive layer CDL4 on the first planarization layer 125 or the fifth conductive layer CDL5 on the second planarization layer 126.

In another embodiment, as shown in FIG. 22, according to the second embodiment, the data supply lines DSPL may be disposed in the second subsidiary area SB2 and electrically connected to the output terminals of the display driver circuit 200, respectively. The data supply lines DSPL may be formed of the third conductive layer CDL3 on the interlayer dielectric layer 124 or the fourth conductive layer CDL4 on the first planarization layer 125.

The first voltage pad line VDPDL and the second voltage pad line VSPDL disposed in the second subsidiary area SB2 may be formed of the fifth conductive layer CDL5 on the second planarization layer 126.

It is possible to prevent a short circuit between adjacent data supply lines DSPL, or to further reduce the resistance of the data supply lines DSPL.

As described above, according to the second embodiment, the third data line DL3 disposed in the first display divided area DPTA1 and the third display divided area DPTA3 may be connected to the third data output line DOPL3 through the first data detour line DDTL1 and the second data detour line DDTL2 disposed in the display area DA, rather than being directly connected to the third data output line DOPL3 in the non-display area NDA. Accordingly, the third data output line DOPL3 may be disposed in an area adjacent to the subsidiary area SBA, rather than a corner of the substrate 110 of the non-display area NDA that is adjacent to the first display divided area DPTA1 and the third display divided area DPTA3, so that the width of the non-display area NDA may be reduced.

As such, according to the second embodiment, the signal transmission paths between the display driver circuit 200 and the third data line DL3 may further include the first data detour line DDTL1 and the second data detour line DDTL2, unlike the first data line DL1 and the second data line DL2.

According to the second embodiment, the data supply line DSPL may be formed of the third conductive layer CDL3 or the third conductive layer CDL3 and the fourth conductive layer CDL4 instead of the first conductive layer CDL1 or the second conductive layer CDL2, and each of the first data detour line DDTL1 and the second data detour line DDTL2 may be formed of the fifth conductive layer CDL5 or the fourth conductive layer CDL4.

Accordingly, a difference in the resistance of the signal transmission paths connecting each of the data lines DL and the display driver circuit 200 may be less affected by the first data detour line DDTL1 and the second data detour line DDTL2. Therefore, while the width of the non-display area NDA may be reduced, the time taken for a data signal output from the display driver circuit to be applied to a data line may become relatively uniform. Accordingly, the quality of the display device 10 may be advantageously improved.

Figure 23:
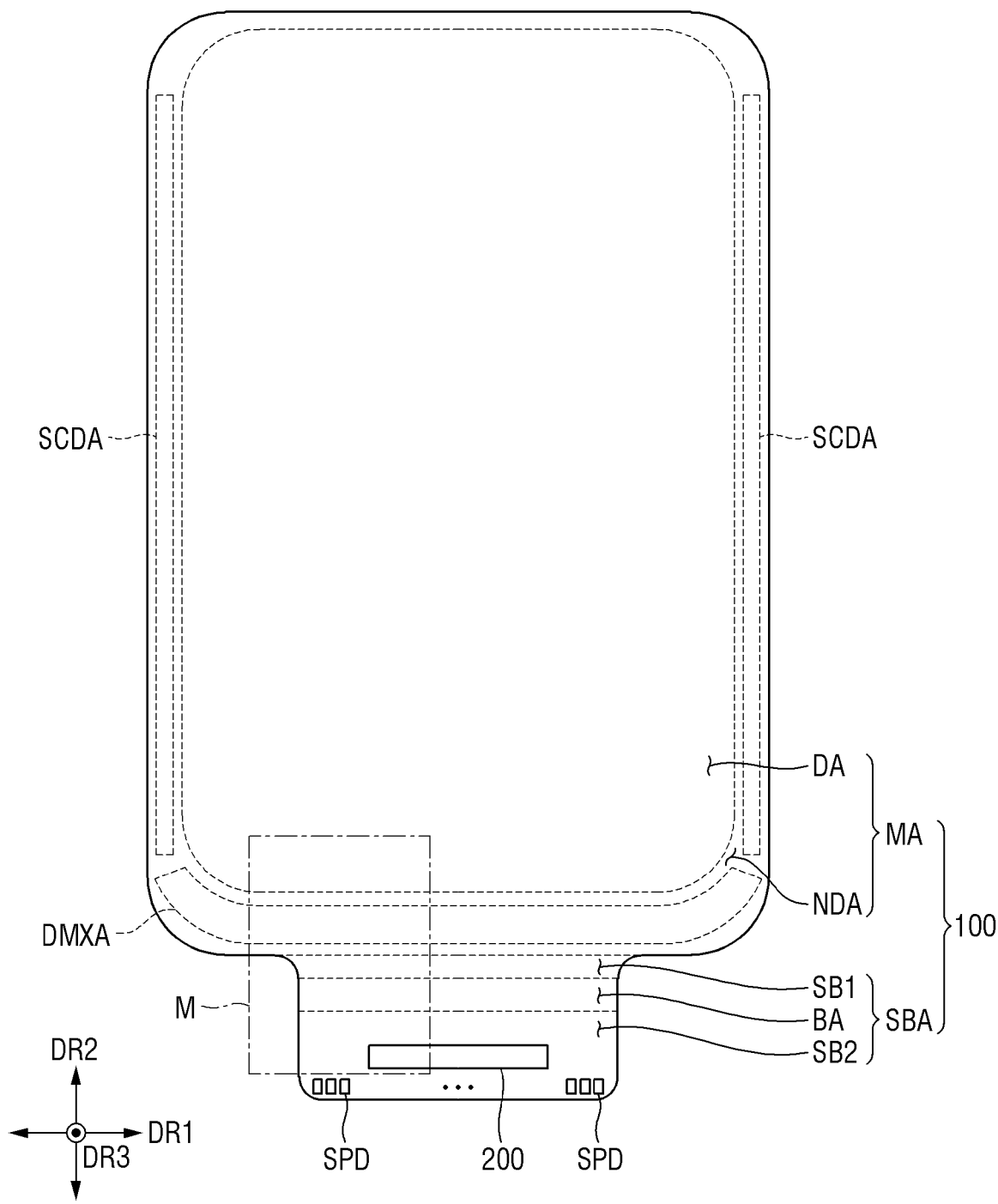
FIG. 23 is a plan view showing a display device according to a third embodiment.
Figure 24:
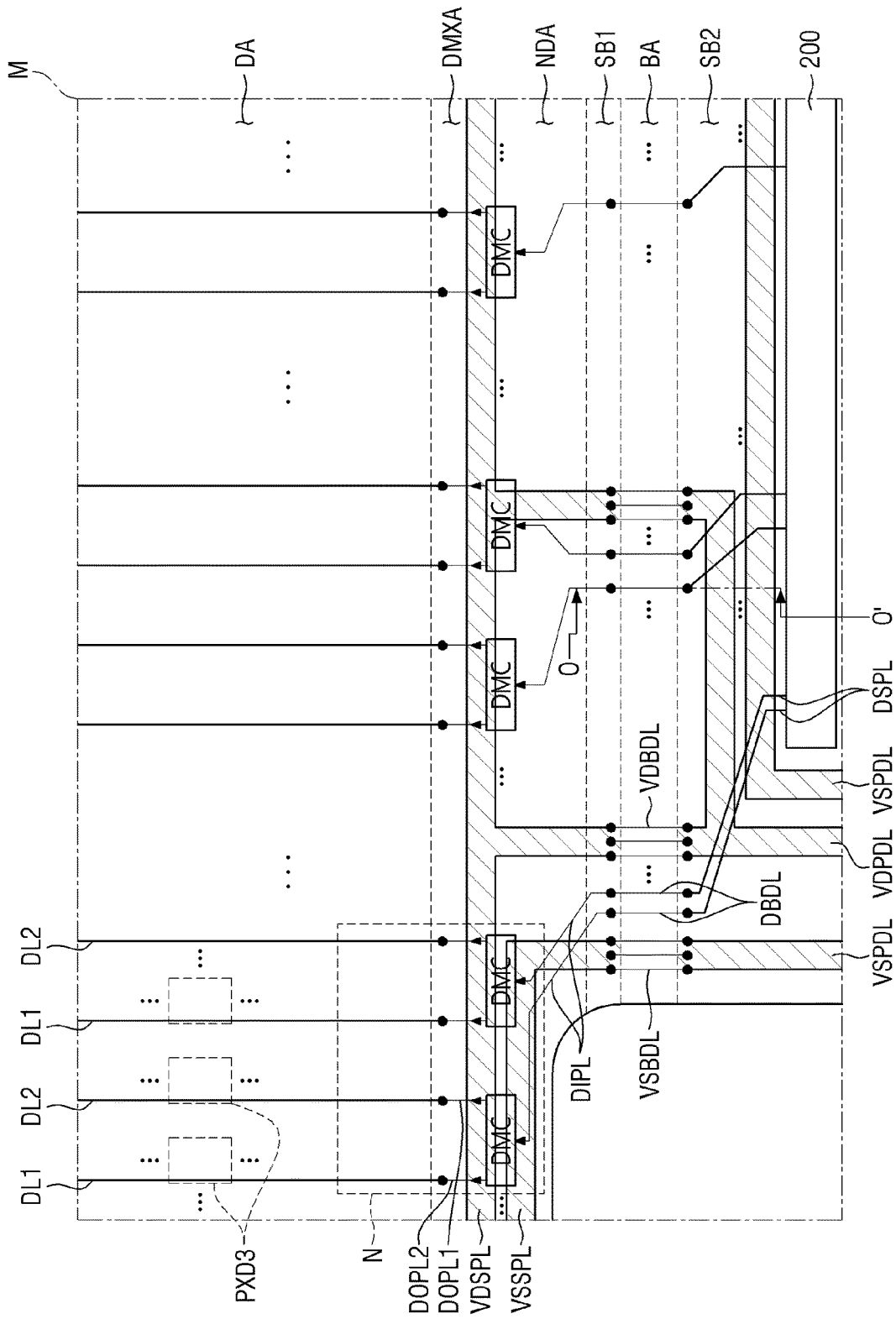
FIG. 24 is a layout view showing portion M of FIG. 23.

FIG. 23 is a plan view showing a display device according to a third embodiment. FIG. 24 is a layout view showing portion M of FIG. 23.

The third embodiment of FIG. 23 is substantially identical to the first embodiment shown in FIG. 4 except that a non-display area NDA of a display device 10 includes a demux area DMXA between a subsidiary area SBA and a display area DA, and, therefore, the redundant descriptions will be omitted.

Referring to FIG. 24, the circuit array layer 120 according to the third embodiment may further include demux circuits DMC disposed in the demux area DMXA, and data input lines DIPL that extends to the non-display area NDA from a first subsidiary area SB1 and electrically connect input terminals of the demux circuits DMC and data supply lines DSPL.

For example, the data input lines DIPL may be electrically connected to the data supply lines DSPL in a second subsidiary area SB2 through the data bending lines DBDL in the bending area BA. Accordingly, data driving signals from output terminals of the display driver circuit 200 may be respectively transmitted to the input terminals of the demux circuits DMC.

The data output lines DOPL may connect the output terminals of the demux circuits DMC and the data lines DL, respectively.

Each of the demux circuits DMC may transmit a data signal to each of two or more data lines DL1 and DL2 based on the data driving signal of the display driver circuit 200.

For example, according to the third embodiment, each of the demux circuits DMC may have a first output terminal and a second output terminal. The data lines DL may include a first data line DL1 connected to a first output terminal of each of the demux circuits DMC through a first data output line DOPL1, and a second data line DL2 connected to a second output terminal of each of the demux circuits DMC through a second data output line DOPL2.

However, the disclosure is not limited thereto. Each of the demux circuits DMC may be connected between an output terminal of the display driver circuit 200 and three or more data lines DL.

Figure 25:
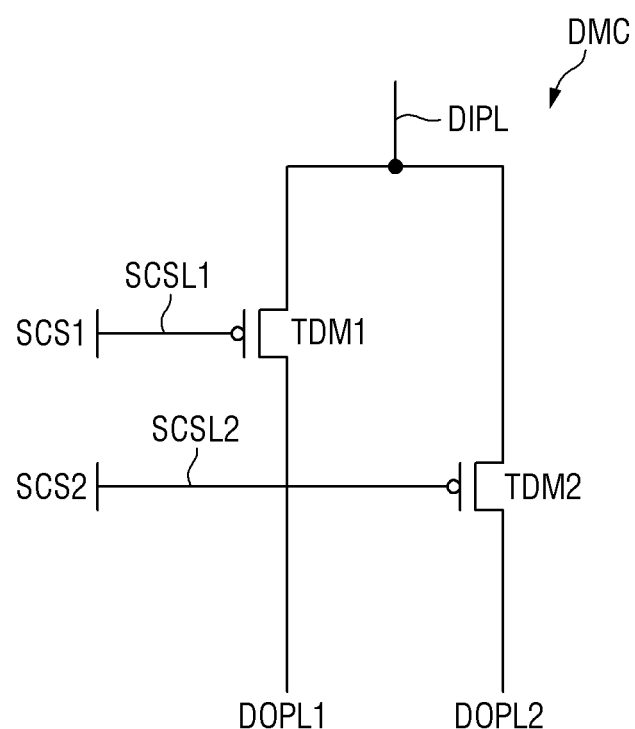
FIG. 25 is a schematic diagram of an equivalent circuit of the demux circuit of FIG. 24 according to an embodiment of the disclosure.

FIG. 25 is a schematic diagram of an equivalent circuit of the demux circuit of FIG. 24 according to an embodiment of the disclosure.

FIG. 25 shows a demux circuit DMC including two output terminals.

Referring to FIG. 25, the demux circuits DMC may include two demux transistors TDM1 and TDM2 respectively associated with the two output terminals.

First electrodes (e.g., source electrodes) of the two demux transistors TDM1 and TDM2 may be connected to a data input line DIPL.

Second electrodes (e.g., drain electrodes) of the two demux transistors TDM1 and TDM2 may be connected to a first data output line DOPL1 and a second data output line DOPL2, respectively.

For example, the second electrode of the first demux transistor TDM1 may be connected to a first data line DL1 through the first data output line DOPL1, and the second electrode of the second demux transistor TDM2 may be connected to a second data line DL2 through the second data output line DOPL2.

A gate electrode of the first demux transistor TDM1 may be connected to the first demux control line SCSL1, and a gate electrode of the second demux transistor TDM2 may be connected to the second demux control line SCSL2.

The first demux control line SCSL1 and the second demux control line SCSL2 may transmit a first demux control signal SCS1 and a second demux control signal SCS2 having different phases, respectively.

Because the first demux control signal SCS1 and the second demux control signal SCS2 have different phases, the first demux transistor TDM1 and the second demux transistor TDM2 may be turned on for different periods.

Therefore, the data driving signal of the display driver circuit 200 transferred through the data input line DIPL may be time-division demultiplexed by the first demux transistor TDM1 and the second demux transistor TDM2 turned on for different periods. The respective data signals may be transmitted to the first data line DL1 and the second data line DL2 connected to the output terminals of the demux circuit DMC for different periods.

Figure 26:
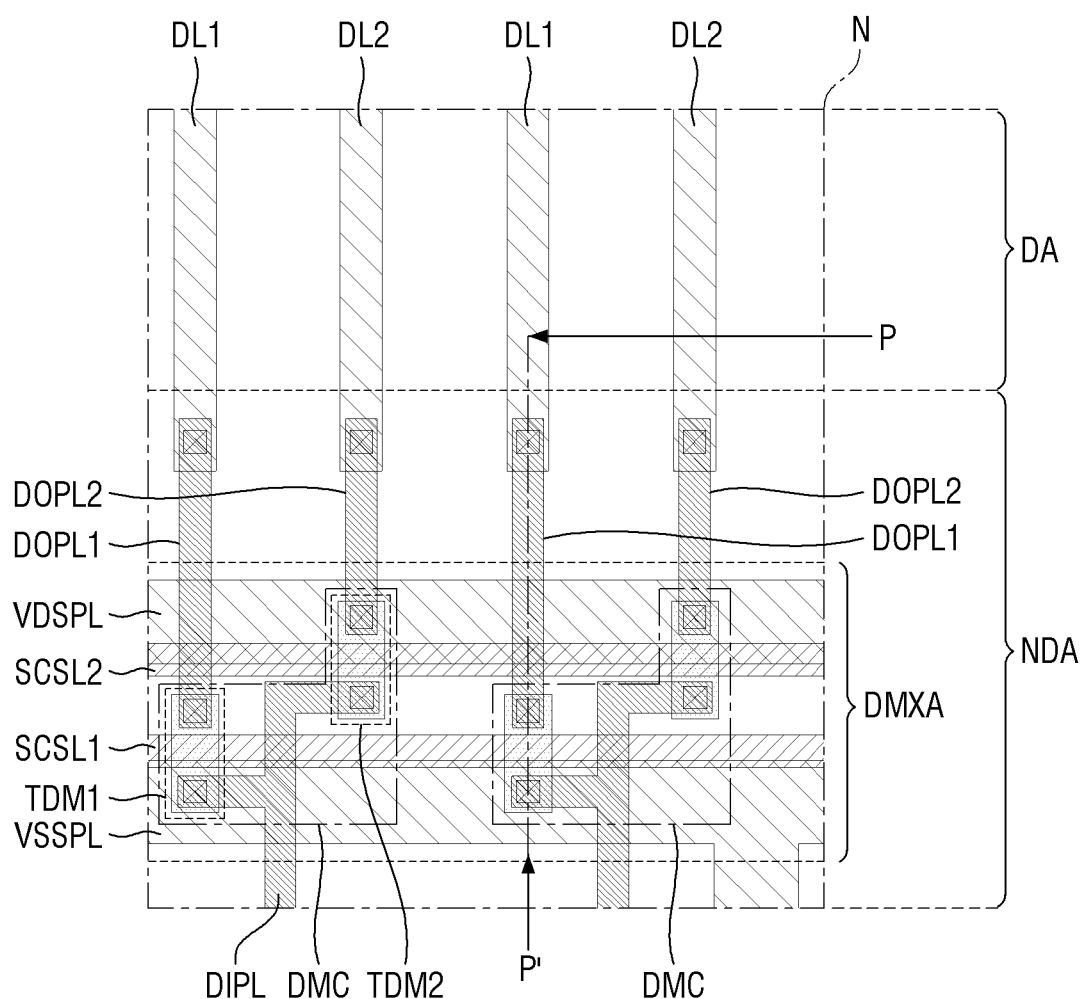
FIG. 26 is a plan view showing portion N of FIG. 24.
Figure 27:
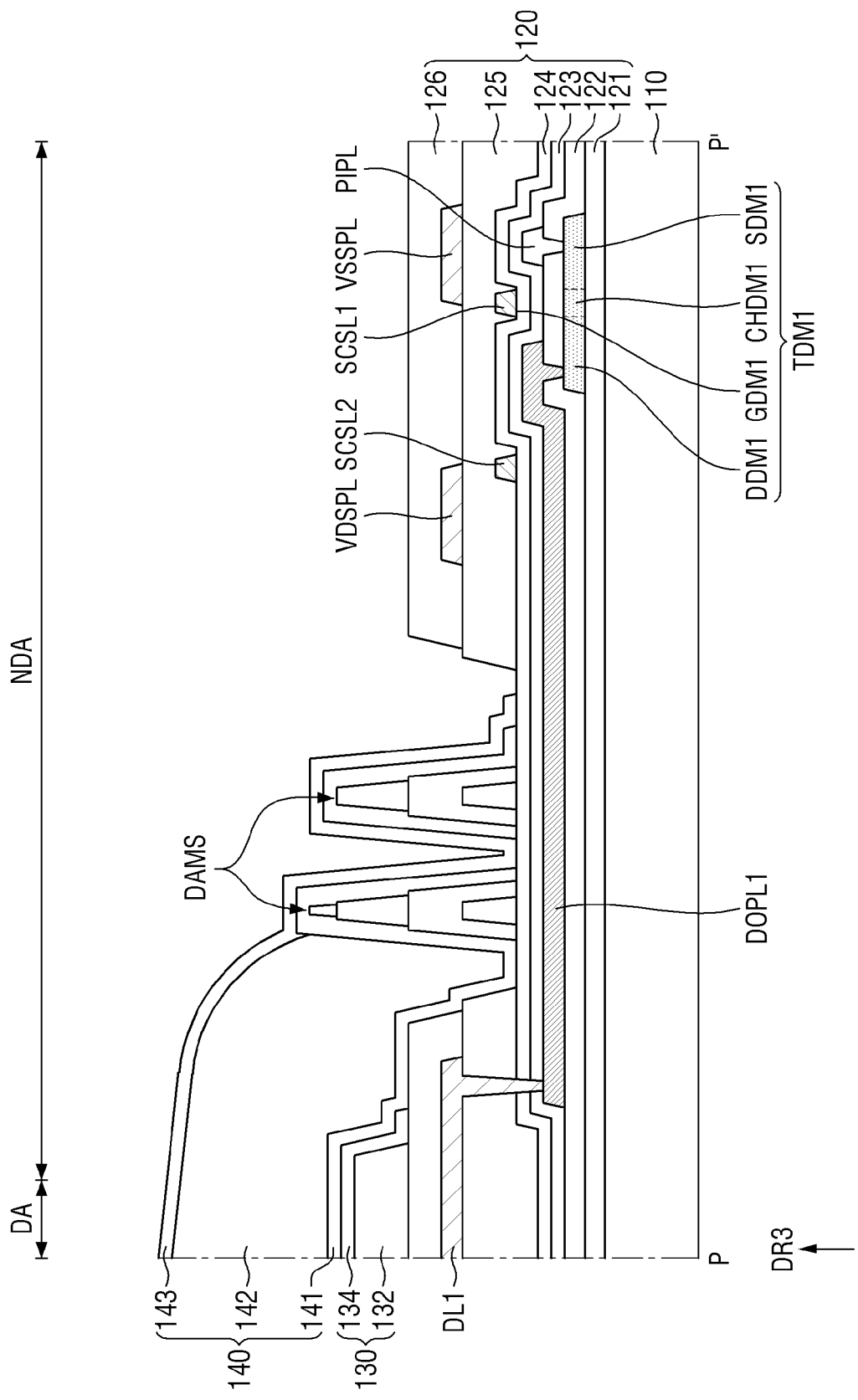
FIG. 27 is a schematic cross-sectional view taken along line P-P' of FIG. 26 according to an embodiment of the disclosure.

FIG. 26 is a plan view showing portion N of FIG. 24. FIG. 27 is a schematic cross-sectional view taken along line P-P' of FIG. 26 according to an embodiment of the disclosure.

Referring to FIGS. 26 and 27, at least a part of each of the first voltage supply line VDSPL and the second voltage supply line VSSPL disposed in the non-display area NDA and the first subsidiary area SB1 may be disposed in the demux area DMXA. For example, the demux circuits DMC disposed in the demux area DMXA may overlap each of the first voltage supply line VDSPL and the second voltage supply line VSSPL in a plan view. With this configuration, the width of the non-display area NDA may be not increased as much as the width of the demux area DMXA, and thus the width of the non-display area NDA may not increase significantly even though the demux area DMXA is included.

The data lines DL, the first voltage supply line VDSPL, and the second voltage supply line VSSPL may be formed of the fourth conductive layer CDL4 on the first planarization layer 125.

The input terminal of each of the demux circuits DMC may be connected to the data input line DIPL. The output terminals of each of the demux circuits DMC may be electrically connected to the first data line DL1 and the second data line DL2 through the first data output line DOPL1 and the second data output line DOPL2, respectively.

Each of the data input line DIPL and the data output line DOPL may be formed of the first conductive layer CDL1 on the first gate insulator 122 or the second conductive layer CDL2 on the second gate insulator 123.

Each of the first demux transistor TDM1 and the second demux transistor TDM2 may include a channel region formed of the semiconductor layer SEL, first and second electrodes, and a gate electrode overlapping the channel region in a plan view.

The gate electrode of the first demux transistor TDM1 may be formed of a part of the first demux control line SCSL1 overlapping the channel region of the first demux transistor TDM.

The gate electrode of the second demux transistor TDM2 may be formed of a part of the second demux control line SCSL2 overlapping the channel region of the second demux transistor TDM2.

The first demux control line SCSL1 and the second demux control line SCSL2 may be formed of the third conductive layer CDL3.

In another embodiment, although not shown in the drawings, each of the first voltage supply line VDSPL, the second voltage supply line VSSPL, the first demux control line SCSL1, and the second demux control line SCSL2 may have a jumping structure of a combination of the third conductive layer CDL3 and the fourth conductive layer CDL4, so that the first voltage supply line VDSPL, the second voltage supply line VSSPL, the first demux control line SCSL1, and the second demux control line SCSL2 may be insulated from one another and integrated.

The light-emitting array layer 130, the encapsulation structure layer 140, and the dam structure DAMS according to the third embodiment may be identical to those of the first embodiment shown in FIG. 10; and, therefore, the redundant descriptions will be omitted.

Figure 28:
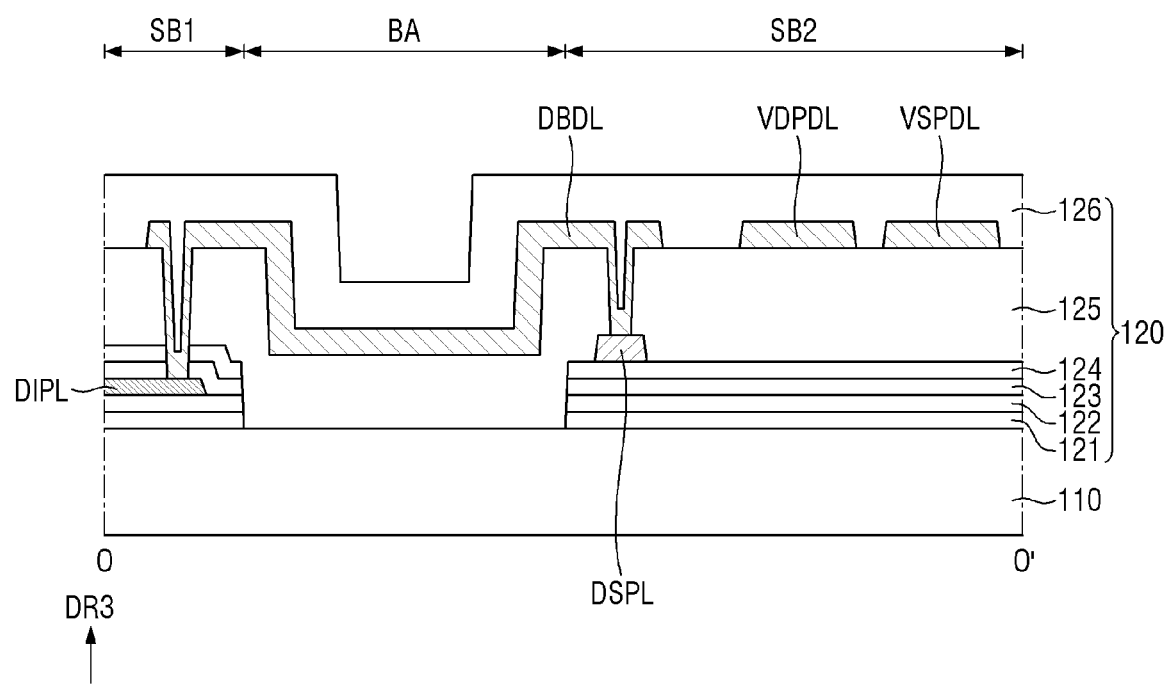
FIG. 28 is a schematic cross-sectional view taken along line O-O' of FIG. 24 according to an embodiment of the disclosure.

FIG. 28 is a schematic cross-sectional view taken along line O-O' of FIG. 24 according to an embodiment of the disclosure.

The third embodiment of FIG. 28 may be substantially identical to the first embodiment of FIG. 11 except that a data bending line DBDL is connected to a data input line DIPL, and, therefore, the redundant descriptions will be omitted.

For example, according to the third embodiment, the data supply lines DSPL disposed in the second subsidiary area SB2 and connected to the output terminals of the display driver circuit 200 may be formed of the third conductive layer CDL3 made up of multiple layers, instead of the first conductive layer CDL1 and the second conductive layer CDL2 made up of a single layer. As a result, the resistance of the signal transmission paths between the display driver circuit 200 and the data lines DL may be lowered.

The first voltage pad line VDPDL and the second voltage pad line VSPDL disposed in the second subsidiary area SB2 may be formed of the fourth conductive layer CDL4.

As described above, according to the third embodiment, the display device 10 may further include the demux circuits DMC disposed between the display driver circuit 200 and the data lines DL. Each of the demux circuits DMC may transmit a data signal to each of two or more data lines DL1 and DL2 based on the data driving signal from the display driver circuit 200. Accordingly, the number of data input lines DIPL may be less than the number of data lines DL, and thus it may be advantageous to reduce the width of the non-display area NDA.

According to the third embodiment, as the data supply line DSPL is formed of the third conductive layer CDL3 rather than the first conductive layer CDL1 or the second conductive layer CDL2, it is possible to compensate for an increase in the resistance of the signal transmission paths between the display driver circuit 200 and the data lines DL by the demux circuits DMC.

Accordingly, even though the display device further includes the demux circuits DMC, it is possible to avoid a significant increase in the resistance of the signal transmission paths between the display driver circuit 200 and the data lines DL.

Figure 29:
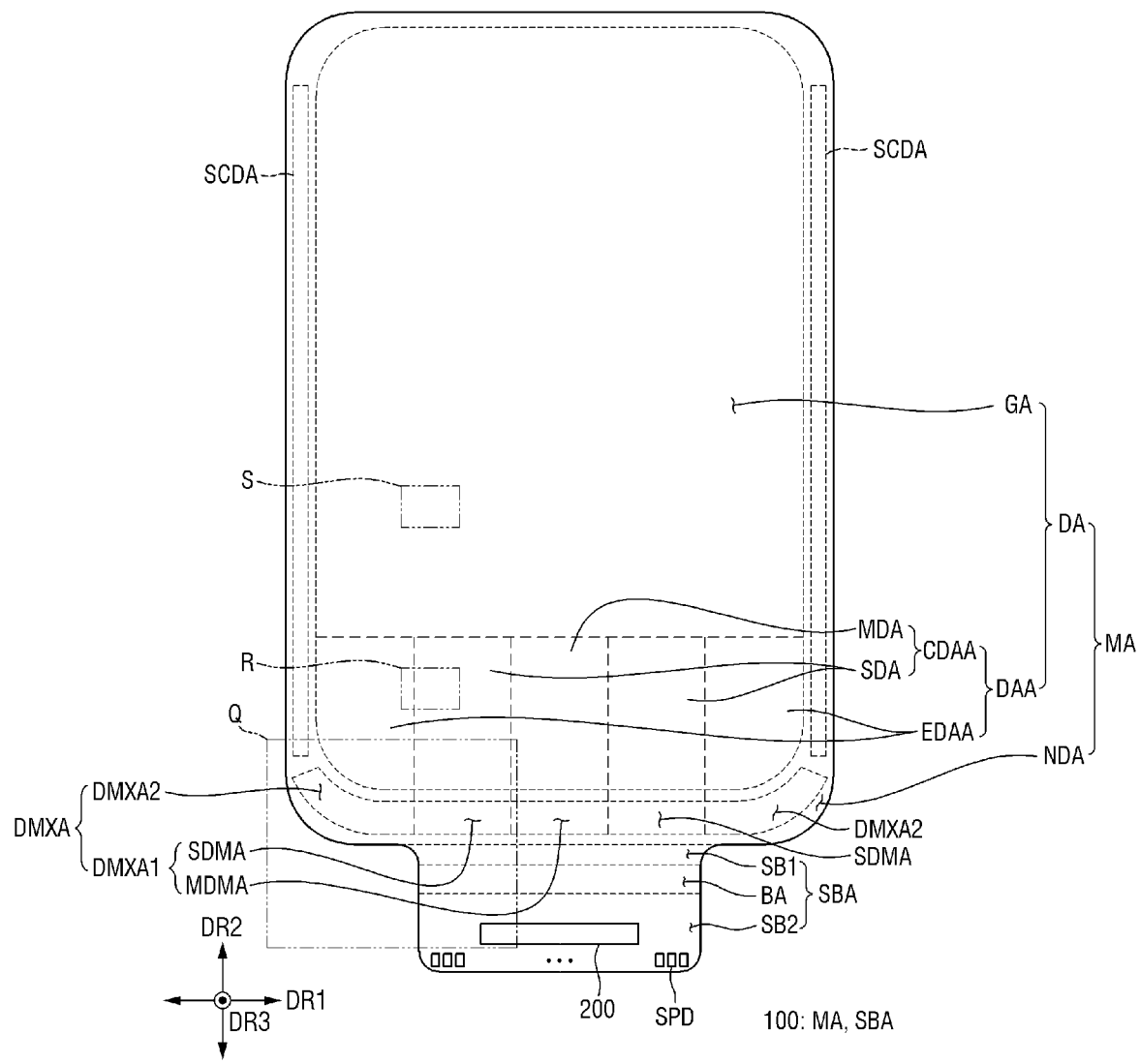
FIG. 29 is a plan view showing a display device according to a fourth embodiment.

FIG. 29 is a plan view showing a display device according to a fourth embodiment.

According to the fourth embodiment of FIG. 29, the demux area DMXA may include a first demux area DMXA1 that is adjacent to the subsidiary area SBA, and second demux areas DMXA2 in contact with the first demux area DMXA1 in the first direction DR1.

The first demux area DMXA1 may include a middle demux area MDMA disposed at the center in the first direction DR1, and side demux areas SDMA between the middle demux area MDMA and the second demux areas DMXA2.

The middle demux area MDMA may be in contact with the side demux areas SDMA on each side in the first direction DR1, respectively.

The first demux area DMXA1 may be in contact with the second demux areas DMXA2 on each side in the first direction DR1, respectively.

For example, the side demux area SDMA and the second demux area DMXA2 may be arranged side-by-side on each side of the middle demux area MDMA in the first direction DR1.

According to the fourth embodiment, the display area DA may include the demux adjacent area DAA disposed adjacent to the demux area DMXA, and the general area GA that is other area than the demux adjacent area DAA.

The demux adjacent area DAA may include a center adjacent area CDAA disposed adjacent to the first demux area DMXA1 in the second direction DR2, and edge adjacent areas EDAA disposed adjacent to the second demux areas DMXA2 in the second direction DR2, respectively.

The center adjacent area CDAA may include a middle adjacent area MDA disposed adjacent to the middle demux area MDMA, and side adjacent areas SDA disposed adjacent to the side demux areas SDMA. For example, the side adjacent areas SDA may be disposed between the middle adjacent area MDA and the edge adjacent areas EDAA in the first direction DR1.

The scan driver circuit area SCDA and the subsidiary area SBA according to the fourth embodiment are substantially identical to those of the first and second embodiments, and, therefore, the redundant descriptions will be omitted.

Figure 30:
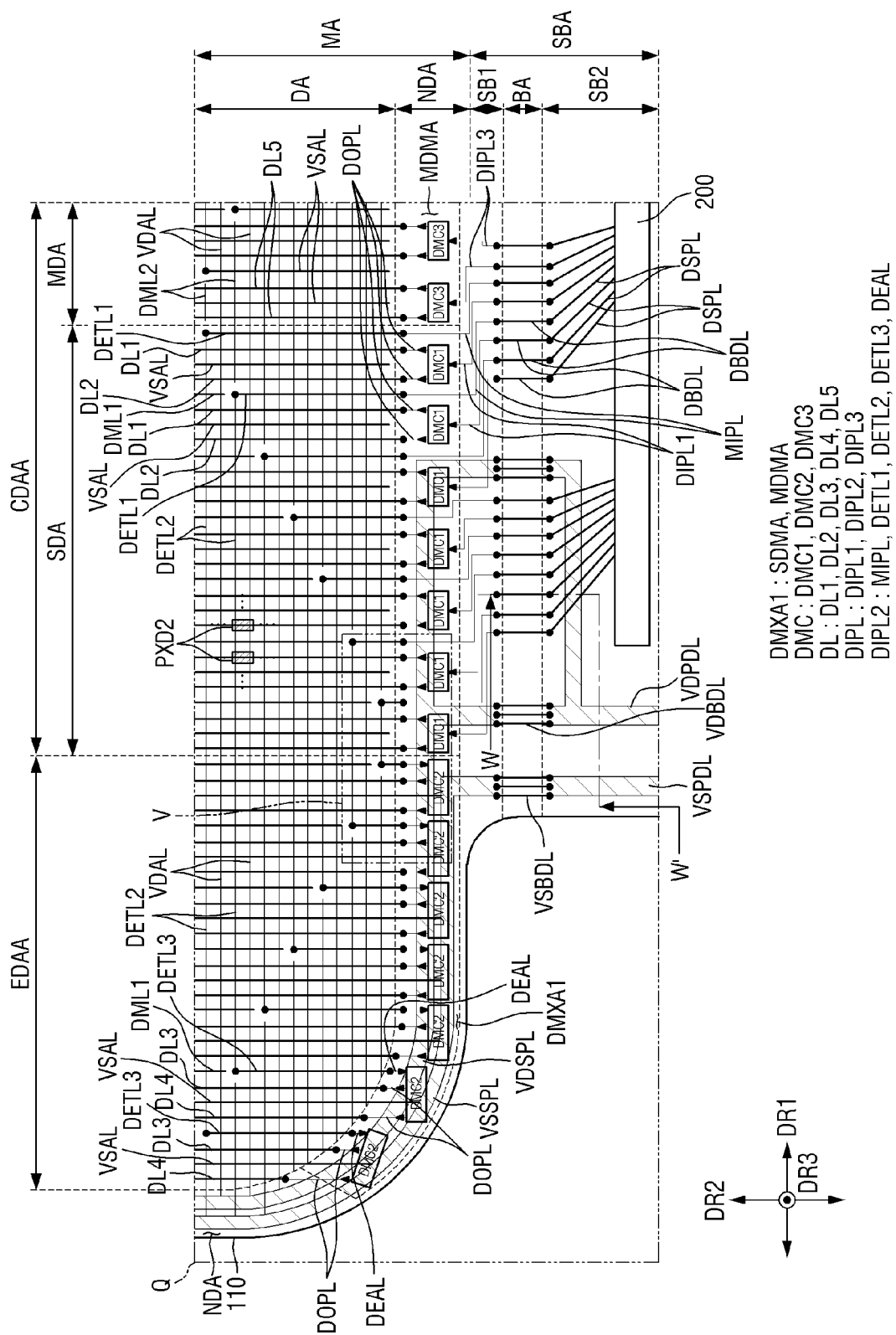
FIG. 30 is a layout view showing portion Q of FIG. 29.

FIG. 30 is a layout view showing portion Q of FIG. 29.

FIG. 30 shows a part of the side demux area SDMA and a part of the second demux area DMXA2 disposed adjacent to a side of the middle demux area MDMA in the first direction DR1, and a part of the demux adjacent area DAA disposed adjacent to them in the second direction DR2.

The side demux area SDMA and the second demux area DMXA2 located on opposite sides in the first direction DR1 (not shown) are symmetrical to those shown in FIG. 30, and, therefore, the redundant descriptions will be omitted.

The first voltage supply line VDSPL and the second voltage supply line VSSPL disposed in the non-display area NDA and the first subsidiary area SB1, the first voltage bending line VDBDL, the second voltage bending line VSBDL, and the data bending lines DBDL disposed in the bending area BA, and the first voltage pad line VDPDL and the second voltage pad line VDPDL, the display driver circuit 200 and the data supply line DSPL disposed in the second subsidiary area SB2 according to the fourth embodiment are substantially identical to those of the first embodiment of FIG. 5 and the second embodiment of FIG. 13, and, therefore, the redundant descriptions will be omitted.

As shown in FIG. 30, according to the fourth embodiment, the demux circuits DMC disposed in the demux area DMXA may include first demux circuits DMC1 disposed in the side demux area SDMA of the first demux area DMXA1, and second demux circuits DMC2 disposed in the second demux area DMXA2.

The data input lines DIPL may electrically connect between the input terminals of the demux circuits DMC and the data supply lines DSPL, respectively.

According to the fourth embodiment, among the data input lines DIPL, the first data input lines DIPL1 connected to the input terminals of the first demux circuits DMC1 may extend from the first subsidiary area SB1 to the side demux area SDMA.

The second data input lines DIPL2 may include main input lines MIPL extended from the first subsidiary area SB1 to the side demux area SDMA, demux detour lines DETL1, DETL2 and DETL3 electrically connected to the main input lines MIPL and disposed in the display area DA, and a detour additional line DEAL disposed in the second demux area DMXA2 and electrically connecting between the demux detour lines DETL1, DETL2, and DETL3 and the input terminals of the second demux circuits DMC2.

The demux detour lines DETL1, DETL2, and DETL3 may include the first demux detour lines DETL1 electrically connected to the main input line MIPL, disposed in the side adjacent area SDA and extend in the second direction DR2, second demux detour lines DETL2 electrically connected to the first demux detour lines DETL1 and extended in the first direction DR1 toward the edge adjacent area EDAA, and third demux detour lines DETL3 disposed in the edge adjacent area EDAA, extended in the second direction DR2 and electrically connecting the second demux detour lines DETL2 and the detour additional lines DEAL.

As described above, the second data input lines DIPL2 according to the fourth embodiment may not extend from the first subsidiary area SB1 to the second demux area DMXA2 but detour to the display area DA to electrically connect the input terminals of the demux circuits DMC2 and the data bending lines DBDL.

Accordingly, the width of the second demux area DMXA2 including the part bent along the corner of the substrate 110 may be reduced, so that the width of the non-display area NDA may be reduced.

According to the fourth embodiment, the circuit array layer 120 may further include a second voltage auxiliary line VSAL disposed in the display area DA, electrically connected to the second voltage supply line VSSPL, and extends in the second direction DR2.

According to the fourth embodiment, the data lines DL may include first and second data lines DL1 and DL2 disposed in the side adjacent area SDA and connected to the output terminals of the first demux circuits DMC1, and third and fourth data lines DL3 and DL4 disposed in the edge adjacent area EDAA and connected to the output terminals of the second demux circuits DMC2.

In the side adjacent area SDA, one of the first data line DL1 and the second data line DL2 (e.g., the first data line DL1) connected to the output terminals of the first demux circuit DMC1 may be disposed adjacent to the first demux detour line DETL1, and another one of them (e.g., the second data line DL2) may be disposed adjacent to the second voltage auxiliary line VSAL.

In the edge adjacent area EDAA, one of the third data line DL3 and the fourth data line DL4 (e.g., the third data line DL3) connected to the output terminals of the second demux circuit DMC2 may be disposed adjacent to the third demux detour line DETL3, and another one of them (e.g., the fourth data line DL4) may be disposed adjacent to the second voltage auxiliary line VSAL.

According to the fourth embodiment, the demux circuits DMC may further include third demux circuits DMC3 disposed in the middle demux area MDMA.

Among the data input lines DIPL, the third data input lines DIPL3 connected to the input terminals of the third demux circuits DMC3 may extend from the first subsidiary area SB1 to the middle demux area MDMA.

The data lines DL may further include two or more fifth data lines DL5 disposed in the middle adjacent area MDA and connected to the output terminals of the third demux circuits DMC3. The two or more fifth data lines DL5 may be disposed adjacent to the second voltage auxiliary lines VSAL, respectively.

The circuit array layer 120 according to the fourth embodiment may further include first dummy lines DML1 that are spaced apart from a side of each of the first demux detour line DETL1 and the third demux detour line DETL3 in the second direction DR2 and extended in the second direction DR2.

For example, in the side adjacent area SDA, a part of the first data line DL1 may be disposed adjacent to the first demux detour line DETL1, and another part of the first data line DL1 may be disposed adjacent to the first dummy line DML1.

In the edge adjacent area EDAA, a part of the third data line DL3 may be disposed adjacent to the third demux detour line DETL3, and another part of the third data line DL3 may be disposed adjacent to the first dummy line DML1.

According to the fourth embodiment, the circuit array layer 120 may further include a first voltage auxiliary line VDAL disposed in the display area DA, electrically connected to the first voltage supply line VDSPL, and extends in the first direction DR1.

In other words, in the demux adjacent area DAA, the first voltage auxiliary line VDAL and the second demux detour line DETL2 may be arranged alternately in the second direction DR2.

The circuit array layer 120 according to the fourth embodiment may further include second dummy lines DML2 spaced apart from and colinear with the second demux detour line DETL2 and extended in the first direction DR1.

For example, in the demux adjacent area DAA, a part of the first voltage auxiliary line VDAL may be disposed adjacent to the second demux detour line DETL2, and another part of the first voltage auxiliary line VDAL may be disposed adjacent to the second dummy line DML2.

The data output lines DOPL according to the fourth embodiment are identical to those of the third embodiment shown in FIG. 24, and, therefore, the redundant descriptions will be omitted.

The first voltage supply line VDSPL, the second voltage supply line VSSPL, the first voltage bending line VDBDL, the second voltage bending line VSBDL, the first voltage pad line VDPDL, and the second voltage pad line VSPDL according to the fourth embodiment are identical to those of the second embodiment shown in FIG. 13, and, therefore, the redundant descriptions will be omitted.

FIG. 30 shows the side adjacent area SDA and the edge adjacent area EDAA disposed on a side of the middle adjacent area MDA in the first direction DR1. Although not shown in the drawings, the side adjacent area SDA and the edge adjacent area EDAA disposed on the opposite side of the middle adjacent area MDA in the first direction DR1 are symmetrical to those shown in FIG. 30, and, therefore, the redundant descriptions will be omitted.

The data bending line DBDL, the display driver circuit 200, and the data supply line DSPL according to the fourth embodiment are identical to those of the second embodiment shown in FIG. 13, and, therefore, the redundant descriptions will be omitted.

The pixel driver PXD2 according to the fourth embodiment is substantially identical to that of the second embodiment shown in FIGS. 14, 15, 16 and 17 except that the first data line DL1 in the side adjacent area SDA is disposed adjacent to the first demux detour line DETL1 and the first dummy line DML1, the second data line DL2 in the side adjacent area SDA is disposed adjacent to the second voltage auxiliary line VSAL, the third data line DL3 in the edge adjacent area EDAA is disposed adjacent to the third demux detour line DETL3 and the first dummy line DML1, and the fourth data line DL4 in the edge adjacent area EDAA is disposed adjacent to the second voltage auxiliary line VSAL, and, therefore, the redundant descriptions will be omitted.

Figure 31:
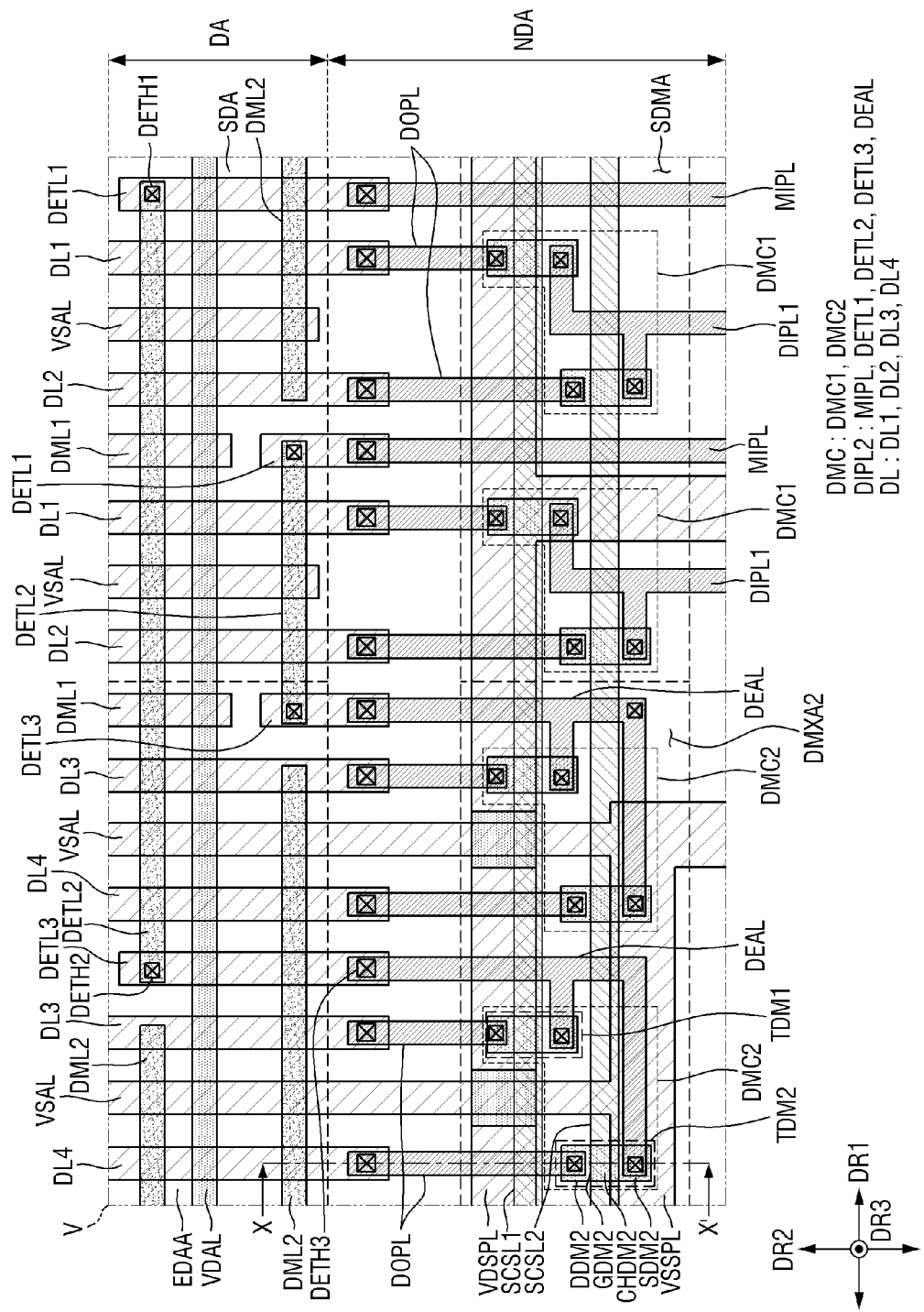
FIG. 31 is a plan view showing portion V of FIG. 30.
Figure 32:
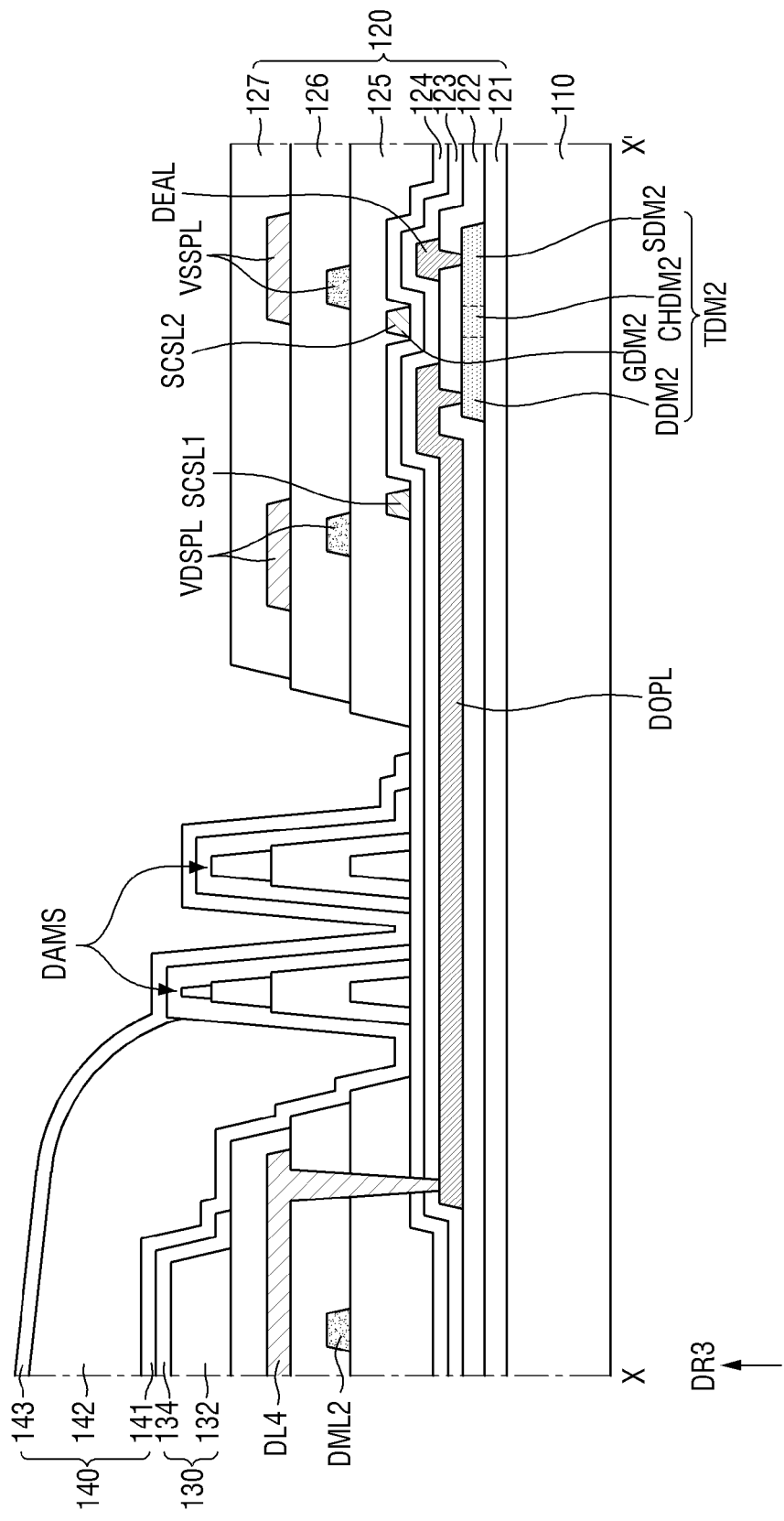
FIG. 32 is a schematic cross-sectional view taken along line X-X' of FIG. 31 according to an embodiment of the disclosure.

FIG. 31 is a plan view showing portion V of FIG. 30. FIG. 32 is a schematic cross-sectional view taken along line X-X" of FIG. 31 according to an embodiment of the disclosure.

The fourth embodiment of FIGS. 31 and 32 is substantially identical to the third embodiment of FIGS. 26 and 27 except that demux circuits DMC include a first demux circuit DMC1 disposed in the side demux area SDMA of the first demux area DMXA1, and a second demux circuit DMC2 disposed in the second demux area DMXA2, and that a second data input line DIPL2 electrically connected to an input terminal of a second demux circuit DMC2 includes a main input line MIPL disposed in side demux area SDMA, demux detour lines DETL1, DETL2 and DETL3 disposed in the demux adjacent areas DAA: CDAA and EDAA of the display area DA, and a detour additional line DEAL disposed in the second demux area DMXA2 and the second demux area DMXA2; and, therefore, the redundant descriptions will be omitted.

As shown in FIG. 31, according to the fourth embodiment, a first electrode of each of a first demux transistor TDM1 and a second demux transistor TDM2 of the first demux circuit DMC1 disposed in the side demux area SDMA may be connected to a first data input line DIPL1.

The main input line MIPL of the second data input line DIPL2 may be disposed in the side demux area SDMA and may be disposed adjacent to the first data input line DIPL1.

As shown in FIG. 32, the circuit array layer 120 according to the fourth embodiment may have a structure that includes the semiconductor layer SEL on the substrate 110, the first conductive layer CDL1 on the first gate insulator 122 that covers the semiconductor layer SEL, the second conductive layer CDL2 on the second gate insulator 123 that covers the first conductive layer CDL1, the third conductive layer CDL3 on the interlayer dielectric layer 124 that covers the second conductive layer CDL2, the fourth conductive layer CDL4 on the first planarization layer 125 that covers the third conductive layer CDL3, the fifth conductive layer CDL5 on the second planarization layer 126 that covers the fourth conductive layer CDL4, and the third planarization layer 127 covering the fifth conductive layer CDL5.

As shown in FIGS. 31 and 32, according to the fourth embodiment, a first electrode of each of a first demux transistor TDM1 and a second demux transistor TDM2 of the second demux circuit DMC2 may be connected to a detour additional line DEAL of a second data input line DIPL2.

As shown in FIGS. 31 and 32, the data lines DL, the first demux detour line DETL1, the third demux detour line DETL3, the first dummy line DML1, and the second voltage auxiliary line VSAL may be formed of the fifth conductive layer CDL5 on the second planarization layer 126.

Each of the first voltage supply line VDSPL and the second voltage supply line VSSPL may have a jumping structure including two or more of the third conductive layer CDL3 on the interlayer dielectric layer 124, the fourth conductive layer CDL4 on the first planarization layer 125 and the fifth conductive layer CDL5 on the second planarization layer 126.

The second demux detour line DETL2, the second dummy line DML2, and the first voltage auxiliary line VDAL may be formed of the fourth conductive layer CDL4 on the first planarization layer 125.

The data output lines DOPL, the first data input line DIPL1, the main input line MIPL, and the detour additional line DEAL may be formed of the first conductive layer CDL1 on the first gate insulator 122 or the second conductive layer CDL2 on the second gate insulator 123.

Figure 33:
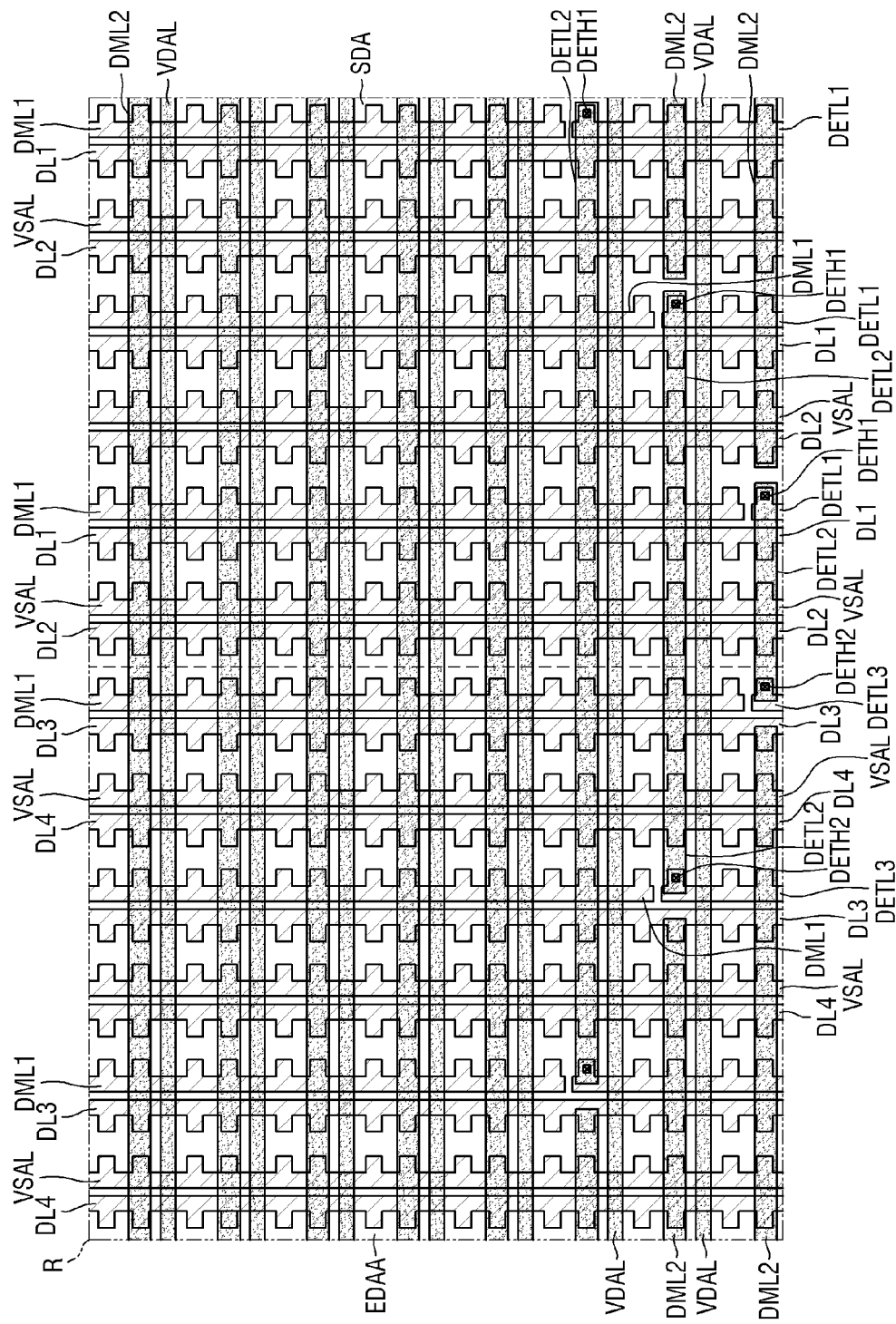
FIG. 33 is a plan view showing the fourth conductive layer and the fifth conductive layer in portion R of FIG. 29.

FIG. 33 is a plan view showing the fourth conductive layer and the fifth conductive layer in portion R of FIG. 29.

Referring to FIG. 33, the demux adjacent area DAA of the display area DA that is disposed adjacent to the demux area DMXA may include the center adjacent area CDAA adjacent to the first demux area DMXA1 and the edge adjacent areas EDAA adjacent to the second demux areas DMXA.

The second data input line DIPL2 electrically connected to the input terminal of the second demux circuit DMC2 disposed in the second demux area DMXA2 may include the first demux detour line DETL1 disposed in the side adjacent area SDA and extended in the second direction DR2, the second demux detour line DETL2 electrically connected to the first demux detour line DETL1 and extended in the first direction DR1 toward the edge adjacent area EDAA, and the third demux detour line DETL3 disposed in the edge adjacent area EDAA, electrically connected to the second demux detour line DETL2 and extended in the second direction DR2 toward the second demux area DMXA2.

The first demux detour line DETL1 and the third demux detour line DETL3 may be formed of the fifth conductive layer CDL5 on the second planarization layer 126 like the data lines DL.

The second demux detour line DETL2 electrically connecting the first demux detour line DETL1 and the third demux detour line DETL3 may be formed of the fourth demux conductive layer CDL4 on the first planarization layer 125.

The second demux detour line DETL2 may be arranged in the second direction DR2 alternately with the first voltage auxiliary line VDAL extended in the first direction DR1. For example, the second demux detour line DETL2 and the second dummy lines DML2 spaced apart from and colinear with each other may be disposed adjacent to the first voltage auxiliary line VDAL. The first voltage auxiliary line VDAL may be formed of the fourth conductive layer CDL4 on the first planarization layer 125.

The second demux detour line DETL2 may be in contact with the first demux detour line DETL1 through a first detour connection hole DETH1 in the side adjacent area SDA.

The second demux detour line DETL2 may be in contact with the third demux detour line DETL3 through a second detour connection hole DETH2 of the edge adjacent area EDAA.

Each of the first detour connection hole DETH1 and the second detour connection hole DETH2 may penetrate the second planarization layer 126.

The first detour connection holes DETH1 of the second demux detour lines DETL2 that are continuous in the second direction DR2 may be arranged in a diagonal direction (not shown) in the side adjacent area SDA.

The second detour connection holes DETH2 of the second demux detour lines DETL2 that are continuous in the second direction DR2 may be arranged in another diagonal direction (not shown) in the edge adjacent area EDAA.

The arrangement direction of the first detour connection holes DETH1 and the arrangement direction of the second detour connection holes DETH2 may be symmetrical to each other.

It is possible to readily determine whether the first detour connection holes DETH1 and the second detour connection holes DETH2 are normally arranged based on the arrangement shape of the first detour connection holes DETH1 and the arrangement shape of the second detour connection holes DETH2.

The third demux detour line DETL3 may be electrically connected to the detour additional line DEAL through the third detour connection hole DETH3 in the second demux area DMXA2.

In case that the detour additional line DEAL is formed of the first conductive layer CDL1, the third detour connection hole DETH3 may penetrate the interlayer dielectric layer 124 and the second gate insulator 123.

In case that the detour additional line DEAL is formed of the second conductive layer CDL2, the third detour connection hole DETH3 may penetrate the interlayer dielectric layer 124.

Among the data lines DL extended in the second direction DR2, the first data line DL1 and the second data line DL2 connected to the output terminals of the first demux circuit DMC1 may be disposed in the side adjacent area SDA.

The first demux detour line DETL1 and the first dummy line DML1 spaced apart from and colinear with each other may be disposed adjacent to the first data line DL1 in the first direction DR1.

The second data line DL2 may be disposed adjacent to the second voltage auxiliary line VSAL.

Among the data lines DL extended in the second direction DR2, the third data line DL3 and the fourth data line DL4 connected to the output terminals of the second demux circuit DMC2 may be disposed in the edge adjacent area EDAA.

The third demux detour line DETL3 and the first dummy line DML1 spaced apart from and colinear with each other may be disposed adjacent to third data line DL3 in the first direction DR1.

The fourth data line DL4 may be disposed adjacent to the second voltage auxiliary line VSAL.

Figure 34:
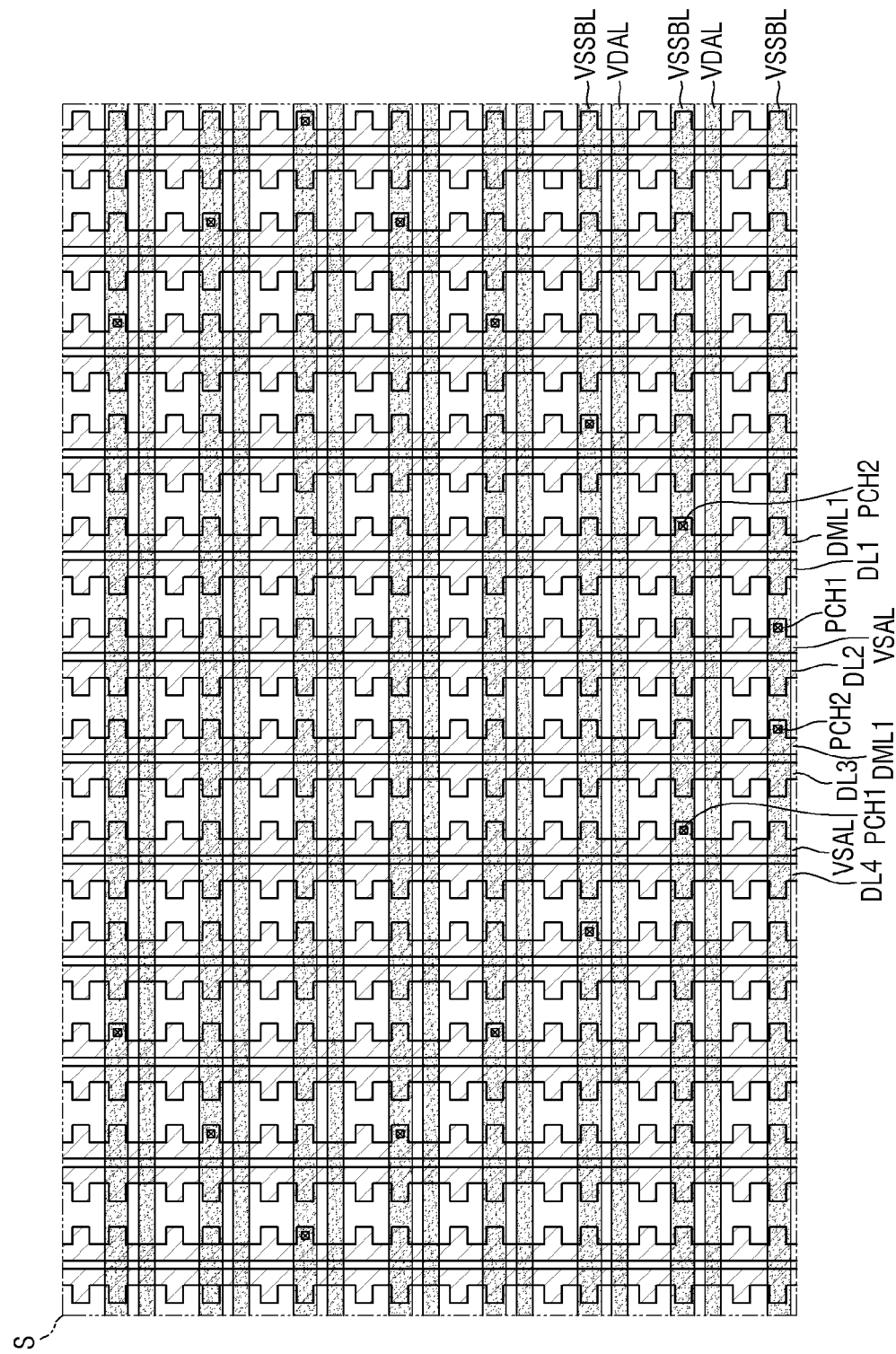
FIG. 34 is a plan view showing the fourth conductive layer and the fifth conductive layer in portion S of FIG. 29.

FIG. 34 is a plan view showing the fourth conductive layer and the fifth conductive layer in portion S of FIG. 29.

FIG. 34 shows a layout of a part of the general area GA in parallel in the second direction DR2 to a part of the demux adjacent area DAA that includes the boundary between the side adjacent area SDA and the edge adjacent area EDAA according to an embodiment.

Referring to FIG. 34, each of the first data line DL1, the second data line DL2, the third data line DL3, the fourth data line DL4, the fifth data line DL5, the first dummy line DML1, and the second voltage auxiliary line VSAL disposed in the demux adjacent area DAA may extend in the second direction DR2 and may be also disposed in the general area GA.

According to the fourth embodiment, the circuit array layer 120 may further include a second voltage sub-line VSSBL that is disposed in the general area GA, is connected to the second voltage auxiliary line VSAL, and extends in the first direction DR1.

In the general area GA, the first voltage auxiliary line VDAL may be disposed adjacent to the second voltage sub-line VSSBL. In other words, in the general area GA, the first voltage auxiliary line VDAL and the second voltage sub-line VSSBL may be arranged alternately in the second direction DR2.

The second voltage sub-line VSSBL may be formed of the fourth conductive layer CDL4 on the first planarization layer 125, along with the first voltage auxiliary line VDAL.

The second voltage sub-line VSSBL may be connected to the second voltage auxiliary line VSAL through a first voltage connection hole PCH1.

The second voltage sub-line VSSBL may be electrically connected to the first dummy line DML1 through a second voltage connection hole PCH2.

Accordingly, the first dummy line DML1 may be connected to the second voltage auxiliary line VSAL through the second voltage sub-line VSSBL, the first voltage connection hole PCH1, and the second voltage connection hole PCH2.

Although not shown in the drawings, the second dummy line DML2 of the demux adjacent area DAA may be connected to the first dummy line DML1 through a connection hole.

The first dummy line DML1 and the second dummy line DML2 for hiding the first demux detour line DETL1, the second demux detour line DETL2, and the third demux detour line DETL3 may be not floating but may be electrically connected to the second voltage auxiliary line VSAL, so that the RC delay of the second voltage transmission paths may be reduced.

The first voltage connection holes PCH1 and the second voltage connection holes PCH2 may be alternately arranged side by side in a diagonal direction.

By doing so, it is possible to relatively readily determine whether the first voltage connection holes PCH1 and the second voltage connection holes PCH2 are normally arranged based on the arrangement shapes of the first voltage connection holes PCH1 and the second voltage connection holes PCH2.

Figure 35:
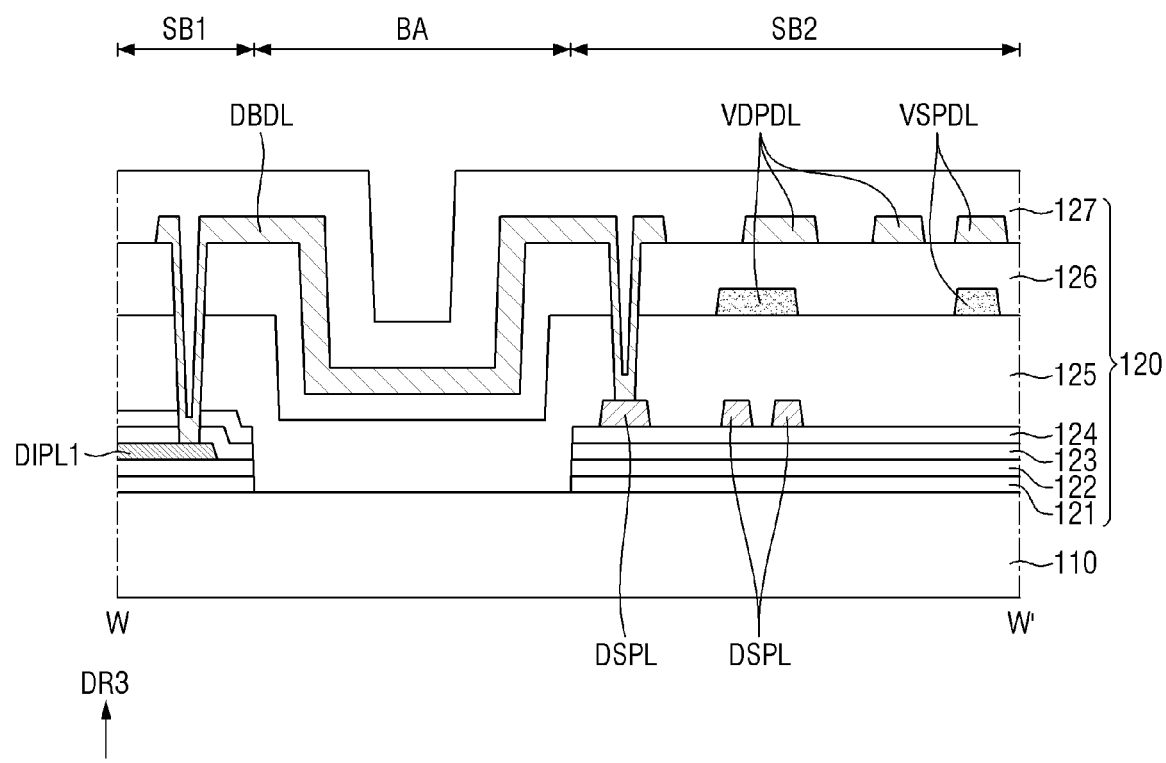
FIG. 35 is a schematic cross-sectional view taken along line W-W' of FIG. 30 according to an embodiment of the disclosure.
Figure 36:
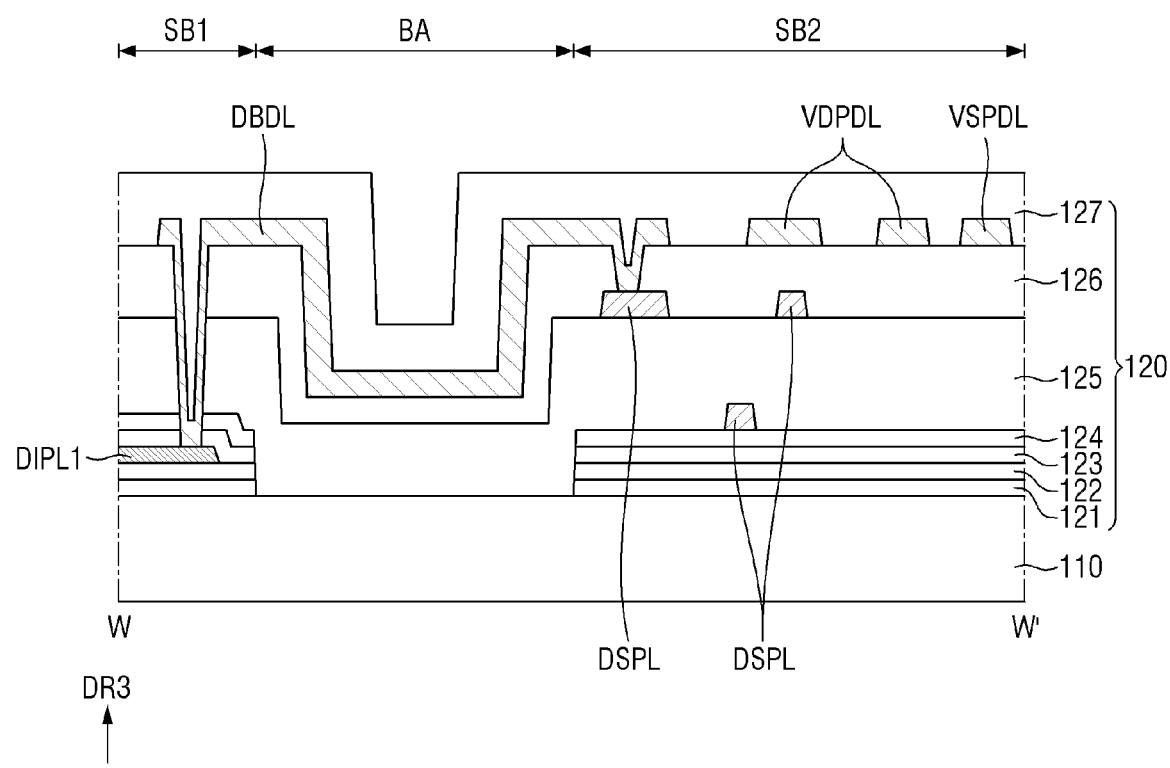
FIG. 36 is a schematic cross-sectional view taken along line W-W' of FIG. 30 according to an embodiment of the disclosure.

FIG. 35 is a schematic cross-sectional view taken along line W-'W' of FIG. 30 according to an embodiment of the disclosure. FIG. 36 is a schematic cross-sectional view taken along line W-'W' of FIG. 30 according to an embodiment of the disclosure.

As shown in FIG. 35, according to the fourth embodiment, the data supply lines DSPL may be disposed in the second subsidiary area SB2 and electrically connected to the output terminals of the display driver circuit 200, respectively. The data supply lines DSPL may be formed of the third conductive layer CDL3 of the interlayer dielectric layer 124.

The first voltage pad line VDPDL and the second voltage pad line VSPDL disposed in the second subsidiary area SB2 may be formed of the fourth conductive layer CDL4 on the first planarization layer 125 or the fifth conductive layer CDL5 on the second planarization layer 126.

The data bending line DBDL disposed in the bending area BA may be formed of the fourth conductive layer CDL4 on the first planarization layer 125 or the fifth conductive layer CDL5 on the second planarization layer 126.

In another embodiment, as shown in FIG. 36, according to the fourth embodiment, the data supply lines DSPL may be disposed in the second subsidiary area SB2 and electrically connected to the output terminals of the display driver circuit 200, respectively. The data supply lines DSPL may be formed of the third conductive layer CDL3 on the interlayer dielectric layer 124 or the fourth conductive layer CDL4 on the first planarization layer 125.

The first voltage pad line VDPDL and the second voltage pad line VSPDL disposed in the second subsidiary area SB2 may be formed of the fifth conductive layer CDL5 on the second planarization layer 126.

It is possible to prevent a short circuit between adjacent data supply lines DSPL, or to further reduce the resistance of the data supply lines DSPL.

As described above, according to the fourth embodiment, the second data input line DIPL2 connected to the second demux circuit DMC2 among the demux circuits DMC may include the first demux detour line DETL1, the second demux detour line DETL2, and the third demux detour line DETL3. For example, since the second data input line DIPL2 does not extend from the first subsidiary area SB1 to the second demux area DMXA2, the widths of the first demux area DMXA1 may be reduced.

According to the fourth embodiment, the data supply line DSPL may be formed of the third conductive layer CDL3 or the third conductive layer CDL3 and the fourth conductive layer CDL4 instead of the first conductive layer CDL1 or the second conductive layer CDL2, and each of the first demux detour line DETL1, the second demux detour line DETL2, and the third demux detour line DETL3 is formed of the fourth conductive layer CDL4 or the fifth conductive layer CDL5.

Accordingly, it is possible to compensate for an increase in the resistance of signal transmission paths connecting between each of the data lines DL and the display driver circuit 200 by the demux circuits DMC. A difference in the resistance of the signal transmission paths connecting each of the data lines DL and the display driver circuit 200 may be less affected by the first demux detour line DETL1, the second demux detour line DETL2, and the third demux detour line DETL3.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments.

What is claimed is:
1. A display device comprising:
   a substrate comprising a main area and a subsidiary area protruding from a side of the main area, the main area comprising a display area in which a plurality of emission areas is arranged, and a non-display area disposed adjacent to the display area;
   a circuit array layer disposed on the substrate and comprising a plurality of pixel drivers associated with the plurality of emission areas, respectively, and data lines transmitting data signals to the plurality of pixel drivers;
a light-emitting array layer disposed on the circuit array layer and comprising a plurality of light-emitting elements associated with each of the plurality of emission areas; and
a display driver circuit disposed in the subsidiary area of the substrate and supplying data driving signals to the data lines, wherein
a structure of the circuit array layer comprises:
a semiconductor layer disposed on the substrate;
a first conductive layer disposed on a first gate insulator covering the semiconductor layer;
a second conductive layer disposed on a second gate insulator covering the first conductive layer;
a third conductive layer disposed on an interlayer dielectric layer covering the second conductive layer;
a fourth conductive layer disposed on a first planarization layer covering the third conductive layer; and
a second planarization layer covering the fourth conductive layer,
data supply lines are electrically connected to output terminals of the display driver circuit, respectively, and
each of the data supply lines is disposed in the third conductive layer or the fourth conductive layer.

2. The display device of claim 1, wherein
the data lines are electrically connected to data output lines disposed in the non-display area, respectively, and
each of the data output lines is disposed in the first conductive layer or the second conductive layer.

3. The display device of claim 2, wherein
each of the first conductive layer and the second conductive layer includes a single layer comprising at least one of molybdenum (Mo), aluminum (Al), chromium (Cr), gold (Au), titanium (Ti), nickel (Ni), neodymium (Nd), copper (Cu), and an alloy thereof,
each of the third conductive layer and the fourth conductive layer includes a multi-layer comprising a main layer, and a first sub-layer and a second sub-layer disposed on each side of the main layer,
the main layer comprises at least one of molybdenum (Mo), aluminum (Al), chromium (Cr), gold (Au), nickel (Ni), neodymium (Nd), and copper (Cu), and
each of the first sub-layer and the second sub-layer comprises titanium (Ti).

4. The display device of claim 3, wherein
the subsidiary area comprises:
a bending area that is bendable;
a first subsidiary area disposed between the main area and a side of the bending area; and
a second subsidiary area disposed on another side of the bending area,
the display driver circuit and the data supply lines are disposed in the second subsidiary area, and
the circuit array layer further comprises a first voltage pad line and a second voltage pad line which are disposed in the second subsidiary area and transmit first and second voltages for driving the plurality of light-emitting elements, respectively.

5. The display device of claim 4, wherein the data output lines extend from the first subsidiary area to the non-display area and electrically connect the data supply lines and the data lines.

6. The display device of claim 5, wherein
the data lines are disposed in the fourth conductive layer, the data supply lines are disposed in the third conductive layer, and
the first voltage pad line and the second voltage pad line are disposed in the fourth conductive layer.

7. The display device of claim 5, wherein
the display area comprises a middle area disposed adjacent to the subsidiary area, and a first side area disposed between the middle area and the non-display area in a first direction,
the first side area comprises a first display divided area disposed adjacent to the non-display area in the first direction, and a second display divided area disposed between the first display divided area and the middle area,
the data lines extend in a second direction intersecting the first direction,
the data lines comprise:
a first data line disposed in the middle area and electrically connected to a first data output line among the data output lines;
a second data line disposed in the second display divided area and electrically connected to a second data output line among the data output lines; and
a third data line disposed in the first display divided area, and
the circuit array layer further comprises:
a first data detour line disposed in the second display divided area adjacent to the second data line, electrically connected to a third data output line among the data output lines, and extending in the second direction; and
a second data detour line disposed in the first side area, extending in the first direction, and electrically connecting the first data detour line and the third data line.

8. The display device of claim 7, wherein
the circuit array layer further comprises:
a first voltage supply line extending from the first subsidiary area to the non-display area and electrically connected to the first voltage pad line;
a second voltage supply line extending from the first subsidiary area to the non-display area and electrically connected to the second voltage pad line; and
second voltage auxiliary lines disposed in the display area, extending in the second direction, and electrically connected to the second voltage supply line,
one of the second voltage auxiliary lines is disposed adjacent to the first data line in the middle area,
another one of the second voltage auxiliary lines is disposed adjacent to the third data line in the first display divided area,
the structure of the circuit array layer further comprises a fifth conductive layer disposed on the second planarization layer and a third planarization layer covering the fifth conductive layer, and
the data lines, the second voltage auxiliary lines, and the first data detour line are disposed in the fifth conductive layer.

9. The display device of claim 8, wherein
the data supply lines are disposed in the third conductive layer, and
each of the first voltage pad line and the second voltage pad line is disposed in the fourth conductive layer or the fifth conductive layer.

10. The display device of claim 8, wherein the first voltage pad line and the second voltage pad line are disposed in the fifth conductive layer.

11. The display device of claim 8, wherein
the display area further comprises a second side area disposed symmetrical to the first side area with respect to the middle area in the first direction,
the circuit array layer further comprises:
  first voltage auxiliary lines disposed in the display area, extending in the first direction, and electrically connected to the first voltage supply line; and
  a second voltage sub-line disposed in a general area of the display area other than the middle area, the first side area, and the second side area, extending in the first direction, and electrically connected to the second voltage supply line,
one of the first voltage auxiliary lines is disposed adjacent to the second data detour line in the first side area, the second side area, and the middle area,
another one of the first voltage auxiliary lines is disposed adjacent to the second voltage sub-line in the general area, and
the second data detour line, the first voltage auxiliary lines, and the second voltage sub-line are disposed in the fourth conductive layer.

12. The display device of claim 11, wherein the circuit array layer further comprises:
a first dummy line colinear with the first data detour line, spaced apart from the first data detour line, extending in the second direction, and disposed in the fifth conductive layer; and
second dummy lines colinear with the second data detour line, spaced apart from the second data detour line, extending in the first direction, and disposed in the fourth conductive layer.

13. The display device of claim 4, wherein
the circuit array layer further comprises:
  demux circuits disposed in a demux area disposed between the subsidiary area and the display area in the non-display area; and
  data input lines extending from the first subsidiary area to the non-display area and electrically connecting input terminals of the demux circuits and the data supply lines, respectively,
the data output lines electrically connect output terminals of the demux circuits and the data lines respectively, and
one of the demux circuits outputs at least two data signals based on one data driving signal output from the display driver circuit.

14. The display device of claim 13, wherein
the data lines are disposed in the fourth conductive layer,
the data supply lines are disposed in the third conductive layer, and
the first voltage pad line and the second voltage pad line are disposed in the fourth conductive layer.

15. The display device of claim 13, wherein
the demux area comprises a first demux area disposed adjacent to the subsidiary area, and a second demux area contacting the first demux area in a first direction,
the first demux area comprises a middle demux area disposed at a center of the first demux area, and a side demux area disposed between the middle demux area and the second demux area,
the demux circuits comprise a first demux circuit disposed in the side demux area and a second demux circuit disposed in the second demux area,
the data input lines comprise a first data input line and a second data input line, the first data input line is electrically connected to an input terminal of the first demux circuit and extends from the first subsidiary area to the side demux area, and
the second data input line is electrically connected to an input terminal of the second demux circuit and comprises:
  a main input line extending from the first subsidiary area to the side demux area;
  a demux detour line electrically connected to the main input line and disposed in the display area; and
  a detour additional line disposed in the second demux area and electrically connecting the demux detour line and the input terminal of the second demux circuit.

16. The display device of claim 15, wherein
the display area comprises a demux adjacent area disposed adjacent to the demux area in a second direction intersecting the first direction, and a general area other than the demux adjacent area,
the demux adjacent area comprises:
  a middle adjacent area disposed adjacent to the middle demux area;
  a side adjacent area disposed adjacent to the side demux area; and
  an edge adjacent area disposed adjacent to the second demux area,
the data lines extend in the second direction, and
the demux detour line comprises:
  a first demux detour line electrically connected to the main input line, disposed in the side adjacent area and extending in the second direction;
  a second demux detour line electrically connected to the first demux detour line and extending in the first direction toward the edge adjacent area; and
  a third demux detour line disposed in the edge adjacent area, extending in the second direction, and electrically connecting the second demux detour line and the detour additional line.

17. The display device of claim 16, wherein
the circuit array layer further comprises:
  a first voltage supply line extending from the first subsidiary area to the non-display area and electrically connected to the first voltage pad line;
  a second voltage supply line extending from the first subsidiary area to the non-display area and electrically connected to the second voltage pad line; and
  a second voltage auxiliary line disposed in the display area, extending in the second direction, and electrically connected to the second voltage supply line,
the data lines comprise:
  a first data line and a second data line disposed in the side adjacent area and electrically connected to output terminals of the first demux circuit; and
  a third data line and a fourth data line disposed in the edge adjacent area and electrically connected to output terminals of the second demux circuit,
in the side adjacent area, the first data line is disposed adjacent to the first demux detour line, and the second data line is disposed adjacent to the second voltage auxiliary line, and
in the edge adjacent area, the third data line is disposed adjacent to the third demux detour line, and the fourth data line is disposed adjacent to the second voltage auxiliary line.

18. The display device of claim 17, wherein the structure of the circuit array layer further comprises:

a fifth conductive layer disposed on the second planarization layer; and
a third planarization layer covering the fifth conductive layer, wherein
the data lines, the first demux detour line, the third demux detour line, and the second voltage auxiliary line are disposed in the fifth conductive layer.

19. The display device of claim 18, wherein
the data supply lines are disposed in the third conductive layer, and
each of the first voltage pad line and the second voltage pad line is disposed in the fourth conductive layer or the fifth conductive layer.

20. The display device of claim 18, wherein the first voltage pad line and the second voltage pad line are disposed in the fifth conductive layer.

21. The display device of claim 18, wherein
the circuit array layer further comprises:
  first voltage auxiliary lines disposed in the display area, extending in the first direction, and electrically connected to the first voltage supply line; and
  a second voltage sub-line disposed in the general area, extending in the first direction, and electrically connected to the second voltage supply line,
one of the first voltage auxiliary lines is disposed adjacent to the second demux detour line in the demux adjacent area,
another one of the first voltage auxiliary lines is disposed adjacent to the second voltage sub-line in the general area, and
the second demux detour line, the first voltage auxiliary lines, and the second voltage sub-line are disposed in the fourth conductive layer.

22. The display device of claim 21, wherein the circuit array layer further comprises:
  first dummy lines in parallel with each of the first demux detour line and the third demux detour line, spaced apart from each of the first demux detour line and the third demux detour line, extending in the second direction, and disposed in the fifth conductive layer; and
  second dummy lines colinear with the second demux detour line, spaced apart from the second demux detour line, extending in the first direction, and disposed in the fourth conductive layer.

23. A display device comprising:
  a substrate comprising a main area and a subsidiary area protruding from a side of the main area, the main area comprising a display area in which a plurality of emission areas is arranged, and a non-display area disposed adjacent to the display area;
  a circuit array layer disposed on the substrate and comprising:
    a plurality of pixel drivers associated with the plurality of emission areas, respectively;
    data lines transmitting data signals to the plurality of pixel drivers; and
    data output lines disposed in the non-display area and electrically connected to the data lines, respectively;
  a light-emitting array layer disposed on the circuit array layer and comprising a plurality of light-emitting elements associated with each of the plurality of emission areas; and
  a display driver circuit disposed in the subsidiary area of the substrate and supplying data driving signals to the data lines, wherein
  a structure of the circuit array layer comprises:
    a semiconductor layer disposed on the substrate;
    a first conductive layer disposed on a first gate insulator covering the semiconductor layer;
    a second conductive layer disposed on a second gate insulator covering the first conductive layer;
    a third conductive layer disposed on an interlayer dielectric layer covering the second conductive layer;
    a fourth conductive layer disposed on a first planarization layer covering the third conductive layer;
    a fifth conductive layer disposed on a second planarization layer covering the fourth conductive layer; and
    a third planarization layer covering the fifth conductive layer,
  the data lines are disposed in the fifth conductive layer,
  each of the data output lines is disposed in the first conductive layer or the second conductive layer,
  data supply lines are electrically connected to output terminals of the display driver circuit, respectively, and
  each of the data supply lines is disposed in the third conductive layer or the fourth conductive layer.

24. The display device of claim 23, wherein
each of the first conductive layer and the second conductive layer includes a single layer comprising at least one of molybdenum (Mo), aluminum (Al), chromium (Cr), gold (Au), titanium (Ti), nickel (Ni), neodymium (Nd), copper (Cu), and an alloy thereof,
each of the third conductive layer and the fourth conductive layer includes a multi-layer comprising a main layer, and a first sub-layer and a second sub-layer disposed on each side of the main layer,
the main layer comprises at least one of molybdenum (Mo), aluminum (Al), chromium (Cr), gold (Au), nickel (Ni), neodymium (Nd), and copper (Cu), and
each of the first sub-layer and the second sub-layer comprises titanium (Ti).

25. The display device of claim 24, wherein
the subsidiary area comprises:
  a bending area that is bendable;
  a first subsidiary area disposed between the main area and a side of the bending area; and
  a second subsidiary area disposed on another side of the bending area,
the display driver circuit and the data supply lines are disposed in the second subsidiary area, and
the circuit array layer further comprises a first voltage pad line and a second voltage pad line, which are disposed in the second subsidiary area and transmit first and second voltages for driving the plurality of light-emitting elements, respectively.

26. The display device of claim 25, wherein the first voltage pad line and the second voltage pad line are disposed in the fifth conductive layer.

27. The display device of claim 25, wherein
the data supply lines are disposed in the third conductive layer, and
each of the first voltage pad line and the second voltage pad line is disposed in the fourth conductive layer or the fifth conductive layer.

28. The display device of claim 25, wherein
the display area comprises a middle area disposed adjacent to the subsidiary area, and a first side area disposed between the middle area and the non-display area in a first direction,
the first side area comprises:
  a first display divided area disposed adjacent to the non-display area in the first direction; and a second display divided area disposed between the first display divided area and the middle area,
the data lines extend in a second direction intersecting the first direction,
the data lines comprise:
  a first data line disposed in the middle area and electrically connected to a first data output line among the data output lines;
  a second data line disposed in the second display divided area and electrically connected to a second data output line among the data output lines; and
  a third data line disposed in the first display divided area, and
the circuit array layer further comprises:
  a first data detour line disposed in the second display divided area adjacent to the second data line, electrically connected to a third data output line among the data output lines, and extending in the second direction; and
  a second data detour line disposed in the first side area, extending in the first direction, and electrically connecting the first data detour line and the third data line.

29. The display device of claim 28, wherein
the circuit array layer further comprises:
  a first voltage supply line extending from the first subsidiary area to the non-display area and electrically connected to the first voltage pad line;
  a second voltage supply line extending from the first subsidiary area to the non-display area and electrically connected to the second voltage pad line; and
  second voltage auxiliary lines disposed in the display area, extending in the second direction, and electrically connected to the second voltage supply line,
one of the second voltage auxiliary lines is disposed adjacent to the first data line in the middle area,
another one of the second voltage auxiliary lines is disposed adjacent to the third data line in the first display divided area, and
the second voltage auxiliary lines and the first data detour line are disposed in the fifth conductive layer.

30. The display device of claim 29, wherein
the display area further comprises a second side area disposed symmetrical to the first side area with respect to the middle area in the first direction,
the circuit array layer further comprises:
  first voltage auxiliary lines disposed in the display area, extending in the first direction, and electrically connected to the first voltage supply line; and
  a second voltage sub-line disposed in a general area of the display area other than the middle area, the first side area, and the second side area, extending in the first direction, and electrically connected to the second voltage supply line,
one of the first voltage auxiliary lines is disposed adjacent to the second data detour line in the first side area, the second side area, and the middle area,
another one of the first voltage auxiliary lines is disposed adjacent to the second voltage sub-line in the general area, and
the second data detour line, the first voltage auxiliary lines, and the second voltage sub-line are disposed in the fourth conductive layer.

31. The display device of claim 25, wherein
the circuit array layer further comprises:
  demux circuits disposed in a demux area disposed between the subsidiary area and the display area in the non-display area; and
  data input lines extending from the first subsidiary area to the non-display area and electrically connecting input terminals of the demux circuits and the data supply lines, respectively,
the data output lines electrically connect output terminals of the demux circuits and the data lines respectively,
one of the demux circuits outputs at least two data signals based on one data driving signal output from the display driver circuit,
the demux area comprises a first demux area disposed adjacent to the subsidiary area, and a second demux area contacting the first demux area in a first direction,
the first demux area comprises a middle demux area disposed at a center of the first demux area, and a side demux area disposed between the middle demux area and the second demux area,
the demux circuits comprise a first demux circuit disposed in the side demux area and a second demux circuit disposed in the second demux area,
the data input lines comprise a first data input line and a second data input line,
the first data input line is electrically connected to an input terminal of the first demux circuit and extends from the first subsidiary area to the side demux area, and
the second data input line is electrically connected to an input terminal of the second demux circuit and comprises:
  a main input line extending from the first subsidiary area to the side demux area;
  a demux detour line electrically connected to the main input line and disposed in the display area; and
  a detour additional line disposed in the second demux area and electrically connecting the demux detour line and the input terminal of the second demux circuit.

32. The display device of claim 31, wherein
the display area comprises a demux adjacent area disposed adjacent to the demux area in a second direction intersecting the first direction, and a general area other than the demux adjacent area,
the demux adjacent area comprises:
  a middle adjacent area disposed adjacent to the middle demux area;
  a side adjacent area disposed adjacent to the side demux area; and
  an edge adjacent area disposed adjacent to the second demux area,
the data lines extend in the second direction, and
the demux detour line comprises:
  a first demux detour line electrically connected to the main input line, disposed in the side adjacent area, and extending in the second direction;
  a second demux detour line electrically connected to the first demux detour line and extending in the first direction toward the edge adjacent area; and
  a third demux detour line disposed in the edge adjacent area, extending in the second direction, and electrically connecting the second demux detour line and the detour additional line.

33. The display device of claim 32, wherein
the circuit array layer further comprises:
  a first voltage supply line extending from the first subsidiary area to the non-display area and electrically connected to the first voltage pad line;

a second voltage supply line extending from the first subsidiary area to the non-display area and electrically connected to the second voltage pad line; and a second voltage auxiliary line disposed in the display area, extending in the second direction, and electrically connected to the second voltage supply line, the data lines comprise:
- a first data line and a second data line disposed in the side adjacent area and electrically connected to output terminals of the first demux circuit; and
- a third data line and a fourth data line disposed in the edge adjacent area and electrically connected to output terminals of the second demux circuit, in the side adjacent area, the first data line is disposed adjacent to the first demux detour line, and the second data line is disposed adjacent to the second voltage auxiliary line, in the edge adjacent area, the third data line is disposed adjacent to the third demux detour line, and the fourth data line is disposed adjacent to the second voltage auxiliary line, and the first demux detour line, the third demux detour line, and the second voltage auxiliary line are disposed in the fifth conductive layer.

34. The display device of claim 33, wherein
the circuit array layer further comprises:
- first voltage auxiliary lines disposed in the display area, extending in the first direction, and electrically connected to the first voltage supply line; and
- a second voltage sub-line disposed in the general area, extending in the first direction, and electrically connected to the second voltage supply line, one of the first voltage auxiliary lines is disposed adjacent to the second demux detour line in the demux adjacent area, another one of the first voltage auxiliary lines is disposed adjacent to the second voltage sub-line in the general area, and the second demux detour line, the first voltage auxiliary lines, and the second voltage sub-line are disposed in the fourth conductive layer.

* * * * *